US012803605B2

(12) United States Patent
Sagi et al.

(10) Patent No.: US 12,803,605 B2
(45) Date of Patent: Nov. 17, 2026

(54) MULTI-BAND DIGITAL PREDISTORTION

(71) Applicant: QUALCOMM Incorporated, San Diego, CA (US)

(72) Inventors: Ariel Yaakov Sagi, Haifa (IL); Evgeny Levitan, Haifa (IL); Bhushan Shanti Asuri, San Diego, CA (US); Yuval Ben Hur, Nesher (IL)

(73) Assignee: QUALCOMM Incorporated, San Diego, CA (US)

( * ) Notice: Subject to any disclaimer, the term of this patent is extended or adjusted under 35 U.S.C. 154(b) by 246 days.

(21) Appl. No.: 18/738,714

(22) Filed: Jun. 10, 2024

(65) Prior Publication Data

US 2025/0379602 A1 Dec. 11, 2025

(51) Int. Cl.

*H04B 1/04* (2006.01)
*H03F 1/32* (2006.01)

(52) U.S. Cl.

CPC ......... *H04B 1/0475* (2013.01); *H03F 1/3241* (2013.01); *H04B 2001/0425* (2013.01)

(58) Field of Classification Search

CPC .......... H04B 1/0475; H04B 2001/0425; H04B 1/0067; H04B 1/005; H03F 1/3241
See application file for complete search history.

(56) References Cited

U.S. PATENT DOCUMENTS 6,973,138 B1 * 12/2005 Wright .................. H04L 27/368 375/296
7,034,612 B2 * 4/2006 Kim ...................... H03F 1/3247 327/551

(Continued)

FOREIGN PATENT DOCUMENTS

CN 1474516 A * 2/2004 ........... H03F 1/3247
CN 105356854 A * 2/2016 ............ H04L 25/49

(Continued)

OTHER PUBLICATIONS

T. Liu, X. Hu, Z. Liu, Y. Zhang, X. Li and W. Wang, "Multi-band Digital Predistortion in IoT System with Co-prime Sampling Technique," 2019 11th International Conference on Wireless Communications and Signal Processing (WCSP), Xi'an, China, 2019, pp. 1-6, (Year: 2019).*

(Continued)

*Primary Examiner* — Berhanu Tadese
(74) *Attorney, Agent, or Firm* — Harrity & Harrity LLP

(57) ABSTRACT

Various aspects of the present disclosure generally relate to wireless communication. In some aspects, an apparatus may apply digital predistortion (DPD) to a wideband signal by splitting the wideband signal into respective distinct sub-bands, and inputting the respective distinct sub-bands to a multi-dimensional DPD apparatus. The multi-dimensional DPD apparatus may apply DPD based at least in part on using a multi-band DPD kernel that processes the respective distinct sub-bands. The multi-dimensional DPD apparatus may implement the multi-band DPD kernel as a DPD kernel set, and the DPD kernel set may be implemented using any combination of one or more envelope delay line components, one or more envelope selection components, one or more look-up-table (LUT) components, one or more computation delay line components, one or more computation selection components, one or more combiner components, and/or one or more adder components. Numerous other aspects are described.

20 Claims, 14 Drawing Sheets

(56) References Cited

U.S. PATENT DOCUMENTS

| | | | | |
|---|---|---|---|---|
| 7,471,739 | B1 * | 12/2008 | Wright | H04L 27/368 332/162 |
| 8,005,162 | B2 * | 8/2011 | Cai | H03F 3/24 375/296 |
| 10,447,244 | B1 * | 10/2019 | Zhou | H03H 17/0294 |
| 10,541,657 | B2 * | 1/2020 | Gutman | H03F 1/3247 |
| 10,756,682 | B1 * | 8/2020 | Faig | H03F 1/3258 |
| 11,265,201 | B2 * | 3/2022 | Fuller | H03F 1/3247 |
| 11,683,055 | B1 * | 6/2023 | Kutz | H04B 1/0475 375/297 |
| 12,250,013 | B2 * | 3/2025 | Masood | H04B 1/0475 |
| 12,294,396 | B2 * | 5/2025 | Levitan | H03F 1/3247 |
| 12,388,478 | B2 * | 8/2025 | Kutz | H04B 1/0475 |
| 12,470,448 | B2 * | 11/2025 | Kutz | H04B 1/04 |
| 12,627,322 | B2 * | 5/2026 | Stulemeijer | H04B 1/0475 |
| 2004/0017257 | A1 * | 1/2004 | Kim | H03F 1/3247 330/149 |
| 2013/0243117 | A1 * | 9/2013 | Jeckeln | H04L 27/0004 375/296 |
| 2019/0068133 | A1 * | 2/2019 | Gutman | H04L 27/368 |
| 2020/0252032 | A1 * | 8/2020 | Faig | H03F 1/3276 |
| 2021/0144046 | A1 * | 5/2021 | Fuller | H03F 1/3247 |
| 2022/0393709 | A1 * | 12/2022 | Kutz | H04B 1/04 |
| 2023/0179238 | A1 * | 6/2023 | Kutz | H04W 4/06 375/297 |
| 2023/0370023 | A1 * | 11/2023 | Yu | G05B 13/027 |
| 2024/0022271 | A1 * | 1/2024 | Levitan | H03F 1/3247 |
| 2024/0097722 | A1 * | 3/2024 | Kutz | H04B 1/0475 |
| 2024/0214014 | A1 * | 6/2024 | Masood | H04B 1/0475 |
| 2025/0379602 | A1 * | 12/2025 | Sagi | H04B 1/005 |
| 2025/0379603 | A1 * | 12/2025 | Stulemeijer | H04B 1/0475 |

FOREIGN PATENT DOCUMENTS

| | | | | | |
|---|---|---|---|---|---|
| CN | 105356854 | B | * | 7/2018 | H03F 1/3258 |
| CN | 111052599 | A | * | 4/2020 | H03F 1/3294 |
| CN | 111082757 | A | * | 4/2020 | H03F 1/3258 |
| CN | 111052599 | B | * | 8/2021 | H03F 1/3247 |
| CN | 111082757 | B | * | 5/2023 | H03F 1/26 |
| CN | 112543156 | B | * | 4/2024 | H03F 1/3258 |
| CN | 119487795 | A | * | 2/2025 | H04L 25/03853 |
| EP | 4016944 | A1 | * | 6/2022 | H04L 25/03343 |
| KR | 20060116252 | A | * | 11/2006 | H04K 1/02 |
| KR | 100802353 | B1 | * | 2/2008 | H03F 1/32 |
| KR | 101251542 | B1 | * | 4/2013 | H03F 1/3258 |
| WO | WO-2019045866 | A1 | * | 3/2019 | H03F 1/02 |
| WO | WO-2021052376 | A1 | * | 3/2021 | H03F 1/3241 |
| WO | WO-2022240740 | A1 | * | 11/2022 | H04B 1/0475 |
| WO | WO-2023049621 | A1 | * | 3/2023 | H03F 3/195 |
| WO | WO-2023192055 | A1 | * | 10/2023 | H04L 27/367 |
| WO | WO-2024015682 | A1 | * | 1/2024 | H04L 25/03343 |
| WO | WO-2025259388 | A1 | * | 12/2025 | H03F 1/3241 |
| WO | WO-2025259393 | A1 | * | 12/2025 | H01Q 1/523 |

OTHER PUBLICATIONS

Z. Liu and Y. Li, "A digital predistortion method for multi-band aggregation," 2017 IEEE 17th International Conference on Communication Technology (ICCT), Chengdu, China, 2017, pp. 343-349, (Year: 2017).*

G. Su and W. Chen, "Digital predistortion for concurrent multi-band PAs with inter-band IMD compensation," 2016 IEEE International Workshop on Electromagnetics: Applications and Student Innovation Competition (iWEM), Nanjing, China, 2016, pp. 1-3, (Year: 2016).*

M. F. Haider, F. You, S. He, T. Rahkonen and J. P. Aikio, "Predistortion-Based Linearization for 5G and Beyond Millimeter-Wave Transceiver Systems: A Comprehensive Survey," in IEEE Communications Surveys & Tutorials, vol. 24, No. 4, pp. 2029-2072, Fourthquarter 2022, (Year: 2022).*

International Search Report and Written Opinion—PCT/US2025/027951—ISA/EPO—Oct. 7, 2025.

Partial International Search Report—PCT/US2025/027951—ISA/EPO—Aug. 13, 2025.

* cited by examiner

1100

1102

| Kernel Type 1104 | $q_j$ 1106 | $p_m$ 1108 |
| --- | --- | --- |
| GMP (GDDR1) Type 1 (1110) | 1 | $x_m$ |
| GDDR1 Type 2 | $x_0^2$ | $x_m^*$ |
| GDDR2 Type 1 | $x_0^*$ | $x_m^2$ |
| GDDR2 Type 2 | $x_0$ | $\lvert x_m\rvert^2$ |
| GDDR2 Type 3 | $x_0^3$ | $x_m^{*2}$ |
| GDDR3 Type 1 | 1 | $\lvert x_m\rvert^2 x_m$ |
| GDDR3 Type 2 | $x_0^{*2}$ | $x_m^3$ |
| GDDR3 Type 3 (1112) | $x_0^2$ | $\lvert x_m\rvert^2 x_m^*$ |
| $x^*\lvert x\rvert\lvert x\rvert^k$ (1114) | $x_j^*$ | $\lvert x_m\rvert$ |
| $xx^*\lvert x\rvert^k$ (1114) | $x_j$ | $x_m^*$ |
| $x^2\lvert x\rvert^2\lvert x\rvert^k$ (1114) | $x_j^2$ | $\lvert x\rvert^2$ |

FIG. 11

MULTI-BAND DIGITAL PREDISTORTION

FIELD OF THE DISCLOSURE

Aspects of the present disclosure generally relate to wireless communication and specifically relate to techniques, apparatuses, and methods for multi-band digital predistortion.

BACKGROUND

Wireless communication systems are widely deployed to provide various services that may include carrying voice, text, messaging, video, data, and/or other traffic. The services may include unicast, multicast, and/or broadcast services, among other examples. Typical wireless communication systems may employ multiple-access radio access technologies (RATs) capable of supporting communication with multiple users by sharing available system resources (for example, time domain resources, frequency domain resources, spatial domain resources, and/or device transmit power, among other examples). Examples of such multiple-access RATs include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

The above multiple-access RATs have been adopted in various telecommunication standards to provide common protocols that enable different wireless communication devices to communicate on a municipal, national, regional, or global level. An example telecommunication standard is New Radio (NR). NR, which may also be referred to as 5G, is part of a continuous mobile broadband evolution promulgated by the Third Generation Partnership Project (3GPP). NR (and other mobile broadband evolutions beyond NR) may be designed to better support Internet of things (IoT) and reduced capability device deployments, industrial connectivity, millimeter wave (mmWave) expansion, licensed and unlicensed spectrum access, non-terrestrial network (NTN) deployment, sidelink and other device-to-device direct communication technologies (for example, cellular vehicle-to-everything (CV2X) communication), massive multiple-input multiple-output (MIMO), disaggregated network architectures and network topology expansions, multiple-subscriber implementations, high-precision positioning, and/or radio frequency (RF) sensing, among other examples. As the demand for mobile broadband access continues to increase, further improvements in NR may be implemented, and other radio access technologies such as 6G may be introduced, to further advance mobile broadband evolution.

SUMMARY

Some aspects described herein relate to an apparatus for wireless communication. The apparatus may include a first input mechanism configured to receive an indication of a selected multi-band digital pre-distortion (DPD) kernel that comprises a DPD kernel set. The apparatus may include an envelope delay line component comprising: a first envelope storage segmentation configured to store a first input envelope value as one of a first plurality of envelope values associated with a first plurality of samples that span a time duration; and a second envelope storage segmentation configured to store a second input envelope value as one of a second plurality of envelope values associated with a second plurality of samples that span the time duration. In some aspects, the apparatus may include an envelope selection component configured to select a subset of envelope values from at least one of the first plurality of envelope values or the second plurality of envelope values based at least in part on the selected multi-band DPD kernel. The apparatus may include one or more look-up-table (LUT) components coupled to the envelope selection component configured to: receive the subset of envelope values, and output an envelope computation value that is based at least in part on the subset of envelope values and the selected multi-band DPD kernel. The apparatus may include a computation delay line component comprising one or more computation storage components configured to store, as multiple computational values, at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the first plurality of samples that span the time duration, or the second plurality of samples that span the time duration. The apparatus may include one or more computation selection components coupled to the computation delay line component and configured to select, based at least in part on the selected multi-band DPD kernel, one or more subsets of computational values from the multiple computational values stored by the computation storage component. Alternatively, or additionally, the apparatus may include one or more combiner components coupled to the one or more computation selection components and the one or more LUT components, the one or more combiner components configured to generate a respective output that is based at least in part on combining the envelope computation value with the one or more subsets of computational values. In some aspects, the apparatus may include an adder component coupled the one or more combiner components and configured to generate a DPD-processed output sample based at least in part on combining the respective output from at least a subset of the one or more combiner components.

Some aspects described herein relate to an apparatus for wireless communication. The apparatus may include a pre-DPD signal conditioning circuit that generates a pre-DPD conditioned output signal and a post-DPD signal conditioning circuit. The apparatus may include a splitter component that is configured to split the pre-DPD conditioned output signal received from the pre-DPD signal conditioning circuit into at least two splitter output signals, each splitter output signal of the at least two split output signals being a respective distinct sub-band of the pre-DPD conditioned output signal, the respective distinct sub-band being separated from other sub-bands in the pre-DPD conditioned output signal by a frequency gap. Alternatively, or additionally, the apparatus may include a DPD component configured to: operate in a first mode that causes the DPD component to: receive the at least two splitter output signals as at least a first input signal and a second input signal; and apply DPD to at least the first input signal and the second input signal to generate at least a first DPD-processed output signal and a second DPD-processed output signal; operate in a second mode that causes the DPD component to: receive the pre-DPD conditioned output signal as a third input signal in a manner that bypasses the splitter component; and apply DPD to the third input signal to generate a third DPD-processed output signal; and switch between the first mode and the second mode. The apparatus may include a combiner component configured to: receive at least the first DPD-processed output signal and the second DPD-processed output signal; and output a combined DPD-processed output signal to the post-DPD conditioning circuit. In some aspects, the apparatus may include a routing mechanism configured to: receive the third DPD-processed output signal; and route the third DPD-processed output signal to the post-DPD conditioning circuit in a manner that bypasses the combiner component.

Some aspects described herein relate to a method performed by an apparatus. The method may include receiving an indication of a selected multi-band DPD kernel that comprises a DPD kernel set. The method may include storing a first input envelope value as one of a first plurality of envelope values associated with a first plurality of samples of a first sub-band of a wideband signal that span a time duration. The method may include storing a second input envelope value as one of a second plurality of envelope values associated with a second plurality of samples of a second sub-band of the wideband signal that span the time duration. The method may include storing multiple computational values that comprise at least at least one of, a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration. The method may include selecting a subset of envelope values from at least one of the first plurality of envelope values or the second plurality of envelope values based at least in part on the selected multi-band DPD kernel. The method may include generating an envelope computation value using the subset of envelope values, one or more LUTs, and the selected multi-band DPD kernel. The method may include selecting, based at least in part on the selected multi-band DPD kernel, one or more subsets of computational values from the multiple computational values. The method may include generating a DPD-processed output sample based at least in part on combining the envelope computation value with the one or more subsets of computational values.

Some aspects described herein relate to an apparatus for wireless communication. The apparatus may include one or more memories and one or more processors coupled to the one or more memories. The one or more processors may be configured to receive an indication of a selected multi-band DPD kernel that comprises a DPD kernel set. The one or more processors may be configured to store a first input envelope value as one of a first plurality of envelope values associated with a first plurality of samples of a first sub-band of a wideband signal that span a time duration. The one or more processors may be configured to store a second input envelope value as one of a second plurality of envelope values associated with a second plurality of samples of a second sub-band of the wideband signal that span the time duration. The one or more processors may be configured to store multiple computational values that comprise at least at least one of, a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration. The one or more processors may be configured to select a subset of envelope values from at least one of the first plurality of envelope values or the second plurality of envelope values based at least in part on the selected multi-band DPD kernel. The one or more processors may be configured to generate an envelope computation value using the subset of envelope values, one or more LUTs, and the selected multi-band DPD kernel. The one or more processors may be configured to select, based at least in part on the selected multi-band DPD kernel, one or more subsets of computational values from the multiple computational values. The one or more processors may be configured to generate a DPD-processed output sample based at least in part on combining the envelope computation value with the one or more subsets of computational values.

Some aspects described herein relate to a non-transitory computer-readable medium that stores a set of instructions for wireless communication by a one or more instructions that, when executed by one or more processors of an apparatus. The set of instructions, when executed by one or more processors of the one or more instructions that, when executed by one or more processors of an apparatus, may cause the one or more instructions that, when executed by one or more processors of an apparatus to receive an indication of a selected multi-band DPD kernel that comprises a DPD kernel set. The set of instructions, when executed by one or more processors of the one or more instructions that, when executed by one or more processors of an apparatus, may cause the one or more instructions that, when executed by one or more processors of an apparatus to store a first input envelope value as one of a first plurality of envelope values associated with a first plurality of samples of a first sub-band of a wideband signal that span a time duration. The set of instructions, when executed by one or more processors of the one or more instructions that, when executed by one or more processors of an apparatus, may cause the one or more instructions that, when executed by one or more processors of an apparatus to store a second input envelope value as one of a second plurality of envelope values associated with a second plurality of samples of a second sub-band of the wideband signal that span the time duration. The set of instructions, when executed by one or more processors of the one or more instructions that, when executed by one or more processors of an apparatus, may cause the one or more instructions that, when executed by one or more processors of an apparatus to store multiple computational values that comprise at least at least one of, a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration. The set of instructions, when executed by one or more processors of the one or more instructions that, when executed by one or more processors of an apparatus, may cause the one or more instructions that, when executed by one or more processors of an apparatus to select a subset of envelope values from at least one of the first plurality of envelope values or the second plurality of envelope values based at least in part on the selected multi-band DPD kernel. The set of instructions, when executed by one or more processors of the one or more instructions that, when executed by one or more processors of an apparatus, may cause the one or more instructions that, when executed by one or more processors of an apparatus to generate an envelope computation value using the subset of envelope values, one or more LUTs, and the selected multi-band DPD kernel. The set of instructions, when executed by one or more processors of the one or more instructions that, when executed by one or more processors of an apparatus, may cause the one or more instructions that, when executed by one or more processors of an apparatus to select, based at least in part on the selected multi-band DPD kernel, one or more subsets of computational values from the multiple computational values. The set of instructions, when executed by one or more processors of the one or more instructions that, when executed by one or more processors of an apparatus, may cause the one or more instructions that, when executed by one or more processors of an apparatus to generate a DPD-processed output sample based at least in part on combining the envelope computation value with the one or more subsets of computational values.

Some aspects described herein relate to an apparatus for wireless communication. The apparatus may include means for receiving an indication of a selected multi-band DPD kernel that comprises a DPD kernel set. The apparatus may include means for storing a first input envelope value as one of a first plurality of envelope values associated with a first plurality of samples of a first sub-band of a wideband signal that span a time duration. The apparatus may include means for storing a second input envelope value as one of a second plurality of envelope values associated with a second plurality of samples of a second sub-band of the wideband signal that span the time duration. The apparatus may include means for storing multiple computational values that comprise at least at least one of, a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration. The apparatus may include means for selecting a subset of envelope values from at least one of the first plurality of envelope values or the second plurality of envelope values based at least in part on the selected multi-band DPD kernel. The apparatus may include means for generating an envelope computation value using the subset of envelope values, one or more LUTs, and the selected multi-band DPD kernel. The apparatus may include means for selecting, based at least in part on the selected multi-band DPD kernel, one or more subsets of computational values from the multiple computational values. The apparatus may include means for generating a DPD-processed output sample based at least in part on combining the envelope computation value with the one or more subsets of computational values.

Aspects of the present disclosure may generally be implemented by or as a method, apparatus, system, computer program product, non-transitory computer-readable medium, user equipment, base station, network node, network entity, wireless communication device, and/or processing system as substantially described with reference to, and as illustrated by, the specification and accompanying drawings.

The foregoing paragraphs of this section have broadly summarized some aspects of the present disclosure. These and additional aspects and associated advantages will be described hereinafter. The disclosed aspects may be used as a basis for modifying or designing other aspects for carrying out the same or similar purposes of the present disclosure. Such equivalent aspects do not depart from the scope of the appended claims. Characteristics of the aspects disclosed herein, both their organization and method of operation, together with associated advantages, will be better understood from the following description when considered in connection with the accompanying drawings.

BRIEF DESCRIPTION OF THE DRAWINGS

The appended drawings illustrate some aspects of the present disclosure, but are not limiting of the scope of the present disclosure because the description may enable other aspects. Each of the drawings is provided for purposes of illustration and description, and not as a definition of the limits of the claims. The same or similar reference numbers in different drawings may identify the same or similar elements.

FIG. 11 is a diagram illustrating an example of a table that specifies computations and/or values that may be used to implement a wideband DPD kernel, in accordance with the present disclosure.

DETAILED DESCRIPTION

Figure 1:
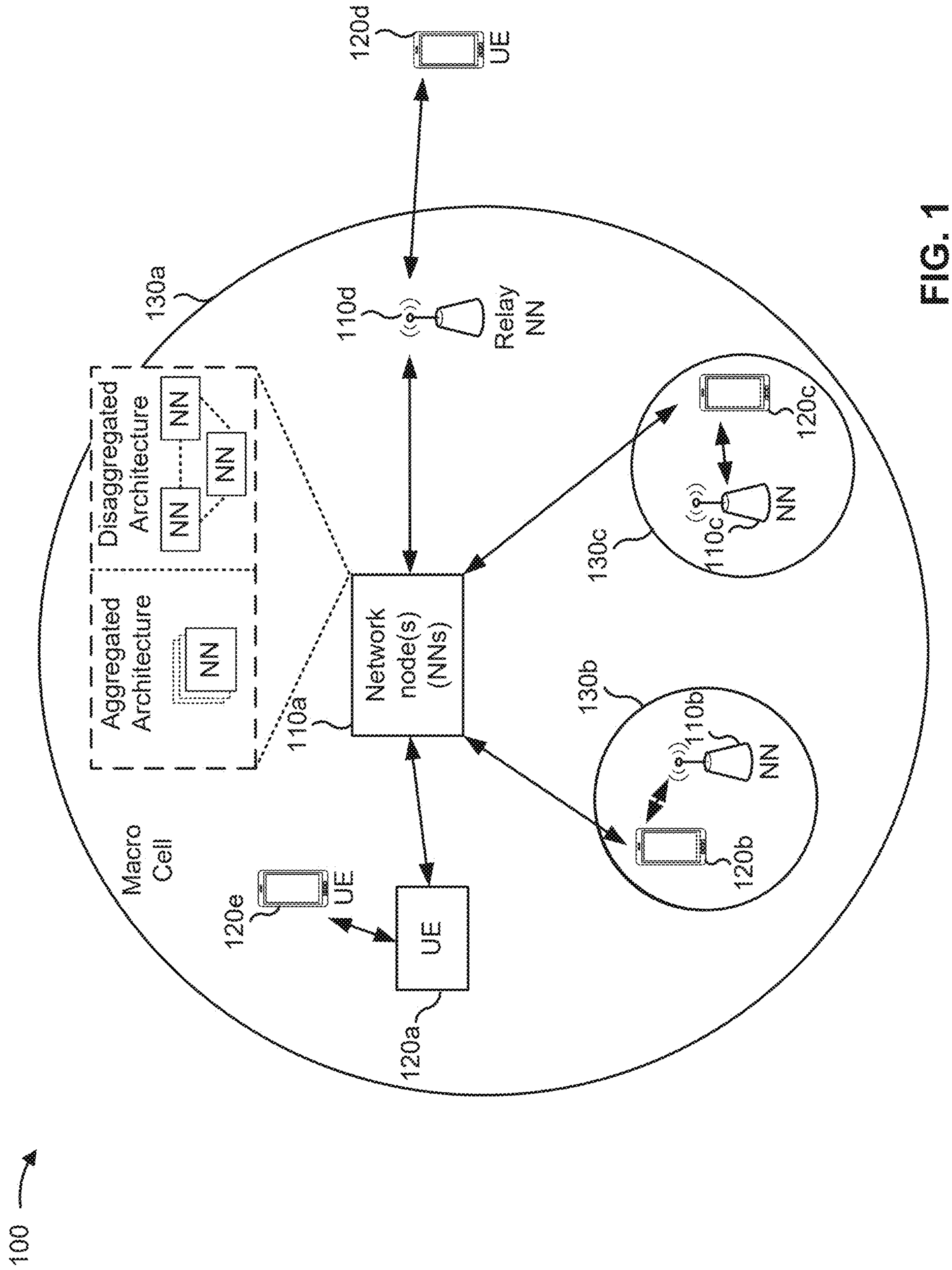
FIG. 1 is a diagram illustrating an example of a wireless communication network, in accordance with the present disclosure.

Various aspects of the present disclosure are described hereinafter with reference to the accompanying drawings. However, aspects of the present disclosure may be embodied in many different forms and is not to be construed as limited to any specific aspect illustrated by or described with reference to an accompanying drawing or otherwise presented in this disclosure. Rather, these aspects are provided so that this disclosure will be thorough and complete, and will fully convey the scope of the disclosure to those skilled in the art. One skilled in the art may appreciate that the scope of the disclosure is intended to cover any aspect of the disclosure disclosed herein, whether implemented independently of or in combination with any other aspect of the disclosure. For example, an apparatus may be implemented or a method may be practiced using various combinations or quantities of the aspects set forth herein. In addition, the scope of the disclosure is intended to cover an apparatus having, or a method that is practiced using, other structures and/or functionalities in addition to or other than the structures and/or functionalities with which various aspects of the disclosure set forth herein may be practiced. Any aspect of the disclosure disclosed herein may be embodied by one or more elements of a claim.

Several aspects of telecommunication systems will now be presented with reference to various methods, operations, apparatuses, and techniques. These methods, operations, apparatuses, and techniques will be described in the following detailed description and illustrated in the accompanying drawings by various blocks, modules, components, circuits, steps, processes, or algorithms (collectively referred to as “elements”). These elements may be implemented using hardware, software, or a combination of hardware and software. Whether such elements are implemented as hardware or software depends upon the particular application and design constraints imposed on the overall system.

A transmitter may transmit signals with increasing nonlinearity based at least in part on power increases. For example, the transmitter may include a power amplifier (PA) with a limited dynamic range that may distort a transmitted signal as a result of a relatively high peak to average power ratio (PAPR). To avoid nonlinearity distortions and accompanying interference, the transmitter may apply a power back-off value to reduce transmit power, thereby reducing nonlinearity. Alternatively, or additionally, the transmitter may use one or more pre-transmission signal processing techniques to reduce the power back-off value, such as digital pre-distortion (DPD) processing that reduces nonlinear distortion to less than a threshold level, thereby increasing power efficiency relative to avoiding nonlinear distortion using only a power back-off.

Different radio access technologies (RATs) may utilize different frequency bands and/or have different performance requirements. As one example, a first RAT may use a first carrier frequency with a first bandwidth that results in a wideband signal, and a second RAT may use a second carrier frequency with a second bandwidth that results in a narrowband signal. “Wideband signal” may denote a wireless signal that has a bandwidth that satisfies a wideband threshold and/or as a bandwidth that is greater than 1% of the center frequency, and “narrowband signal” may denote a wireless signal that has a bandwidth that satisfies a narrowband threshold and/or has a bandwidth that is less than 1% of the center frequency. Some wideband signals may be classified as a sparse signal, where “sparse signal” may denote a signal that includes one or more spectral regions of concentrated power (e.g., a signal power level that satisfies a power presence threshold) that are separated by one or more spectral regions without power (e.g., a signal power level that fails to satisfy the power presence threshold).

A DPD component in a transmitter and/or transceiver may process digital samples and/or a digital stream that are generated with a sampling rate of four times (4×) a bandwidth of the signal being digitized. For example, a wideband signal with a 600 megahertz (MHz) bandwidth may be sampled at 4×600 MHz, resulting in a plurality of samples and/or a digital stream that is based at least in part on a sampling rate of 2.4 GHz. Using a 4× sampling rate to digitize a sparse wideband signal may result in a number of digital samples and/or a size of a digital stream that leads to a transmitter and/or a DPD component consuming a disproportionate amount of power to process the digital samples. Increased power consumption at the network node may result in a need for increased heat dissipation and/or cooling provisions for hardware at the network node, may increase an amount of usage stress on the hardware that leads in a shorter lifespan of the hardware, may reduce a sustainability in operating the network node that may result in an inability to meet regulatory energy consumption operating conditions, and/or may increase an operating cost associated with the network node.

Various aspects relate generally to a multi-dimensional DPD and/or multi-band DPD. Some aspects more specifically relate to a multi-dimensional DPD and is configured to process a wireless signal (e.g., a sparse wideband signal) that is sampled at a first sampling rate based at least in part on separating the wireless signal into multiple partitions and processing each partition using second sampling rate that is lower than the first sampling rate. In some aspects, an apparatus may include a first input mechanism configured to receive an indication of a selected multi-band DPD kernel that comprises a DPD kernel set. The apparatus may include an envelope delay line component comprising: a first envelope storage segmentation configured to store a first input envelope value as one of a first plurality of envelope values associated with a first plurality of samples that span a time duration; and a second envelope storage segmentation configured to store a second input envelope value as one of a second plurality of envelope values associated with a second plurality of samples that span the time duration. In some aspects, the apparatus may include an envelope selection component configured to select a subset of envelope values from at least one of the first plurality of envelope values or the second plurality of envelope values based at least in part on the selected multi-band DPD kernel. The apparatus may include one or more look-up-table (LUT) components coupled to the envelope selection component configured to: receive the subset of envelope values, and output an envelope computation value that is based at least in part on the subset of envelope values and the selected multi-band DPD kernel. The apparatus may include a computation delay line component comprising one or more computation storage components configured to store, as multiple computational values, at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the first plurality of samples that span the time duration, or the second plurality of samples that span the time duration. The apparatus may include one or more computation selection components coupled to the computation delay line component and configured to select, based at least in part on the selected multi-band DPD kernel, one or more subsets of computational values from the multiple computational values stored by the computation storage component. Alternatively, or additionally, the apparatus may include one or more combiner components coupled to the one or more computation selection components and the one or more LUT components, the one or more combiner components configured to generate a respective output that is based at least in part on combining the envelope computation value with the one or more subsets of computational values. In some aspects, the apparatus may include an adder component coupled the one or more combiner components and configured to generate a DPD-processed output sample based at least in part on combining the respective output from at least a subset of the one or more combiner components.

In some aspects, an apparatus may include a pre-digital predistortion (DPD) signal conditioning circuit that generates a pre-DPD conditioned output signal and a post-DPD signal conditioning circuit. The apparatus may include a splitter component that is configured to split the pre-DPD conditioned output signal received from the pre-DPD signal conditioning circuit into at least two splitter output signals, each splitter output signal of the at least two splitter output signals being a respective distinct sub-band of the pre-DPD conditioned output signal, the respective distinct sub-band being separated from other sub-bands in the pre-DPD conditioned output signal by a frequency gap. Alternatively, or additionally, the apparatus may include a DPD component configured to: operate in a first mode that causes the DPD component to: receive the at least two splitter output signals as at least a first input signal and a second input signal; and apply DPD to at least the first input signal and the second input signal to generate at least a first DPD-processed output signal and a second DPD-processed output signal; operate in a second mode that causes the DPD component to: receive the pre-DPD conditioned output signal as a third input signal in a manner that bypasses the splitter component; and apply DPD to the third input signal to generate a third DPD-processed output signal; and switch between the first mode and the second mode. The apparatus may include a combiner component configured to: receive at least the first DPD-processed output signal and the second DPD-processed output signal; and output a combined DPD-processed output signal to the post-DPD conditioning circuit. In some aspects, the apparatus may include a routing mechanism configured to: receive the third DPD-processed output signal; and route the third DPD-processed output signal to the post-DPD conditioning circuit in a manner that bypasses the combiner component.

In some aspects, an apparatus may receive an indication of a selected multi-band DPD kernel that comprises a DPD kernel set. The apparatus may store a first input envelope value as one of a first plurality of envelope values associated with a first plurality of samples of a first sub-band of a wideband signal that span a time duration, and store a second input envelope value as one of a second plurality of envelope values associated with a second plurality of samples of a second sub-band of the wideband signal that span the time duration. In some aspects, the apparatus may store multiple computational values that include at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration. The apparatus may select a subset of envelope values from at least one of the first plurality of envelope values or the second plurality of envelope values based at least in part on the selected multi-band DPD kernel. The apparatus may generate an envelope computation value using the subset of envelope values, one or more LUTs, and the selected multi-band DPD kernel. The method may include selecting, based at least in part on the selected multi-band DPD kernel, one or more subsets of computational values from the multiple computational values. Alternatively, or additionally, the apparatus may generate a DPD-processed output sample based at least in part on combining the envelope computation value with the one or more subsets of computational values.

Particular aspects of the subject matter described in this disclosure can be implemented to realize one or more of the following potential advantages. In some examples, by partitioning a wireless signal that is sampled at a first sampling rate into multiple partitions that use a second, lower sampling rate, the described techniques can be used to reduce an amount of power consumed by a network node. For example, and as described below, the network node may include a splitter component (e.g., a split rotator component) to separate a sparse wideband signal into multiple sub-bands, a multi-dimensional DPD to apply DPD to the wideband signal by processing the multiple sub-bands at the second, lower sampling rate, and/or a combiner component to combine the multiple sub-bands to generate a DPD-processed wideband signal at the first sampling rate. In some aspects, the multi-dimensional DPD may be implemented as an adaptable DPD that includes multiple DPD kernels that may be dynamically switched between the multiple DPD kernels to enable the multi-dimensional DPD apply DPD to a variety of signals using a single architecture. For example, the multi-dimensional DPD may use a first DPD kernel (e.g., a single DPD kernel and/or a set of DPD kernels) to apply DPD to a wideband signal and a second DPD kernel to apply DPD to sub-bands of a wideband signal using the same architecture. "DPD kernel" may denote a core processing algorithm that performs digital pre-distortion processing that is based at least in part on a DPD algorithm. Partitioning a wideband signal, such as a sparse wideband signal, into multiple sub-bands may reduce a sampling rate of digital samples and/or digital streams that represent the sub-bands, and may consequently reduce a number of samples processed by a DPD component. Reducing a number of samples processed by the DPD component may reduce energy consumption by the DPD component, may reduce energy consumption by a transceiver that includes the DPD component, and May reduce energy consumption by a network node that includes the transceiver. Reduced energy consumption by a network node may reduce a need for heat dissipation and/or cooling provisions for hardware at the network node, may reduce usage stress on the hardware and result in a longer lifespan of the hardware, may increase a sustainability in operating the network node that enables the network node to meet regulatory energy consumption operating conditions, and/or may decrease an operating cost associated with the network node.

Multiple-access radio access technologies (RATs) have been adopted in various telecommunication standards to provide common protocols that enable wireless communication devices to communicate on a municipal, enterprise, national, regional, or global level. For example, 5G New Radio (NR) is part of a continuous mobile broadband evolution promulgated by the Third Generation Partnership Project (3GPP). 5G NR supports various technologies and use cases including enhanced mobile broadband (eMBB), ultra-reliable low-latency communication (URLLC), massive machine-type communication (mMTC), millimeter wave (mmWave) technology, beamforming, network slicing, edge computing, Internet of Things (IoT) connectivity and management, and network function virtualization (NFV).

As the demand for broadband access increases and as technologies supported by wireless communication networks evolve, further technological improvements may be adopted in or implemented for 5G NR or future RATs, such as 6G, to further advance the evolution of wireless communication for a wide variety of existing and new use cases and applications. Such technological improvements may be associated with new frequency band expansion, licensed and unlicensed spectrum access, overlapping spectrum use, small cell deployments, non-terrestrial network (NTN) deployments, disaggregated network architectures and network topology expansion, device aggregation, advanced duplex communication, sidelink and other device-to-device direct communication, IoT (including passive or ambient IoT) networks, reduced capability (RedCap) UE functionality, industrial connectivity, multiple-subscriber implementations, high-precision positioning, radio frequency (RF) sensing, and/or artificial intelligence or machine learning (AI/ML), among other examples. These technological improvements may support use cases such as wireless backhauls, wireless data centers, extended reality (XR) and metaverse applications, meta services for supporting vehicle connectivity, holographic and mixed reality communication, autonomous and collaborative robots, vehicle platooning and cooperative maneuvering, sensing networks, gesture monitoring, human-brain interfacing, digital twin applications, asset management, and universal coverage applications using non-terrestrial and/or aerial platforms, among other examples. The methods, operations, apparatuses, and techniques described herein may enable one or more of the foregoing technologies and/or support one or more of the foregoing use cases.

FIG. 1 is a diagram illustrating an example of a wireless communication network 100, in accordance with the present disclosure. The wireless communication network 100 may be or may include elements of a 5G (or NR) network or a 6G network, among other examples. The wireless communication network 100 may include multiple network nodes 110, shown as a network node (NN) 110*a*, a network node 110*b*, a network node 110*c*, and a network node 110*d*. The network nodes 110 may support communications with multiple UEs 120, shown as a UE 120*a*, a UE 120*b*, a UE 120*c*, a UE 120*d*, and a UE 120*e*.

The network nodes 110 and the UEs 120 of the wireless communication network 100 may communicate using the electromagnetic spectrum, which may be subdivided by frequency or wavelength into various classes, bands, carriers, and/or channels. For example, devices of the wireless communication network 100 may communicate using one or more operating bands. In some aspects, multiple wireless networks 100 may be deployed in a given geographic area. Each wireless communication network 100 may support a particular RAT (which may also be referred to as an air interface) and may operate on one or more carrier frequencies in one or more frequency ranges. Examples of RATs include a 4G RAT, a 5G/NR RAT, and/or a 6G RAT, among other examples. In some examples, when multiple RATs are deployed in a given geographic area, each RAT in the geographic area may operate on different frequencies to avoid interference with one another.

Various operating bands have been defined as frequency range designations FR1 (410 megahertz (MHz) through 7.125 gigahertz (GHz)), FR2 (24.25 GHz through 52.6 GHz), FR3 (7.125 GHz through 24.25 GHz), FR4a or FR4-1 (52.6 GHz through 71 GHz), FR4 (52.6 GHz through 114.25 GHz), and FR5 (114.25 GHz through 300 GHz). Although a portion of FR1 is greater than 6 GHZ, FR1 is often referred to (interchangeably) as a "Sub-6 GHz" band in some documents and articles. Similarly, FR2 is often referred to (interchangeably) as a "millimeter wave" band in some documents and articles, despite being different than the extremely high frequency (EHF) band (30 GHz through 300 GHz), which is identified by the International Telecommunications Union (ITU) as a "millimeter wave" band. The frequencies between FR1 and FR2 are often referred to as mid-band frequencies, which include FR3. Frequency bands falling within FR3 may inherit FR1 characteristics or FR2 characteristics, and thus may effectively extend features of FR1 or FR2 into mid-band frequencies. Thus, "sub-6 GHz," if used herein, may broadly refer to frequencies that are less than 6 GHZ, that are within FR1, and/or that are included in mid-band frequencies. Similarly, the term "millimeter wave," if used herein, may broadly refer to frequencies that are included in mid-band frequencies, that are within FR2, FR4, FR4-a or FR4-1, or FR5, and/or that are within the EHF band. Higher frequency bands may extend 5G NR operation, 6G operation, and/or other RATs beyond 52.6 GHz. For example, each of FR4a, FR4-1, FR4, and FR5 falls within the EHF band. In some examples, the wireless communication network 100 may implement dynamic spectrum sharing (DSS), in which multiple RATs (for example, 4G/LTE and 5G/NR) are implemented with dynamic bandwidth allocation (for example, based on user demand) in a single frequency band. It is contemplated that the frequencies included in these operating bands (for example, FR1, FR2, FR3, FR4, FR4-a, FR4-1, and/or FR5) may be modified, and techniques described herein may be applicable to those modified frequency ranges.

A network node 110 may include one or more devices, components, or systems that enable communication between a UE 120 and one or more devices, components, or systems of the wireless communication network 100. A network node 110 may be, may include, or may also be referred to as an NR network node, a 5G network node, a 6G network node, a Node B, an eNB, a gNB, an access point (AP), a transmission reception point (TRP), a mobility element, a core, a network entity, a network element, a network equipment, and/or another type of device, component, or system included in a radio access network (RAN).

A network node 110 may be implemented as a single physical node (for example, a single physical structure) or may be implemented as two or more physical nodes (for example, two or more distinct physical structures). For example, a network node 110 may be a device or system that implements part of a radio protocol stack, a device or system that implements a full radio protocol stack (such as a full gNB protocol stack), or a collection of devices or systems that collectively implement the full radio protocol stack. For example, and as shown, a network node 110 may be an aggregated network node (having an aggregated architecture), meaning that the network node 110 may implement a full radio protocol stack that is physically and logically integrated within a single node (for example, a single physical structure) in the wireless communication network 100. For example, an aggregated network node 110 may consist of a single standalone base station or a single TRP that uses a full radio protocol stack to enable or facilitate communication between a UE 120 and a core network of the wireless communication network 100.

Alternatively, and as also shown, a network node 110 may be a disaggregated network node (sometimes referred to as a disaggregated base station), meaning that the network node 110 may implement a radio protocol stack that is physically distributed and/or logically distributed among two or more nodes in the same geographic location or in different geographic locations. For example, a disaggregated network node may have a disaggregated architecture. In some deployments, disaggregated network nodes 110 may be used in an integrated access and backhaul (IAB) network, in an open radio access network (O-RAN) (such as a network configuration in compliance with the O-RAN Alliance), or in a virtualized radio access network (vRAN), also known as a cloud radio access network (C-RAN), to facilitate scaling by separating base station functionality into multiple units that can be individually deployed.

The network nodes 110 of the wireless communication network 100 may include one or more central units (CUs), one or more distributed units (DUs), and/or one or more radio units (RUs). A CU may host one or more higher layer control functions, such as radio resource control (RRC) functions, packet data convergence protocol (PDCP) functions, and/or service data adaptation protocol (SDAP) functions, among other examples. A DU may host one or more of a radio link control (RLC) layer, a medium access control (MAC) layer, and/or one or more higher physical (PHY) layers depending, at least in part, on a functional split, such as a functional split defined by the 3GPP. In some examples, a DU also may host one or more lower PHY layer functions, such as a fast Fourier transform (FFT), an inverse FFT (iFFT), beamforming, physical random access channel (PRACH) extraction and filtering, and/or scheduling of resources for one or more UEs 120, among other examples. An RU may host RF processing functions or lower PHY layer functions, such as an FFT, an iFFT, beamforming, or PRACH extraction and filtering, among other examples, according to a functional split, such as a lower layer functional split. In such an architecture, each RU can be operated to handle over the air (OTA) communication with one or more UEs 120.

In some aspects, a single network node 110 may include a combination of one or more CUs, one or more DUs, and/or one or more RUs. Additionally or alternatively, a network node 110 may include one or more Near-Real Time (Near-RT) RAN Intelligent Controllers (RICs) and/or one or more Non-Real Time (Non-RT) RICs. In some examples, a CU, a DU, and/or an RU may be implemented as a virtual unit, such as a virtual central unit (VCU), a virtual distributed unit (VDU), or a virtual radio unit (VRU), among other examples. A virtual unit may be implemented as a virtual network function, such as associated with a cloud deployment.

Some network nodes 110 (for example, a base station, an RU, or a TRP) may provide communication coverage for a particular geographic area. In the 3GPP, the term "cell" can refer to a coverage area of a network node 110 or to a network node 110 itself, depending on the context in which the term is used. A network node 110 may support one or multiple (for example, three) cells. In some examples, a network node 110 may provide communication coverage for a macro cell, a pico cell, a femto cell, or another type of cell. A macro cell may cover a relatively large geographic area (for example, several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (for example, a home) and may allow restricted access by UEs 120 having association with the femto cell (for example, UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In some examples, a cell may not necessarily be stationary. For example, the geographic area of the cell may move according to the location of an associated mobile network node 110 (for example, a train, a satellite base station, an unmanned aerial vehicle, or an NTN network node).

The wireless communication network 100 may be a heterogeneous network that includes network nodes 110 of different types, such as macro network nodes, pico network nodes, femto network nodes, relay network nodes, aggregated network nodes, and/or disaggregated network nodes, among other examples. In the example shown in FIG. 1, the network node 110*a* may be a macro network node for a macro cell 130*a*, the network node 110*b* may be a pico network node for a pico cell 130*b*, and the network node 110*c* may be a femto network node for a femto cell 130*c*. Various different types of network nodes 110 may generally transmit at different power levels, serve different coverage areas, and/or have different impacts on interference in the wireless communication network 100 than other types of network nodes 110. For example, macro network nodes may have a high transmit power level (for example, 5 to 40 watts), whereas pico network nodes, femto network nodes, and relay network nodes may have lower transmit power levels (for example, 0.1 to 2 watts).

In some examples, a network node 110 may be, may include, or may operate as an RU, a TRP, or a base station that communicates with one or more UEs 120 via a radio access link (which may be referred to as a "Uu" link). The radio access link may include a downlink and an uplink. "Downlink" (or "DL") refers to a communication direction from a network node 110 to a UE 120, and "uplink" (or "UL") refers to a communication direction from a UE 120 to a network node 110. Downlink channels may include one or more control channels and one or more data channels. A downlink control channel may be used to transmit downlink control information (DCI) (for example, scheduling information, reference signals, and/or configuration information) from a network node 110 to a UE 120. A downlink data channel may be used to transmit downlink data (for example, user data associated with a UE 120) from a network node 110 to a UE 120. Downlink control channels may include one or more physical downlink control channels (PDCCHs), and downlink data channels may include one or more physical downlink shared channels (PDSCHs). Uplink channels may similarly include one or more control channels and one or more data channels. An uplink control channel may be used to transmit uplink control information (UCI) (for example, reference signals and/or feedback corresponding to one or more downlink transmissions) from a UE 120 to a network node 110. An uplink data channel may be used to transmit uplink data (for example, user data associated with a UE 120) from a UE 120 to a network node 110. Uplink control channels may include one or more physical uplink control channels (PUCCHs), and uplink data channels may include one or more physical uplink shared channels (PUSCHs). The downlink and the uplink may each include a set of resources on which the network node 110 and the UE 120 may communicate.

Downlink and uplink resources may include time domain resources (frames, subframes, slots, and/or symbols), frequency domain resources (frequency bands, component carriers, subcarriers, resource blocks, and/or resource elements), and/or spatial domain resources (particular transmit directions and/or beam parameters). Frequency domain resources of some bands may be subdivided into bandwidth parts (BWPs). A BWP may be a continuous block of frequency domain resources (for example, a continuous block of resource blocks) that are allocated for one or more UEs 120. A UE 120 may be configured with both an uplink BWP and a downlink BWP (where the uplink BWP and the downlink BWP may be the same BWP or different BWPs). A BWP may be dynamically configured (for example, by a network node 110 transmitting a DCI configuration to the one or more UEs 120) and/or reconfigured, which means that a BWP can be adjusted in real-time (or near-real-time) based on changing network conditions in the wireless communication network 100 and/or based on the specific requirements of the one or more UEs 120. This enables more efficient use of the available frequency domain resources in the wireless communication network 100 because fewer frequency domain resources may be allocated to a BWP for a UE 120 (which may reduce the quantity of frequency domain resources that a UE 120 is required to monitor), leaving more frequency domain resources to be spread across multiple UEs 120. Thus, BWPs may also assist in the implementation of lower-capability UEs 120 by facilitating the configuration of smaller bandwidths for communication by such UEs 120.

As described above, in some aspects, the wireless communication network 100 may be, may include, or may be included in, an IAB network. In an IAB network, at least one network node 110 is an anchor network node that communicates with a core network. An anchor network node 110 may also be referred to as an IAB donor (or "IAB-donor"). The anchor network node 110 may connect to the core network via a wired backhaul link. For example, an Ng interface of the anchor network node 110 may terminate at the core network. Additionally or alternatively, an anchor network node 110 may connect to one or more devices of the core network that provide a core access and mobility management function (AMF). An IAB network also generally includes multiple non-anchor network nodes 110, which may also be referred to as relay network nodes or simply as IAB nodes (or "IAB-nodes"). Each non-anchor network node 110 may communicate directly with the anchor network node 110 via a wireless backhaul link to access the core network, or may communicate indirectly with the anchor network node 110 via one or more other non-anchor network nodes 110 and associated wireless backhaul links that form a backhaul path to the core network. Some anchor network node 110 or other non-anchor network node 110 may also communicate directly with one or more UEs 120 via wireless access links that carry access traffic. In some examples, network resources for wireless communication (such as time resources, frequency resources, and/or spatial resources) may be shared between access links and backhaul links.

In some examples, any network node 110 that relays communications may be referred to as a relay network node, a relay station, or simply as a relay. A relay may receive a transmission of a communication from an upstream station (for example, another network node 110 or a UE 120) and transmit the communication to a downstream station (for example, a UE 120 or another network node 110). In this case, the wireless communication network 100 may include or be referred to as a "multi-hop network." In the example shown in FIG. 1, the network node **110*d* (for example, a relay network node) may communicate with the network node 110*a* (for example, a macro network node) and the UE 120*d* in order to facilitate communication between the network node 110*a* and the UE 120*d*. Additionally or alternatively, a UE 120 may be or may operate as a relay station that can relay transmissions to or from other UEs 120. A UE 120** that relays communications may be referred to as a UE relay or a relay UE, among other examples.

The UEs 120 may be physically dispersed throughout the wireless communication network 100, and each UE 120 may be stationary or mobile. A UE 120 may be, may include, or may be included in an access terminal, another terminal, a mobile station, or a subscriber unit. A UE 120 may be, include, or be coupled with a cellular phone (for example, a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (for example, a smart watch, smart clothing, smart glasses, a smart wristband, and/or smart jewelry, such as a smart ring or a smart bracelet), an entertainment device (for example, a music device, a video device, and/or a satellite radio), an XR device, a vehicular component or sensor, a smart meter or sensor, industrial manufacturing equipment, a Global Navigation Satellite System (GNSS) device (such as a Global Positioning System device or another type of positioning device), a UE function of a network node, and/or any other suitable device or function that may communicate via a wireless medium.

A UE 120 and/or a network node 110 may include one or more chips, system-on-chips (SoCs), chipsets, packages, or devices that individually or collectively constitute or comprise a processing system. The processing system includes processor (or "processing") circuitry in the form of one or multiple processors, microprocessors, processing units (such as central processing units (CPUs), graphics processing units (GPUs), neural processing units (NPUs) and/or digital signal processors (DSPs)), processing blocks, application-specific integrated circuits (ASIC), programmable logic devices (PLDs) (such as field programmable gate arrays (FPGAs)), or other discrete gate or transistor logic or circuitry (all of which may be generally referred to herein individually as "processors" or collectively as "the processor" or "the processor circuitry"). One or more of the processors may be individually or collectively configurable or configured to perform various functions or operations described herein. A group of processors collectively configurable or configured to perform a set of functions may include a first processor configurable or configured to perform a first function of the set and a second processor configurable or configured to perform a second function of the set, or may include the group of processors all being configured or configurable to perform the set of functions.

The processing system may further include memory circuitry in the form of one or more memory devices, memory blocks, memory elements or other discrete gate or transistor logic or circuitry, each of which may include tangible storage media such as random-access memory (RAM) or read-only memory (ROM), or combinations thereof (all of which may be generally referred to herein individually as "memories" or collectively as "the memory" or "the memory circuitry"). One or more of the memories may be coupled (for example, operatively coupled, communicatively coupled, electronically coupled, or electrically coupled) with one or more of the processors and may individually or collectively store processor-executable code (such as software) that, when executed by one or more of the processors, may configure one or more of the processors to perform various functions or operations described herein. Additionally or alternatively, in some examples, one or more of the processors may be preconfigured to perform various functions or operations described herein without requiring configuration by software. The processing system may further include or be coupled with one or more modems (such as a Wi-Fi (for example, IEEE compliant) modem or a cellular (for example, 3GPP 4G LTE, 5G, or 6G compliant) modem). In some implementations, one or more processors of the processing system include or implement one or more of the modems. The processing system may further include or be coupled with multiple radios (collectively "the radio"), multiple RF chains, or multiple transceivers, each of which may in turn be coupled with one or more of multiple antennas. In some implementations, one or more processors of the processing system include or implement one or more of the radios, RF chains or transceivers. The UE 120 may include or may be included in a housing that houses components associated with the UE 120 including the processing system.

Some UEs 120 may be considered machine-type communication (MTC) UEs, evolved or enhanced machine-type communication (eMTC), UEs, further enhanced eMTC (feMTC) UEs, or enhanced feMTC (efeMTC) UEs, or further evolutions thereof, all of which may be simply referred to as "MTC UEs". An MTC UE may be, may include, or may be included in or coupled with a robot, an uncrewed aerial vehicle, a remote device, a sensor, a meter, a monitor, and/or a location tag. Some UEs 120 may be considered IoT devices and/or may be implemented as NB-IoT (narrowband IoT) devices. An IoT UE or NB-IoT device may be, may include, or may be included in or coupled with an industrial machine, an appliance, a refrigerator, a doorbell camera device, a home automation device, and/or a light fixture, among other examples. Some UEs 120 may be considered Customer Premises Equipment, which may include telecommunications devices that are installed at a customer location (such as a home or office) to enable access to a service provider's network (such as included in or in communication with the wireless communication network 100).

Some UEs 120 may be classified according to different categories in association with different complexities and/or different capabilities. UEs 120 in a first category may facilitate massive IoT in the wireless communication network 100, and may offer low complexity and/or cost relative to UEs 120 in a second category. UEs 120 in a second category may include mission-critical IoT devices, legacy UEs, baseline UEs, high-tier UEs, advanced UEs, full-capability UEs, and/or premium UEs that are capable of URLLC, eMBB, and/or precise positioning in the wireless communication network 100, among other examples. A third category of UEs 120 may have mid-tier complexity and/or capability (for example, a capability between UEs 120 of the first category and UEs 120 of the second capability). A UE 120 of the third category may be referred to as a reduced capacity UE ("RedCap UE"), a mid-tier UE, an NR-Light UE, and/or an NR-Lite UE, among other examples. RedCap UEs may bridge a gap between the capability and complexity of NB-IoT devices and/or eMTC UEs, and mission-critical IoT devices and/or premium UEs. RedCap UEs may include, for example, wearable devices, IoT devices, industrial sensors, and/or cameras that are associated with a limited bandwidth, power capacity, and/or transmission range, among other examples. RedCap UEs may support healthcare environments, building automation, electrical distribution, process automation, transport and logistics, and/or smart city deployments, among other examples.

In some examples, two or more UEs 120 (for example, shown as UE 120*a* and UE 120*e*) may communicate directly with one another using sidelink communications (for example, without communicating by way of a network node 110 as an intermediary). As an example, the UE 120*a* may directly transmit data, control information, or other signaling as a sidelink communication to the UE 120*e*. This is in contrast to, for example, the UE 120*a* first transmitting data in an UL communication to a network node 110, which then transmits the data to the UE 120*e* in a DL communication. In various examples, the UEs 120 may transmit and receive sidelink communications using peer-to-peer (P2P) communication protocols, device-to-device (D2D) communication protocols, vehicle-to-everything (V2X) communication protocols (which may include vehicle-to-vehicle (V2V) protocols, vehicle-to-infrastructure (V2I) protocols, and/or vehicle-to-pedestrian (V2P) protocols), and/or mesh network communication protocols. In some deployments and configurations, a network node 110 may schedule and/or allocate resources for sidelink communications between UEs 120 in the wireless communication network 100. In some other deployments and configurations, a UE 120 (instead of a network node 110) may perform, or collaborate or negotiate with one or more other UEs to perform, scheduling operations, resource selection operations, and/or other operations for sidelink communications.

In various examples, some of the network nodes 110 and the UEs 120 of the wireless communication network 100 may be configured for full-duplex operation in addition to half-duplex operation. A network node 110 or a UE 120 operating in a half-duplex mode may perform only one of transmission or reception during particular time resources, such as during particular slots, symbols, or other time periods. Half-duplex operation may involve time-division duplexing (TDD), in which DL transmissions of the network node 110 and UL transmissions of the UE 120 do not occur in the same time resources (that is, the transmissions do not overlap in time). In contrast, a network node 110 or a UE 120 operating in a full-duplex mode can transmit and receive communications concurrently (for example, in the same time resources). By operating in a full-duplex mode, network nodes 110 and/or UEs 120 may generally increase the capacity of the network and the radio access link. In some examples, full-duplex operation may involve frequency-division duplexing (FDD), in which DL transmissions of the network node 110 are performed in a first frequency band or on a first component carrier and transmissions of the UE 120 are performed in a second frequency band or on a second component carrier different than the first frequency band or the first component carrier, respectively. In some examples, full-duplex operation may be enabled for a UE 120 but not for a network node 110. For example, a UE 120 may simultaneously transmit an UL transmission to a first network node 110 and receive a DL transmission from a second network node 110 in the same time resources. In some other examples, full-duplex operation may be enabled for a network node 110 but not for a UE 120. For example, a network node 110 may simultaneously transmit a DL transmission to a first UE 120 and receive an UL transmission from a second UE 120 in the same time resources. In some other examples, full-duplex operation may be enabled for both a network node 110 and a UE 120.

In some examples, the UEs 120 and the network nodes 110 may perform MIMO communication. "MIMO" generally refers to transmitting or receiving multiple signals (such as multiple layers or multiple data streams) simultaneously over the same time and frequency resources. MIMO techniques generally exploit multipath propagation. MIMO may be implemented using various spatial processing or spatial multiplexing operations. In some examples, MIMO may support simultaneous transmission to multiple receivers, referred to as multi-user MIMO (MU-MIMO). Some RATs may employ advanced MIMO techniques, such as mTRP operation (including redundant transmission or reception on multiple TRPs), reciprocity in the time domain or the frequency domain, single-frequency-network (SFN) transmission, or non-coherent joint transmission (NC-JT).

In some aspects, an apparatus (e.g., a multi-dimensional DPD apparatus 800) may receive an indication of a selected multi-band DPD kernel that comprises a DPD kernel set; store a first input envelope value as one of a first plurality of envelope values associated with a first plurality of samples of a first sub-band of a wideband signal that span a time duration; store a second input envelope value as one of a second plurality of envelope values associated with a second plurality of samples of a second sub-band of the wideband signal that span the time duration; store multiple computational values that comprise at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration; select a subset of envelope values from at least one of the first plurality of envelope values or the second plurality of envelope values based at least in part on the selected multi-band DPD kernel; generate an envelope computation value using the subset of envelope values, one or LUTs, and the selected multi-band DPD kernel; select, based at least in part on the selected multi-band DPD kernel, one or more subsets of computational values from the multiple computational values; and generate a DPD-processed output sample based at least in part on combining the envelope computation value with the one or more subsets of computational values. Additionally, or alternatively, the apparatus may perform one or more other operations described herein.

As indicated above, FIG. 1 is provided as an example. Other examples may differ from what is described with regard to FIG. 1.

Figure 2:
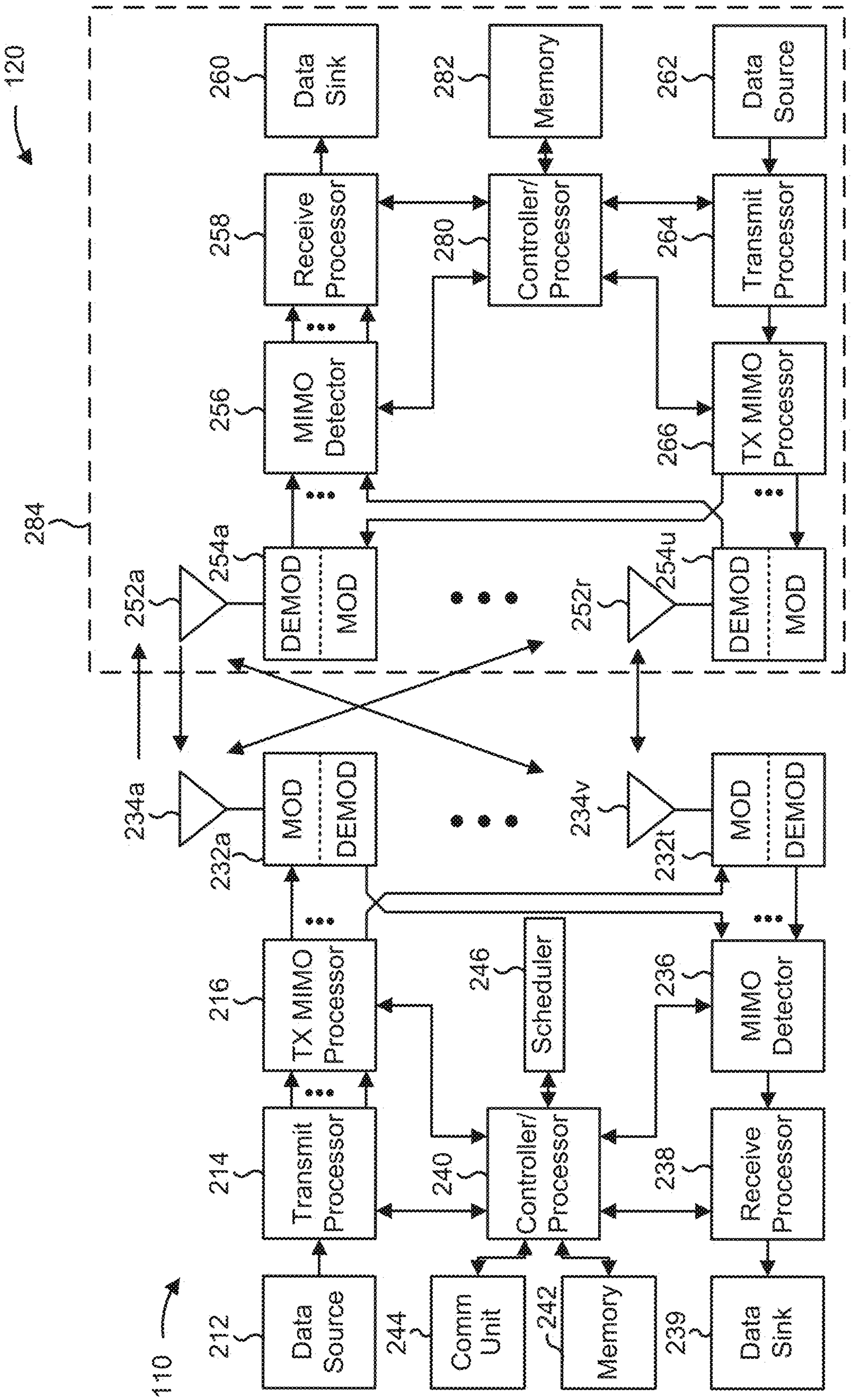
FIG. 2 is a diagram illustrating an example network node in communication with an example user equipment (UE) in a wireless network, in accordance with the present disclosure.

FIG. 2 is a diagram illustrating an example network node 110 in communication with an example UE 120 in a wireless network, in accordance with the present disclosure.

As shown in FIG. 2, the network node 110 may include a data source 212, a transmit processor 214, a transmit (TX) MIMO processor 216, a set of modems 232 (shown as 232*a* through 232*t*, where t≥1), a set of antennas 234 (shown as 234*a* through 234*v*, where v≥1), a MIMO detector 236, a receive processor 238, a data sink 239, a controller/processor 240, a memory 242, a communication unit 244, and/or a scheduler 246, among other examples. In some configurations, one or a combination of the antenna(s) 234, the modem(s) 232, the MIMO detector 236, the receive processor 238, the transmit processor 214, and/or the TX MIMO processor 216 may be included in a transceiver of the network node 110. The transceiver may be under control of and used by one or more processors, such as the controller/processor 240, and in some aspects in conjunction with processor-readable code stored in the memory 242, to perform aspects of the methods, processes, and/or operations described herein. In some aspects, the network node 110 may include one or more interfaces, communication components, and/or other components that facilitate communication with the UE 120 or another network node.

The terms "processor," "controller," or "controller/processor" may refer to one or more controllers and/or one or more processors. For example, reference to "a/the processor," "a/the controller/processor," or the like (in the singular) should be understood to refer to any one or more of the processors described in connection with FIG. 2, such as a single processor or a combination of multiple different processors. Reference to "one or more processors" should be understood to refer to any one or more of the processors described in connection with FIG. 2. For example, one or more processors of the network node 110 may include transmit processor 214, TX MIMO processor 216, MIMO detector 236, receive processor 238, and/or controller/processor 240. Similarly, one or more processors of the UE 120 may include MIMO detector 256, receive processor 258, transmit processor 264, TX MIMO processor 266, and/or controller/processor 280.

In some aspects, a single processor may perform all of the operations described as being performed by the one or more processors. In some aspects, a first set of (one or more)

processors of the one or more processors may perform a first operation described as being performed by the one or more processors, and a second set of (one or more) processors of the one or more processors may perform a second operation described as being performed by the one or more processors. The first set of processors and the second set of processors may be the same set of processors or may be different sets of processors. Reference to "one or more memories" should be understood to refer to any one or more memories of a corresponding device, such as the memory described in connection with FIG. 2. For example, operation described as being performed by one or more memories can be performed by the same subset of the one or more memories or different subsets of the one or more memories.

For downlink communication from the network node 110 to the UE 120, the transmit processor 214 may receive data ("downlink data") intended for the UE 120 (or a set of UEs that includes the UE 120) from the data source 212 (such as a data pipeline or a data queue). In some examples, the transmit processor 214 may select one or more MCSs for the UE 120 in accordance with one or more channel quality indicators (CQIs) received from the UE 120. The network node 110 may process the data (for example, including encoding the data) for transmission to the UE 120 on a downlink in accordance with the MCS(s) selected for the UE 120 to generate data symbols. The transmit processor 214 may process system information (for example, semi-static resource partitioning information (SRPI)) and/or control information (for example, CQI requests, grants, and/or upper layer signaling) and provide overhead symbols and/or control symbols. The transmit processor 214 may generate reference symbols for reference signals (for example, a cell-specific reference signal (CRS), a demodulation reference signal (DMRS), or a channel state information (CSI) reference signal (CSI-RS)) and/or synchronization signals (for example, a primary synchronization signal (PSS) or a secondary synchronization signals (SSS)).

The TX MIMO processor 216 may perform spatial processing (for example, precoding) on the data symbols, the control symbols, the overhead symbols, and/or the reference symbols, if applicable, and may provide a set of output symbol streams (for example, T output symbol streams) to the set of modems 232. For example, each output symbol stream may be provided to a respective modulator component (shown as MOD) of a modem 232. Each modem 232 may use the respective modulator component to process (for example, to modulate) a respective output symbol stream (for example, for orthogonal frequency division multiplexing (OFDM)) to obtain an output sample stream. Each modem 232 may further use the respective modulator component to process (for example, convert to analog, amplify, filter, and/or upconvert) the output sample stream to obtain a time domain downlink signal. The modems 232*a* through 232*t* may together transmit a set of downlink signals (for example, T downlink signals) via the corresponding set of antennas 234.

A downlink signal may include a DCI communication, a MAC control element (MAC-CE) communication, an RRC communication, a downlink reference signal, or another type of downlink communication. Downlink signals may be transmitted on a PDCCH, a PDSCH, and/or on another downlink channel. A downlink signal may carry one or more transport blocks (TBs) of data. A TB may be a unit of data that is transmitted over an air interface in the wireless communication network 100. A data stream (for example, from the data source 212) may be encoded into multiple TBs for transmission over the air interface. The quantity of TBs used to carry the data associated with a particular data stream may be associated with a TB size common to the multiple TBs. The TB size may be based on or otherwise associated with radio channel conditions of the air interface, the MCS used for encoding the data, the downlink resources allocated for transmitting the data, and/or another parameter. In general, the larger the TB size, the greater the amount of data that can be transmitted in a single transmission, which reduces signaling overhead. However, larger TB sizes may be more prone to transmission and/or reception errors than smaller TB sizes, but such errors may be mitigated by more robust error correction techniques.

For uplink communication from the UE 120 to the network node 110, uplink signals from the UE 120 may be received by an antenna 234, may be processed by a modem 232 (for example, a demodulator component, shown as DEMOD, of a modem 232), may be detected by the MIMO detector 236 (for example, a receive (Rx) MIMO processor) if applicable, and/or may be further processed by the receive processor 238 to obtain decoded data and/or control information. The receive processor 238 may provide the decoded data to a data sink 239 (which may be a data pipeline, a data queue, and/or another type of data sink) and provide the decoded control information to a processor, such as the controller/processor 240.

The network node 110 may use the scheduler 246 to schedule one or more UEs 120 for downlink or uplink communications. In some aspects, the scheduler 246 may use DCI to dynamically schedule DL transmissions to the UE 120 and/or UL transmissions from the UE 120. In some examples, the scheduler 246 may allocate recurring time domain resources and/or frequency domain resources that the UE 120 may use to transmit and/or receive communications using an RRC configuration (for example, a semi-static configuration), for example, to perform semi-persistent scheduling (SPS) or to configure a configured grant (CG) for the UE 120.

One or more of the transmit processor 214, the TX MIMO processor 216, the modem 232, the antenna 234, the MIMO detector 236, the receive processor 238, and/or the controller/processor 240 may be included in an RF chain of the network node 110. An RF chain may include one or more filters, mixers, oscillators, amplifiers, analog-to-digital converters (ADCs), and/or other devices that convert between an analog signal (such as for transmission or reception via an air interface) and a digital signal (such as for processing by one or more processors of the network node 110). In some aspects, the RF chain may be or may be included in a transceiver of the network node 110.

In some examples, the network node 110 may use the communication unit 244 to communicate with a core network and/or with other network nodes. The communication unit 244 may support wired and/or wireless communication protocols and/or connections, such as Ethernet, optical fiber, common public radio interface (CPRI), and/or a wired or wireless backhaul, among other examples. The network node 110 may use the communication unit 244 to transmit and/or receive data associated with the UE 120 or to perform network control signaling, among other examples. The communication unit 244 may include a transceiver and/or an interface, such as a network interface.

The UE 120 may include a set of antennas 252 (shown as antennas 252*a* through 252*r*, where r≥1), a set of modems 254 (shown as modems 254*a* through 254*u*, where u≥1), a MIMO detector 256, a receive processor 258, a data sink 260, a data source 262, a transmit processor 264, a TX MIMO processor 266, a controller/processor 280, and/or a memory 282, among other examples. One or more of the components of the UE 120 may be included in a housing 284. In some aspects, one or a combination of the antenna(s) 252, the modem(s) 254, the MIMO detector 256, the receive processor 258, the transmit processor 264, or the TX MIMO processor 266 may be included in a transceiver that is included in the UE 120. The transceiver may be under control of and used by one or more processors, such as the controller/processor 280, and in some aspects in conjunction with processor-readable code stored in the memory 282, to perform aspects of the methods, processes, or operations described herein. In some aspects, the UE 120 may include another interface, another communication component, and/or another component that facilitates communication with the network node 110 and/or another UE 120.

For downlink communication from the network node 110 to the UE 120, the set of antennas 252 may receive the downlink communications or signals from the network node 110 and may provide a set of received downlink signals (for example, R received signals) to the set of modems 254. For example, each received signal may be provided to a respective demodulator component (shown as DEMOD) of a modem 254. Each modem 254 may use the respective demodulator component to condition (for example, filter, amplify, downconvert, and/or digitize) a received signal to obtain input samples. Each modem 254 may use the respective demodulator component to further demodulate or process the input samples (for example, for OFDM) to obtain received symbols. The MIMO detector 256 may obtain received symbols from the set of modems 254, may perform MIMO detection on the received symbols if applicable, and may provide detected symbols. The receive processor 258 may process (for example, decode) the detected symbols, may provide decoded data for the UE 120 to the data sink 260 (which may include a data pipeline, a data queue, and/or an application executed on the UE 120), and may provide decoded control information and system information to the controller/processor 280.

For uplink communication from the UE 120 to the network node 110, the transmit processor 264 may receive and process data ("uplink data") from a data source 262 (such as a data pipeline, a data queue, and/or an application executed on the UE 120) and control information from the controller/processor 280. The control information may include one or more parameters, feedback, one or more signal measurements, and/or other types of control information. In some aspects, the receive processor 258 and/or the controller/processor 280 may determine, for a received signal (such as received from the network node 110 or another UE), one or more parameters relating to transmission of the uplink communication. The one or more parameters may include a reference signal received power (RSRP) parameter, a received signal strength indicator (RSSI) parameter, a reference signal received quality (RSRQ) parameter, a CQI parameter, or a transmit power control (TPC) parameter, among other examples. The control information may include an indication of the RSRP parameter, the RSSI parameter, the RSRQ parameter, the CQI parameter, the TPC parameter, and/or another parameter. The control information may facilitate parameter selection and/or scheduling for the UE 120 by the network node 110.

The transmit processor 264 may generate reference symbols for one or more reference signals, such as an uplink DMRS, an uplink sounding reference signal (SRS), and/or another type of reference signal. The symbols from the transmit processor 264 may be precoded by the TX MIMO processor 266, if applicable, and further processed by the set of modems 254 (for example, for DFT-s-OFDM or CP-OFDM). The TX MIMO processor 266 may perform spatial processing (for example, precoding) on the data symbols, the control symbols, the overhead symbols, and/or the reference symbols, if applicable, and may provide a set of output symbol streams (for example, U output symbol streams) to the set of modems 254. For example, each output symbol stream may be provided to a respective modulator component (shown as MOD) of a modem 254. Each modem 254 may use the respective modulator component to process (for example, to modulate) a respective output symbol stream (for example, for OFDM) to obtain an output sample stream. Each modem 254 may further use the respective modulator component to process (for example, convert to analog, amplify, filter, and/or upconvert) the output sample stream to obtain an uplink signal.

The modems 254*a* through 254*u* may transmit a set of uplink signals (for example, R uplink signals or U uplink symbols) via the corresponding set of antennas 252. An uplink signal may include a UCI communication, a MAC-CE communication, an RRC communication, or another type of uplink communication. Uplink signals may be transmitted on a PUSCH, a PUCCH, and/or another type of uplink channel. An uplink signal may carry one or more TBs of data. Sidelink data and control transmissions (that is, transmissions directly between two or more UEs 120) may generally use similar techniques as were described for uplink data and control transmission, and may use sidelink-specific channels such as a physical sidelink shared channel (PSSCH), a physical sidelink control channel (PSCCH), and/or a physical sidelink feedback channel (PSFCH).

One or more antennas of the set of antennas 252 or the set of antennas 234 may include, or may be included within, one or more antenna panels, one or more antenna groups, one or more sets of antenna elements, or one or more antenna arrays, among other examples. An antenna panel, an antenna group, a set of antenna elements, or an antenna array may include one or more antenna elements (within a single housing or multiple housings), a set of coplanar antenna elements, a set of non-coplanar antenna elements, or one or more antenna elements coupled with one or more transmission or reception components, such as one or more components of FIG. 2. As used herein, "antenna" can refer to one or more antennas, one or more antenna panels, one or more antenna groups, one or more sets of antenna elements, or one or more antenna arrays. "Antenna panel" can refer to a group of antennas (such as antenna elements) arranged in an array or panel, which may facilitate beamforming by manipulating parameters of the group of antennas. "Antenna module" may refer to circuitry including one or more antennas, which may also include one or more other components (such as filters, amplifiers, or processors) associated with integrating the antenna module into a wireless communication device.

In some examples, each of the antenna elements of an antenna 234 or an antenna 252 may include one or more sub-elements for radiating or receiving radio frequency signals. For example, a single antenna element may include a first sub-element cross-polarized with a second sub-element that can be used to independently transmit cross-polarized signals. The antenna elements may include patch antennas, dipole antennas, and/or other types of antennas arranged in a linear pattern, a two-dimensional pattern, or another pattern. A spacing between antenna elements may be such that signals with a desired wavelength transmitted separately by the antenna elements may interact or interfere constructively and destructively along various directions (such as to form a desired beam). For example, given an expected range of wavelengths or frequencies, the spacing may provide a quarter wavelength, a half wavelength, or another fraction of a wavelength of spacing between neighboring antenna elements to allow for the desired constructive and destructive interference patterns of signals transmitted by the separate antenna elements within that expected range.

The amplitudes and/or phases of signals transmitted via antenna elements and/or sub-elements may be modulated and shifted relative to each other (such as by manipulating phase shift, phase offset, and/or amplitude) to generate one or more beams, which is referred to as beamforming. The term "beam" may refer to a directional transmission of a wireless signal toward a receiving device or otherwise in a desired direction. "Beam" may also generally refer to a direction associated with such a directional signal transmission, a set of directional resources associated with the signal transmission (for example, an angle of arrival, a horizontal direction, and/or a vertical direction), and/or a set of parameters that indicate one or more aspects of a directional signal, a direction associated with the signal, and/or a set of directional resources associated with the signal. In some implementations, antenna elements may be individually selected or deselected for directional transmission of a signal (or signals) by controlling amplitudes of one or more corresponding amplifiers and/or phases of the signal(s) to form one or more beams. The shape of a beam (such as the amplitude, width, and/or presence of side lobes) and/or the direction of a beam (such as an angle of the beam relative to a surface of an antenna array) can be dynamically controlled by modifying the phase shifts, phase offsets, and/or amplitudes of the multiple signals relative to each other.

Different UEs 120 or network nodes 110 may include different numbers of antenna elements. For example, a UE 120 may include a single antenna element, two antenna elements, four antenna elements, eight antenna elements, or a different number of antenna elements. As another example, a network node 110 may include eight antenna elements, 24 antenna elements, 64 antenna elements, 128 antenna elements, or a different number of antenna elements. Generally, a larger number of antenna elements may provide increased control over parameters for beam generation relative to a smaller number of antenna elements, whereas a smaller number of antenna elements may be less complex to implement and may use less power than a larger number of antenna elements. Multiple antenna elements may support multiple-layer transmission, in which a first layer of a communication (which may include a first data stream) and a second layer of a communication (which may include a second data stream) are transmitted using the same time and frequency resources with spatial multiplexing.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

Figure 3:
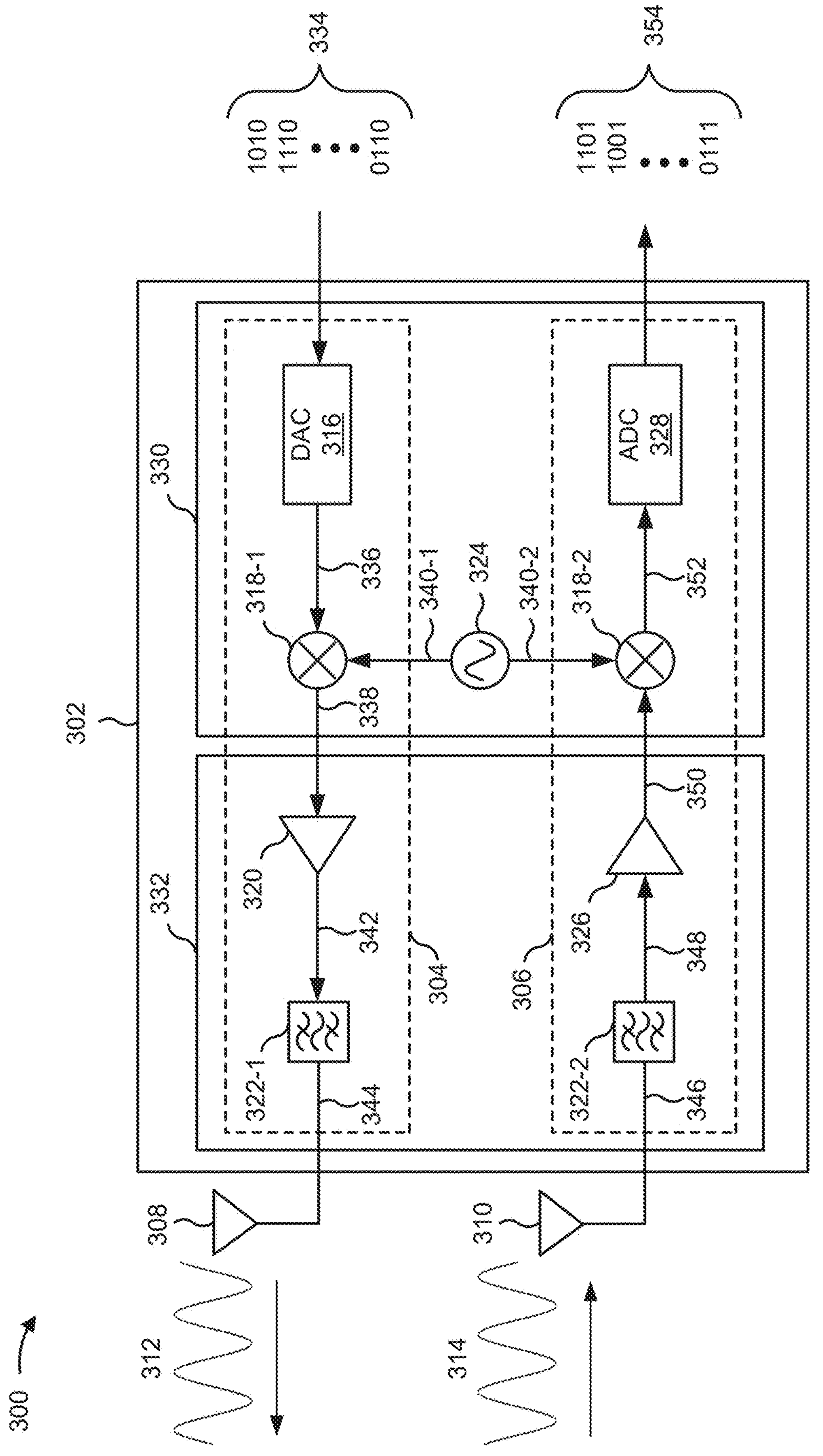
FIG. 3 is a diagram illustrating an example of a wireless transceiver that may be used by a device to communicate in a wireless network, in accordance with the present disclosure.

FIG. 3 is a diagram illustrating an example 300 of a wireless transceiver 302 that may be used by a device to communicate in a wireless network, in accordance with the present disclosure. In some aspects, the wireless transceiver 302 may include, or be included in, one or more components as described with regard to FIG. 2. To illustrate, one or more components of the wireless transceiver 302 may be coupled to, and/or included in, the modem 232 (e.g., one or more of the modems **232*a* through 232*t*) and or the modem 254 (e.g., one or more of the modems 254*a* through 254*r***).

A wireless transceiver 302 may include a transmitter 304 (shown with a dashed line) and/or a receiver 306 (shown with a dashed line). As shown by the example 300, the transmitter 304 may be coupled to at least a first antenna 308, and the receiver 306 may be coupled to at least a second antenna 310. However, in other examples, the transmitter 304 and the receiver 306 may be coupled to a same antenna through a switch and/or duplexer. In some aspects, the transmitter 304 may generate and transmit an outgoing RF signal 312, and the receiver 306 may receive and process an incoming RF signal 314.

As shown by the example 300, the transmitter 304 may include a digital-to-analog converter 316 (DAC 316), a first mixer 318-1, a first amplifier 320 (e.g., a power amplifier), and a first filter 322-1 (e.g., a surface-acoustic-wave (SAW) filter). The first mixer 318-1 may be coupled to a local oscillator (LO) 324. In some aspects, the DAC 316 may be coupled to an application processor or another processor associated with the wireless transceiver 302 (e.g., the modem 232 or the modem 254). Other examples of a transmitter may include multiple DACs, multiple mixers, multiple amplifiers, and/or multiple filters that are not shown by the example 300.

The receiver 306 may include a second filter 322-2 (e.g., a SAW filter), a second amplifier 326 (e.g., a low-noise amplifier), a second mixer 318-2, and an analog-to-digital converter 328 (ADC 328). The second mixer 318-2 may be coupled to the LO 324. Alternatively or additionally, the ADC 328 may be coupled to an application processor or another processor associated with the wireless transceiver 302 (e.g., the modem 232 or the modem 254). Other examples of a receiver may include multiple filters, multiple amplifiers, multiple mixers, and/or multiple ADCs that are not shown by the example 300.

In some aspects, the wireless transceiver 302 may be implemented using multiple circuits, such as multiple integrated circuits (ICs). To illustrate, the wireless transceiver 302 may include a transceiver circuit 330 and a radio-frequency front-end (RFFE) circuit 332. Accordingly, components used to form the transmitter 304 and the receiver 306 may be distributed across the multiple circuits. As one example, the transceiver circuit 330 and the RFFE circuit 332 may each include at least some components that form the transmitter 304 and/or at least some components that form the receiver 306. To illustrate, and with regard to the transmitter 304, the transceiver circuit 330 may include the DAC 316 and the first mixer 318-1 of the transmitter 304, and the RFFE circuit 332 may include the first amplifier 320 and the first filter 322-2 of the transmitter 304. Alternatively or additionally, and with regard to the receiver 306, the transceiver circuit 330 may include the second mixer 318-2 and the ADC 328 of the receiver 306, and the RFFE circuit 332 may include the second filter 322-2 and the second amplifier 326 of the receiver 306. In some aspects, the DAC 316 and/or the ADC 328 may be implemented on a circuit separate from the transceiver circuit 330, such as the modem 232 or the modem 254.

In some aspects, the transmitter 304 may generate the outgoing RF signal 312 based at least in part on one or more digital samples 334. A "digital sample", which may alternatively be referred to as a sample, may denote a representation of an analog signal, such as an amplitude representation of the analog signal at a point in time. Each sample of a set of samples that span a time duration may represent the analog signal at a different point in time within the time duration. To illustrate, a first sample may represent the signal at a first point in time, a second sample may represent the signal at a second, different point in time, up to an $n^{th}$ sample that may represent the signal at an $n^{th}$ point in time, where n is an integer and the points in time that span the time duration may be uniformly separated in time. In some aspects, a sample may capture an in-phase/quadrature (I/Q) signal. For example, a sample may include an in-phase component (I-component) value associated with the I/Q signal at the point in time and a quadrature component (Q-component) value at the point in time. A sample associated with an I/Q signal (e.g., that includes an I-component and a Q-component) may alternatively or additionally be referred to as a complex sample.

In some aspects, the DAC 316 may receive, as the digital sample(s) 334, one or more samples associated with a pre-upconversion signal (e.g., a baseband signal or an intermediate frequency (IF) signal). In some aspects, the DAC 316 may receive one or more samples that include DPD as further described with regard to FIG. 5. To illustrate, the DAC 316 may receive one or more samples from a multi-dimensional DPD apparatus as further described with regard to FIG. 8. Using the digital sample(s) 334, the DAC 316 may generate, as an output, an analog pre-upconversion signal 336.

The first mixer 318-1 may receive the analog pre-upconversion signal 336 as input, and generate, as an output, a prefiltered upconverted signal 338 using an LO signal 340-1 provided by the LO 324. The prefiltered upconverted signal 338 may be an RF signal and/or may include some noise and/or unwanted frequencies, such as a harmonic frequency. The first amplifier 320 may receive the prefiltered upconverted signal 338 and generate an amplified prefiltered signal 342.

The first filter 322-2 may receive the amplified prefiltered signal 342 as input and filter the amplified pre-filter transmit signal 342 to generate a filtered transmit signal 344. As part of the filtering process, the first filter 322-2 may attenuate the noise or unwanted frequencies included in the prefiltered upconverted signal 338 and/or the amplified prefiltered signal 342. The transmitter 304 may provide the filtered transmit signal 344 to the first antenna 308 for transmission as the outgoing RF signal 312.

In some aspects, the receiver 306 may receive the incoming RF signal 314 using the second antenna 310. As shown by the example 300, the second antenna 310 may generate a prefiltered receive signal 346. The second antenna 310 may be coupled to the second filter 322-2 such that the second filter 322-2 receives and filters the prefiltered receive signal 346 to remove noise and/or unwanted frequencies. Accordingly, the second filter 322-2 may generate a filtered receive signal 348.

The second amplifier 326 may receive and amplify the filtered receive signal 348 to generate an amplified filtered receive signal 350. Based at least in part on being coupled to the second amplifier 326, the second mixer 318-2 may receive the amplified filtered receive signal 350 and downconvert the amplified filtered receive signal 350 using a LO signal 340-2 (e.g., from the LO 324) to generate a downconverted receive signal 352, which may be a baseband signal or an IF signal. The ADC 328 may receive the downconverted receive signal 352 and generate a digital signal by generating one or more digital samples 354 as output. The one or more digital samples 354 may be processed by a processor associated with the wireless transceiver 302 and/or another processor, such as a processor associated with the modem 232 or the modem 254.

As indicated above, FIG. 3 is provided as an example. Other examples may differ from what is described with regard to FIG. 3. As one example, the wireless transceiver 302 may include one or more feedback mechanisms, such as a feedback path (e.g., a feedback receiver) that provides feedback associated with an output from the first amplifier 320 to a DPD apparatus (e.g., a multi-dimensional DPD apparatus as further described with regard to FIG. 8).

Figure 4:
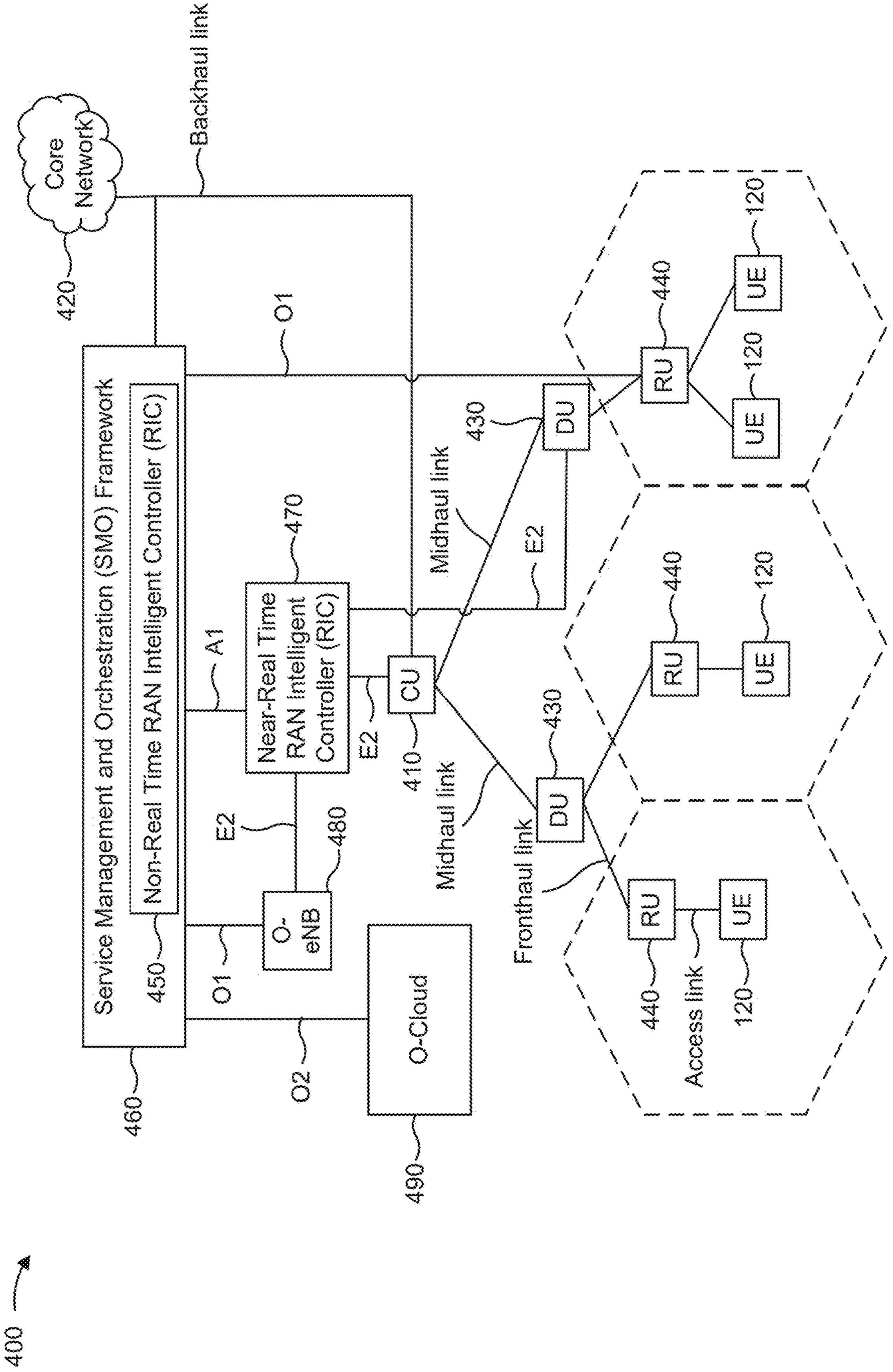
FIG. 4 is a diagram illustrating an example disaggregated base station architecture, in accordance with the present disclosure.

FIG. 4 is a diagram illustrating an example disaggregated base station architecture 400 in accordance with the present disclosure. One or more components of the example disaggregated base station architecture 400 may be, may include, or may be included in one or more network nodes (such one or more network nodes 110). The disaggregated base station architecture 400 may include a CU 410 that can communicate directly with a core network 420 via a backhaul link, or that can communicate indirectly with the core network 420 via one or more disaggregated control units, such as a Non-RT RIC 450 associated with a Service Management and Orchestration (SMO) Framework 460 and/or a Near-RT RIC 470 (for example, via an E2 link). The CU 410 may communicate with one or more DUs 430 via respective midhaul links, such as via F1 interfaces. Each of the DUs 430 may communicate with one or more RUs 440 via respective fronthaul links. Each of the RUs 440 may communicate with one or more UEs 120 via respective RF access links. In some deployments, a UE 120 may be simultaneously served by multiple RUs 440.

Each of the components of the disaggregated base station architecture 400, including the CUs 410, the DUs 430, the RUs 440, the Near-RT RICs 470, the Non-RT RICs 450, and the SMO Framework 460, may include one or more interfaces or may be coupled with one or more interfaces for receiving or transmitting signals, such as data or information, via a wired or wireless transmission medium.

In some aspects, the CU 410 may be logically split into one or more CU user plane (CU-UP) units and one or more CU control plane (CU-CP) units. A CU-UP unit may communicate bidirectionally with a CU-CP unit via an interface, such as the E1 interface when implemented in an O-RAN configuration. The CU 410 may be deployed to communicate with one or more DUs 430, as necessary, for network control and signaling. Each DU 430 may correspond to a logical unit that includes one or more base station functions to control the operation of one or more RUs 440. For example, a DU 430 may host various layers, such as an RLC layer, a MAC layer, or one or more PHY layers, such as one or more high PHY layers or one or more low PHY layers. Each layer (which also may be referred to as a module) may be implemented with an interface for communicating signals with other layers (and modules) hosted by the DU 430, or for communicating signals with the control functions hosted by the CU 410. Each RU 440 may implement lower layer functionality. In some aspects, real-time and non-real-time aspects of control and user plane communication with the RU(s) 340 may be controlled by the corresponding DU 430.

The SMO Framework 460 may support RAN deployment and provisioning of non-virtualized and virtualized network elements. For non-virtualized network elements, the SMO Framework 460 may support the deployment of dedicated physical resources for RAN coverage requirements, which may be managed via an operations and maintenance interface, such as an O1 interface. For virtualized network elements, the SMO Framework 460 may interact with a cloud computing platform (such as an open cloud (O-Cloud) platform 490) to perform network element life cycle management (such as to instantiate virtualized network elements) via a cloud computing platform interface, such as an O2 interface. A virtualized network element may include, but is not limited to, a CU 410, a DU 430, an RU 440, a non-RT RIC 450, and/or a Near-RT RIC 470. In some aspects, the SMO Framework 460 may communicate with a hardware aspect of a 4G RAN, a 5G NR RAN, and/or a 6G RAN, such as an open eNB (O-eNB) 480, via an O1 interface. Additionally or alternatively, the SMO Framework 460 may communicate directly with each of one or more RUs 440 via a respective O1 interface. In some deployments, this configuration can enable each DU 430 and the CU 410 to be implemented in a cloud-based RAN architecture, such as a vRAN architecture.

The Non-RT RIC 450 may include or may implement a logical function that enables non-real-time control and optimization of RAN elements and resources, AI/ML workflows including model training and updates, and/or policy-based guidance of applications and/or features in the Near-RT RIC 470. The Non-RT RIC 450 may be coupled to or may communicate with (such as via an A1 interface) the Near-RT RIC 470. The Near-RT RIC 470 may include or may implement a logical function that enables near-real-time control and optimization of RAN elements and resources via data collection and actions via an interface (such as via an E2 interface) connecting one or more CUs 410, one or more DUs 430, and/or an O-eNB with the Near-RT RIC 470.

In some aspects, to generate AI/ML models to be deployed in the Near-RT RIC 470, the Non-RT RIC 450 may receive parameters or external enrichment information from external servers. Such information may be utilized by the Near-RT RIC 470 and may be received at the SMO Framework 460 or the Non-RT RIC 450 from non-network data sources or from network functions. In some examples, the Non-RT RIC 450 or the Near-RT RIC 470 may tune RAN behavior or performance. For example, the Non-RT RIC 450 may monitor long-term trends and patterns for performance and may employ AI/ML models to perform corrective actions via the SMO Framework 460 (such as reconfiguration via an O1 interface) or via creation of RAN management policies (such as A1 interface policies).

As indicated above, FIG. 4 is provided as an example. Other examples may differ from what is described with regard to FIG. 4.

The network node 110, the controller/processor 240 of the network node 110, the UE 120, the controller/processor 280 of the UE 120, the CU 410, the DU 430, the RU 440, or any other component(s) of FIG. 1, 2, 3, or 4 may implement one or more techniques or perform one or more operations associated with multi-band DPD, as described in more detail elsewhere herein. For example, the controller/processor 240 of the network node 110, the controller/processor 280 of the UE 120, any other component(s) of FIG. 2, the CU 410, the DU 430, or the RU 440 may perform or direct operations of, for example, process 1200 of FIGS. 10A and 10B, or other processes as described herein (alone or in conjunction with one or more other processors). The memory 242 may store data and program codes for the network node 110, the network node 110, the CU 410, the DU 430, or the RU 440. The memory 282 may store data and program codes for the UE 120. In some examples, the memory 242 or the memory 282 may include a non-transitory computer-readable medium storing a set of instructions (for example, code or program code) for wireless communication. The memory 242 may include one or more memories, such as a single memory or multiple different memories (of the same type or of different types). The memory 282 may include one or more memories, such as a single memory or multiple different memories (of the same type or of different types). For example, the set of instructions, when executed (for example, directly, or after compiling, converting, or interpreting) by one or more processors of the network node 110, the UE 120, the CU 410, the DU 430, or the RU 440, may cause the one or more processors to perform process 1200 of FIGS. 10A and 10B, or other processes as described herein. In some examples, executing instructions may include running the instructions, converting the instructions, compiling the instructions, and/or interpreting the instructions, among other examples.

In some aspects, an apparatus (e.g., an apparatus 800) includes means for receiving an indication of a selected multi-band DPD kernel that comprises a DPD kernel set; means for storing a first input envelope value as one of a first plurality of envelope values associated with a first plurality of samples of a first sub-band of a wideband signal that span a time duration; means for storing a second input envelope value as one of a second plurality of envelope values associated with a second plurality of samples of a second sub-band of the wideband signal that span the time duration; means for storing multiple computational values that comprise at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration; means for selecting a subset of envelope values from at least one of the first plurality of envelope values or the second plurality of envelope values based at least in part on the selected multi-band DPD kernel; means for generating an envelope computation value using the subset of envelope values, one or more look-up-tables (LUTs), and the selected multi-band DPD kernel; means for selecting, based at least in part on the selected multi-band DPD kernel, one or more subsets of computational values from the multiple computational values; and/or means for generating a DPD-processed output sample based at least in part on combining the envelope computation value with the one or more subsets of computational values. In some aspects, the means for the apparatus to perform operations described herein may include, for example, one or more of an input mechanism 802 and/or an input mechanism 804, computation logic 806, an envelope delay line component 812-1 and/or an envelope delay line component 812-2, an envelope selection component 814, one or more LUT components 816, an LUT selection component 818, one or more computation delay line component(s) 820, one or more computation selection components 822 and/or one or more computation selection components 824, one or more combiner components 826 and/or one or more combiner components 828, a value selection component 830, and/or an adder component 832.

As indicated above, FIG. 4 is provided as an example. Other examples may differ from what is described with regard to FIG. 4.

Figure 5:
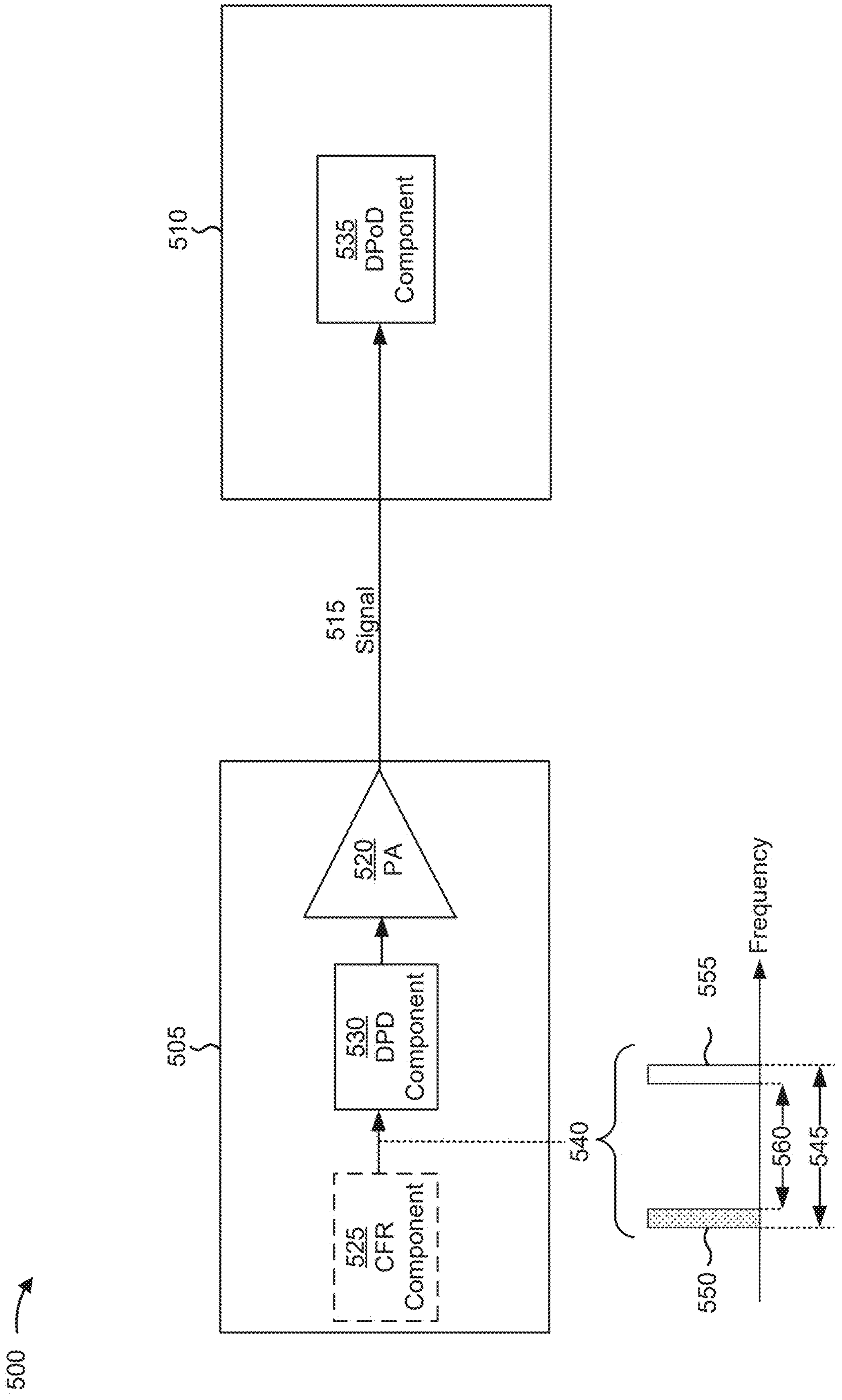
FIG. 5 is a diagram illustrating an example that includes a transmitter that may include digital pre-distortion (DPD) capabilities, and a receiver that may include digital post-distortion capabilities, in accordance with the present disclosure.

FIG. 5 is a diagram illustrating an example 500 that includes a transmitter 505 that may include DPD capabilities, and a receiver 510 that may include digital post-distortion (DPOD) capabilities, in accordance with the present disclosure. As shown in FIG. 5, the transmitter 505 may communicate with the receiver 510 using a wireless signal 515. In some aspects, a network node 110 (e.g., any network node described with regard to the disaggregated base station architecture 400) may include the transmitter 505 and UE 120 may include the receiver 510. Alternatively, or additionally, the UE 120 may include the transmitter 505 and the network node 110 may include the receiver 510. The block diagrams associated with the transmitter 505 and with the receiver 510 shown by the example 500 have been simplified for discussion purposes. Other examples may include alternative or additional features that have been omitted for clarity. For example, the transmitter 505 may include one or more components of the transmitter 304 described with regard to FIG. 3. Alternatively, or additionally, the transmitter 304 may include one or more components of the transmitter 505. As another example, the receiver 510 may include one or more components of the receiver 306 described with regard to FIG. 3 (or vice versa).

As shown by the example 500, the transmitter 505 may communicate with the receiver 510 based at least in part on transmitting the signal 515 to the receiver 510. The signal 515 may be pre-processed by the transmitter 505 to, among other benefits, reduce a power-back off value associated with transmission of the signal 515 to the receiver 510.

To illustrate, in some communications systems, the transmitter 505 may transmit signals with increasing nonlinearity based at least in part on power increases. For example, the transmitter 505 may include a power amplifier (PA) 520 (which, in some aspects, may be a high-power amplifier) with a limited dynamic range that may distort a transmitted signal as a result of a relatively high peak to average power ratio (PAPR). In some aspects, the PA 520 may be considered the first amplifier 320 as described with regard to FIG. 3. The nonlinear distortion may be an in-band distortion, which affects link performance in connection with mutual information and/or an error vector magnitude (EVM) amount, or an out-band distortion, which causes adjacent channel interference (ACI) and/or results in a high adjacent channel leakage ratio (ACLR) (e.g., the transmitted signal interferes with other signals on neighboring frequency bands, with the ACI and/or ACLR indicating how much the adjacent channel is polluted by a main transmission). To avoid nonlinearity distortions and accompanying interference, the transmitter 505 may apply a power back-off value to reduce transmit power, thereby reducing nonlinearity.

In some aspects, applying a power back-off value may result in reduced power efficiency (e.g., less available transmit power is used to transmit in a channel, thereby reducing range, signal to interference noise ratio, and/or the like). To illustrate, based at least in part on applying the power back-off value, the transmitter 505 may transmit the signal 515 with less power in channel and may dissipate more power as heat, which may result in reduced power efficiency. Accordingly, the transmitter 505 may use one or more pre-transmission signal processing techniques to reduce the power back-off value. For example, the transmitter may utilize crest factor reduction (CFR) processing and/or DPD processing. CFR processing may reduce the dynamic range of the signal, while DPD processing may reduce nonlinear distortion to less than a threshold level with a reduced level of power back-off, thereby increasing power efficiency relative to avoiding nonlinear distortion using only a power back-off. As shown in FIG. 5, the transmitter 505 may thus include a CFR component 525 for performing CFR processing to the signal 515 (e.g., pre-DPD signal conditioning to reduce PAPR in the signal 515 as much as possible and thus reduce the power back-off value). While the transmitter 505 shown by FIG. 5 includes the CFR component 525, other transmitter implementations may exclude the CFR component 525, further indicated through the use of a dashed line. Alternatively or additionally, the transmitter 505 may include a DPD component 530 for performing DPD processing to the signal 515 (e.g., to linearize the power amplifier's response). As one example, the DPD component 530 may perform DPD processing on a digital signal such that the digital sample(s) 334 of FIG. 3 have been modified to include DPD. To illustrate, the transmitter 304 as described with regard to FIG. 3 may include the DPD component 530 prior to the DAC 316.

However, CFR processing consumes additional resources (e.g., bandwidth resources, power resources, computational resources, or the like), and, in some cases, CFR processing may introduce in-band distortion (e.g., EVM distortion) and/or out-band distortion (e.g., ACI distortion). Moreover, although DPD processing may correct an in-dynamic-range nonlinearity effect, nonlinearity may still cause a clipping effect (e.g., resulting from the limited dynamic range). Thus, the effectiveness and/or power efficiency benefit of CFR processing and DPD processing are limited.

To account for limitations of CFR and/or DPD processing, the receiver 510 may apply DPOD processing to the signal 515. DPOD processing may be similar to DPD processing but is performed in the receiver 510 rather than in the transmitter 505, and may be directed to processing for only EVM instead of processing for both EVM and ACI. More particularly, DPOD processing may be performed by a DPOD component 535 at the receiver 510, which may include hardware and/or software configured to implement an algorithm configured to remove nonlinear noise that is generated by a known model (e.g., PA clipping). DPOD processing thus may allow for reduced power back-out values and greater power efficiency.

Different RATs may utilize different frequency bands and/or have different performance requirements. As one example, a first RAT may specify to use a first carrier frequency with a first bandwidth, that results in a wideband signal, and a second RAT may specify to use a second carrier frequency and a second bandwidth that results in a narrowband signal. "Wideband signal" may denote a wireless signal that has a bandwidth that satisfies a wideband threshold and/or as a bandwidth that is greater than 1% of the center frequency, and "narrowband signal" may denote a wireless signal that has a bandwidth that satisfies a narrowband threshold and/or has a bandwidth that is less than 1% of the center frequency. To illustrate, for a center frequency of 1 GHz, a first wireless signal with a bandwidth greater than 10 MHz (e.g., 1% of 1 GHZ) may be a wideband signal, and a second wireless signal with a bandwidth less than 10 MHz may be narrowband signal.

As shown by FIG. 5, the CFR component 525 may output a wideband signal 540 that is used as an input to the DPD component 530 in a digital form (e.g., a plurality of digital samples and/or a digital stream). The wideband signal 540 may occupy a broad spectrum that spans a bandwidth 545, such as a 600 MHz bandwidth. In some aspects, the wideband signal 540 may be classified as a sparse signal. "Sparse signal" may denote a signal that includes one or more spectral regions of concentrated power (e.g., a signal power level that satisfies a power presence threshold) that are separated by one or more spectral regions without power (e.g., a signal power level that fails to satisfy the power presence threshold). To illustrate, the wideband signal 540 shown by FIG. 5 includes a first narrowband signal 550

(shown with a dotted pattern) that is located at a first spectral region of the wideband signal 540 and a second narrowband signal 555 (shown in solid white) that is located at a second spectral region of the wideband signal 540, where the first narrowband signal 550 and the second narrowband signal 555 have a respective signal power level that satisfies a power presence threshold. The first narrowband signal 550 and the second narrowband signal 555 may be separated by third spectral region 560 that spans portion of the bandwidth 545 (e.g., 500 MHz), and the third spectral region 560 may not include signal power. That is, a signal power level within the third spectral region 560 fails to satisfy the power presence threshold. Accordingly, the wideband signal 540 may be a sparse signal. Some wireless technologies, such as 5G and/or 6G, may use sparse signaling more often than not for a variety of reasons, such as to mitigate interference, enhance security, increase spectral efficiency, and/or increase energy efficiency.

In some aspects, the DPD component 530 may process digital samples and/or a digital stream that are generated with a sampling rate of four times (4×) a bandwidth of the signal being digitized. For example, the DPD component 530 may be configured to process the wideband signal 540 using digital samples that are sampled at a rate of 4× the 600 MHz bandwidth, resulting in a plurality of samples and/or a digital stream that is based at least in part on a sampling rate of 2.4 GHz. Using a 4× sampling rate to digitize a sparse wideband signal may result in a number digital samples and/or a size of a digital stream that leads to a transmitter (e.g., the transmitter 304 and/or the transmitter 505) and/or a DPD (e.g., the DPD component 530) consuming a disproportionate amount of power to process the digital samples. To illustrate, a transceiver in a network node (e.g., a base station, a DU, an RU, and/or a CU) may use approximately 75% of a power budget that is allocated to a modem and/or signal processing (e.g., digital signal processing and/or RF signal processing), and a DPD in the transceiver (e.g., the DPD component 530) may consume approximately 75% of the power consumed by the transceiver. Power consumption at the network node may increase as a number of transceivers at the network node increases. For instance, a 5G antenna array may use 4-8 transceivers, and a 6G antenna array may use 4× the number of transceivers used by a 5G antenna array. An increase in power consumption by a network node may result in a need for increased heat dissipation and/or cooling provisions for hardware at the network node, may increase an amount of usage stress on the hardware that leads in a shorter lifespan of the hardware, may reduce a sustainability in operating the network node that may result in an inability to meet regulatory energy consumption operating conditions, and/or may increase an operating cost associated with the network node.

Some techniques and apparatuses described herein provide a multi-dimensional DPD and/or multi-band DPD. More particularly, some aspects describe an apparatus that includes a multi-dimensional DPD and is configured to process a wireless signal (e.g., sparse wideband signal) that is sampled at a first sampling rate based at least in part on separating the wireless signal into multiple partitions and processing each partition using second sampling rate that is lower than the first sampling rate. In some aspects, an apparatus may include a first input mechanism configured to receive an indication of a selected multi-band DPD kernel that comprises a DPD kernel set. The apparatus may include an envelope delay line component comprising: a first envelope storage segmentation configured to store a first input envelope value as one of a first plurality of envelope values associated with a first plurality of samples that span a time duration; and a second envelope storage segmentation configured to store a second input envelope value as one of a second plurality of envelope values associated with a second plurality of samples that span the time duration. In some aspects, the apparatus may include an envelope selection component configured to select a subset of envelope values from at least one of the first plurality of envelope values or the second plurality of envelope values based at least in part on the selected multi-band DPD kernel. The apparatus may include one or more LUT components coupled to the envelope selection component configured to: receive the subset of envelope values, and output an envelope computation value that is based at least in part on the subset of envelope values and the selected multi-band DPD kernel. The apparatus may include a computation delay line component comprising one or more computation storage components configured to store, as multiple computational values, at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the first plurality of samples that span the time duration, or the second plurality of samples that span the time duration. The apparatus may include one or more computation selection components coupled to the computation delay line component and configured to select, based at least in part on the selected multi-band DPD kernel, one or more subsets of computational values from the multiple computational values stored by the computation storage component. Alternatively, or additionally, the apparatus may include one or more combiner components coupled to the one or more computation selection components and the one or more LUT components, the one or more combiner components configured to generate a respective output that is based at least in part on combining the envelope computation value with the one or more subsets of computational values. In some aspects, the apparatus may include an adder component coupled the one or more combiner components and configured to generate a DPD-processed output sample based at least in part on combining the respective output from at least a subset of the one or more combiner components.

In some aspects, an apparatus may include a pre-digital predistortion (DPD) signal conditioning circuit that generates a pre-DPD conditioned output signal and a post-DPD signal conditioning circuit. The apparatus may include a splitter component that is configured to split the pre-DPD conditioned output signal received from the pre-DPD signal conditioning circuit into at least two splitter output signals, each splitter output signal of the at least two splitter output signals being a respective distinct sub-band of the pre-DPD conditioned output signal, the respective distinct sub-band being separated from other sub-bands in the pre-DPD conditioned output signal by a frequency gap. Alternatively, or additionally, the apparatus may include a DPD component configured to: operate in a first mode that causes the DPD component to: receive the at least two splitter output signals as at least a first input signal and a second input signal; and apply DPD to at least the first input signal and the second input signal to generate at least a first DPD-processed output signal and a second DPD-processed output signal; operate in a second mode that causes the DPD component to: receive the pre-DPD conditioned output signal as a third input signal in a manner that bypasses the split rotator component; and apply DPD to the third input signal to generate a third DPD-processed output signal; and switch between the first mode and the second mode. The apparatus may include a combiner component configured to: receive at least the first DPD-processed output signal and the second DPD-processed output signal; and output a combined DPD-processed output signal to the post-DPD conditioning circuit. In some aspects, the apparatus may include a routing mechanism configured to: receive the third DPD-processed output signal; and route the third DPD-processed output signal to the post-DPD conditioning circuit in a manner that bypasses the combiner component.

In some aspects, an apparatus may receive an indication of a selected multi-band DPD kernel that comprises a DPD kernel set. The apparatus may store a first input envelope value as one of a first plurality of envelope values associated with a first plurality of samples of a first sub-band of a wideband signal that span a time duration, and store a second input envelope value as one of a second plurality of envelope values associated with a second plurality of samples of a second sub-band of the wideband signal that span the time duration. In some aspects, the apparatus may store multiple computational values that include at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration. The apparatus may select a subset of envelope values from at least one of the first plurality of envelope values or the second plurality of envelope values based at least in part on the selected multi-band DPD kernel. The apparatus may generate an envelope computation value using the subset of envelope values, one or more LUTs, and the selected multi-band DPD kernel. The method may include selecting, based at least in part on the selected multi-band DPD kernel, one or more subsets of computational values from the multiple computational values. Alternatively, or additionally, the apparatus may generate a DPD-processed output sample based at least in part on combining the envelope computation value with the one or more subsets of computational values.

By partitioning a wireless signal that is sampled at a first sampling rate into multiple partitions that use a second, lower sampling rate, a network node may consume less power relative to processing the wireless signal at the first sampling rate. For example, and as described below, the network node may include a splitter component (e.g., a split rotator component) to separate a sparse wideband signal into multiple sub-bands, a multi-dimensional DPD to apply DPD to the wideband signal by processing the multiple sub-bands at the second, lower sampling rate, and/or a combiner component to combine the multiple sub-bands to generate a DPD-processed wideband signal at the first sampling rate. In some aspects, the multi-dimensional DPD may be implemented as an adaptable DPD that includes multiple DPD kernels that may be dynamically switched between the multiple DPD kernels to enable the multi-dimensional DPD apply DPD to a variety of signals using a single architecture. For example, the multi-dimensional DPD may use a first DPD kernel (e.g., a single DPD kernel and/or a set of DPD kernels) to apply DPD to a wideband signal and a second DPD kernel to apply DPD to sub-bands of a wideband signal using the same architecture. "DPD kernel" may denote a core processing algorithm that performs digital pre-distortion processing that is based at least in part on a DPD algorithm. Partitioning a wideband signal, such as a sparse wideband signal, into multiple sub-bands may reduce a sampling rate of digital samples and/or digital streams that represent the sub-bands, and may consequently reduce a number of samples processed by a DPD component. Reducing a number of samples processed by the DPD component may reduce energy consumption by the DPD component, may reduce energy consumption by a transceiver that includes the DPD component, and may reduce energy consumption by a network node that includes the transceiver. Reduced energy consumption by a network node may reduce a need for heat dissipation and/or cooling provisions for hardware at the network node, may reduce usage stress on the hardware and result in a longer lifespan of the hardware, may increase a sustainability in operating the network node that enables the network node to meet regulatory energy consumption operating conditions, and/or may decrease an operating cost associated with the network node.

As indicated above, FIG. 5 is provided as an example. Other examples may differ from what is described above.

Figure 6:
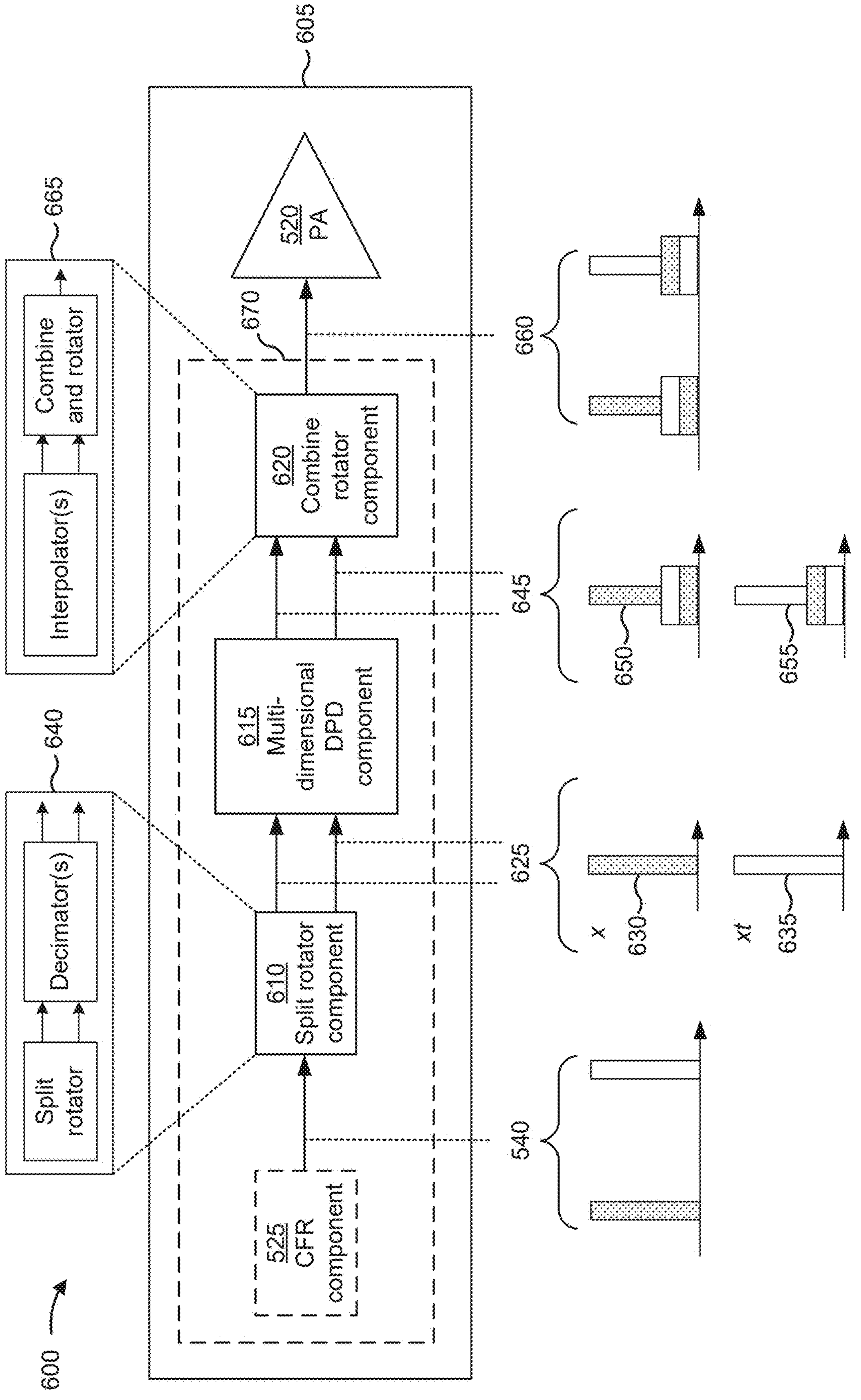
FIG. 6 is a diagram illustrating an example of a transmitter that may be configured to perform multi-band DPD processing on a wideband signal, in accordance with the present disclosure.

FIG. 6 is a diagram illustrating an example 600 of a transmitter 605 that may be configured to perform multi-band DPD processing on a wideband signal, in accordance with the present disclosure.

For clarity, the transmitter 605 shown by FIG. 6 includes the CFR component 525 and the PA 520 as described with regard to FIG. 5, a splitter component (shown as a split rotator component 610), a multi-dimensional DPD component 615 (shown as a two-dimensional (2D) DPD component), and a combiner component (shown as a combine rotator component 620). Other examples of a transmitter may include alternative or additional components, such as a carrier aggregation (CA) component that combines multiple carriers (e.g., narrowband signals) into a single wideband signal, a frequency-time correction (FTC) component that applies frequency-domain and/or time-domain corrections to a signal, and/or a DAC (e.g., the DAC 316). In some aspects, any combination of the CFR component 525, a CA component, and/or the FTC component may be referred to as pre-DPD signal conditioning components and/or pre-DPD signal conditioning circuitry. Alternatively, or additionally, the PA 520 may be referred to as post-DPD signal conditioning components and/or post-DPD signal conditioning circuitry. Other examples of pre-DPD signal conditioning circuitry and/or post-DPD signal conditioning components may include a baseband filter, a mixer, and/or circulator circuitry.

As shown by FIG. 6, the CFR component 525 may output the wideband signal 540 in digital form and at a first sampling rate (e.g., 4× a bandwidth of the wideband signal 540), and the wideband signal 540 may be a sparse wideband signal. The output of the CFR component 525 may be coupled to an input of one or more splitter components (e.g., a split rotator components 610) that splits an input signal (e.g., the wideband signal 540) into multiple partitions. In some aspects, the split rotator component 610 may apply a phase and/or frequency shift to one or more of the multiple partitions to synchronize and/or time align output partitions.

For instance, as shown by reference number 625, the split rotator component may split the wideband signal 540 into two partitions: a first sub-band 630 (shown with a dotted pattern) and a second sub-band 635 (shown in solid white). In some aspects, the first sub-band 630 may be a first component carrier of the wideband signal 540 and the second sub-band 635 may be a second component carrier of the wideband signal 540. That is, the split rotator component may split the wideband signal 540 into respective distinct sub-bands, and each distinct sub-band is a respective component carrier the wideband signal 540. Alternatively, or additionally, the third spectral region 560 that separates the component carriers as described with regard to FIG. 5 may be a bandwidth that is greater than 100 MHz. For simplicity, the example 600 shown by FIG. 6 includes a single split rotator component, but some examples may include multiple split rotator components, such as a first split rotator component configured to generate a first partition and/or a first plurality of samples from an input signal and a second split rotator component configured to generate a second partition and/or a second plurality of samples from the input signal. Further, while the example 600 includes a splitter component in the form of a split rotator component, other examples may include a splitter component that does not apply rotation to a signal (e.g., does not apply a phase and/or frequency shift).

In some aspects, the split rotator component 610 may output the first sub-band 630 as a first plurality of samples and the second sub-band 635 as a second plurality of samples. Each sample of the first plurality may be referred to as x ($x_n$ being a particular sample of the first sub-band at a time index of n) and each sample of the second plurality may be referred to as xt ($xt_n$ being a particular sample of the second sub-band at a time index of n). As shown by reference number 640, the split rotator component 610 may include, and/or may be coupled to, one or more decimator components that reduce a sampling rate of the first plurality of samples and the second plurality of samples, such as one or more 4-stage decimators that perform decimation in multiple stages. In some examples that include multiple split rotator components, each split rotator component may include and/or be coupled to a respective decimator component. Accordingly, some transmitters may include multiple split rotator components and/or multiple decimators components.

As shown by FIG. 6, the multi-dimensional DPD component 615 may receive the first sub-band 630 and the second sub-band 635 as inputs in the form of the first plurality of samples and the second plurality of samples that are generated using the split rotator component 610. As described above, a sampling rate of the first sub-band 630 and the second sub-band 635 may be lower relative to a sampling rate of the wideband signal 540, resulting in reduced computations by the multi-dimensional DPD component 615 and, consequently, reduced energy consumption by the multi-dimensional DPD component 615. The multi-dimensional DPD component 615 may apply DPD to each input (e.g., the first plurality of samples "x" and the second plurality of samples xt") using a multi-band DPD kernel as further described with regard to FIGS. 9, 10A, and 10B. In some aspects, the multi-band DPD kernel may be implemented using multiple DPD kernels (e.g., a DPD kernel set) that apply DPD to the wideband signal 540. The multi-band DPD kernel and/or the DPD kernel set may use computations that are based at least in part on various combinations of time delays, timing advances, and/or envelope values of one or more samples in the first plurality of samples and/or one or more samples in the second plurality of samples. To illustrate, the DPD applied by the multi-dimensional DPD component 615 may be based at least in part on computations that use cross-terms between the first sub-band 630 and the second sub-band 635 (e.g., a computation that uses a sample from the first sub-band 630 and a sample from the second sub-band 635). An example multi-dimensional DPD component is described in more detail with regard to FIG. 8, and example multi-band DPD kernels are described in more detail with regard to FIG. 9, FIG. 10A, and FIG. 10B.

To illustrate, and as shown by reference number 645, the multi-dimensional DPD component may output a first DPD-processed sub-band 650 that is based at least in part on the first sub-band 630 and the second sub-band 635 (shown by FIG. 6 through the use of dotted patterns and solid white patterns) and a second DPD-processed sub-band 655 that is based at least in part on the first sub-band 630 and the second sub-band 635 (shown by FIG. 6 through the use of dotted patterns and solid white patterns). The first DPD-processed sub-band 650 and the second DPD-processed sub-band 655 may be output by the multi-dimensional DPD component in a digital form.

As shown by FIG. 6, the multi-dimensional DPD component 615 may couple to the combine rotator component 620 such that the combine rotator component 620 receives the first DPD-processed sub-band 650 and the second DPD-processed sub-band 655 as inputs. In some aspects, the combine rotator component 620 may perform complementary functionality to the split rotator component 610. That is, the combine rotator component 620 may combine multiple sample sets and/or multiple partitions of a signal (e.g., the first DPD-processed sub-band 650 and the second DPD-processed sub-band 655) into a single output signal 660: a DPD-processed wideband signal that is based at least in part on the wideband signal 540. In combining the sample sets, the combine rotator component 620 may apply a phase and/or frequency shift to one or more input sample(s) to synchronize and/or time align the partitions. For simplicity, the example 600 shown by FIG. 6 includes a single combine rotator component, but some examples may include multiple combine rotator components, and each combine rotator component may be used to process respective sample sets and/or respective partitions of a signal. Further, while the example 600 includes a combiner component in the form of a combine rotator component, other examples may include a combiner component that does not apply rotation to a signal (e.g., does not apply a phase and/or frequency shift).

As shown by reference number 665, the combine rotator component 620 may include, and/or may be coupled to, one or more interpolator components that generate an up-sampled output digital signal (e.g., an interpolated DPD-processed output sample) that is a representation of an input signal (e.g., the first DPD-processed sub-band 650 and/or the second DPD-processed sub-band 655). That is, the output digital signal generated by an interpolator component has a higher sampling rate relative to the input signal. Alternatively, or additionally, the output digital signal generated by the combine rotator component 620, in combination with an interpolator component, may have a higher sampling rate relative to the input signal. To illustrate, the (output) DPD-processed wideband signal 660 may use a higher sampling rate relative to the first (input) DPD-processed sub-band 650 and the second (input) DPD-processed sub-band 655. For instance, the higher sampling rate of the DPD-processed wideband signal 660 may be the same sampling rate used by the wideband signal 540. Examples that include multiple combine rotator components may couple each combine rotator component to a respective interpolator component. Accordingly, some transmitters may include multiple combine rotator components and/or multiple interpolator components. Alternatively, or additionally, the multiple combine rotator components may be coupled to one another, such as through digital logic and/or digital components that combine the output of each respective combine rotator component (e.g., signal combiner logic).

In some aspects, and as shown by reference number 670, the CFR component 525, the split rotator component 610, the multi-dimensional DPD component 615, and the combine rotator component 620 may be co-resident on a single chip (e.g., an SoC and/or an IC). Other examples may include a single chip that includes different combinations of the CFR component 525, the split rotator component 610, the multi-dimensional DPD component 615, and/or the combine rotator component 620 on the chip than shown by FIG. 6.

By partitioning a wireless signal into multiple partitions and/or sub-bands, a DPD component at a network node may process fewer samples at a lower sampling rate, resulting in the DPD component (and the network node) consuming less power relative to processing the wireless signal at a higher sampling rate. For example, and as described herein, the network node may include a split rotator component that separates a sparse wideband signal at the higher sampling rate into multiple sub-bands at the lower sampling rate, a multi-dimensional DPD component that applies DPD to multiple sub-bands at the lower sampling rate, and/or a combiner component that combines the multiple sub-bands into a DPD-processed wideband signal. Reducing a number of samples processed by the DPD component may reduce energy consumption by the DPD component, by a transceiver that includes the DPD component, and a network node that includes the transceiver. Reduced energy consumption by a network node may reduce a need for heat dissipation and/or cooling provisions, may reduce stress on hardware at the network node resulting in a longer lifespan of the hardware, may increase a sustainability in operating the network node and/or an ability to meet regulatory energy consumption operating conditions, and/or may decrease an operating cost associated with the network node.

As indicated above, FIG. 6 is provided as an example. Other examples may differ from what is described with regard to FIG. 6.

Figure 7:
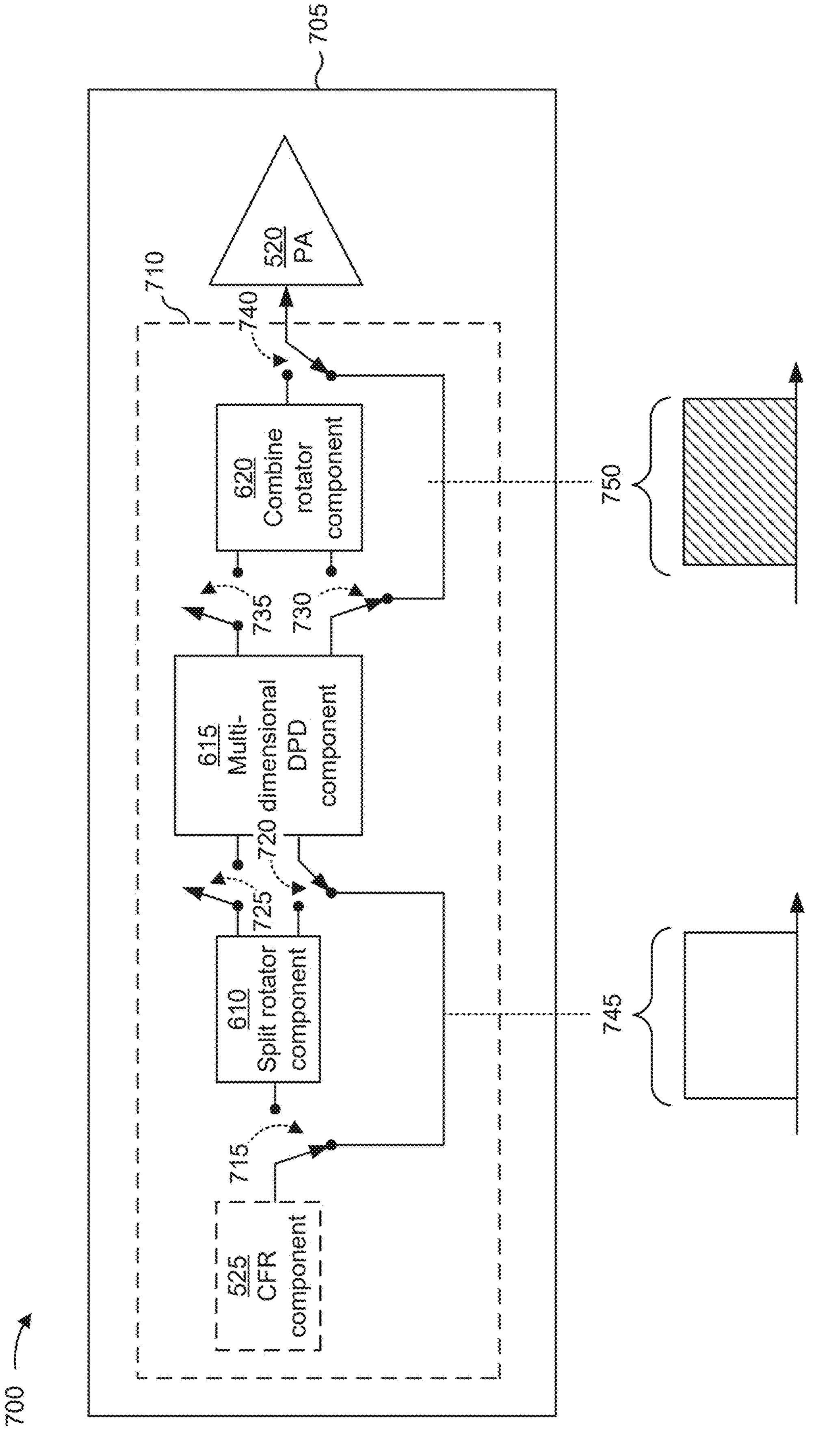
FIG. 7 is a diagram illustrating an example of a transmitter that may be configured to switch between performing multi-band DPD processing and wideband DPD processing using a same multi-dimensional DPD apparatus, in accordance with the present disclosure.

FIG. 7 is a diagram illustrating an example 700 of a transmitter 705 that may be configured to switch between performing multi-band DPD processing and wideband DPD processing using a same multi-dimensional DPD apparatus, in accordance with the present disclosure.

The transmitter 705 shown by FIG. 7 includes the CFR component 525, the PA 520, a splitter component (e.g., the split rotator component 610), the multi-dimensional DPD component 615, and a combiner component (e.g., the combine rotator component 620) described with regard to FIG. 5 and FIG. 6. In some aspects, and as shown by reference number 710, the CFR component 525, the split rotator component 610, the multi-dimensional DPD component 615, and the combine rotator component 620 are co-located in a single IC (e.g., a same SoC). However, other examples may include different combinations of the CFR component 525, the split rotator component 610, the multi-dimensional DPD component 615, and/or the combine rotator component 620 on a same IC. Other examples of a transmitter may include alternative or additional components, such as a CA component that combines multiple carriers (e.g., narrowband signals) into a single wideband signal, a frequency-time correction (FTC) component that applies frequency-domain and/or time-domain corrections to a signal, an interpolator (e.g., an up-sampler), and/or a DAC (e.g., the DAC 316).

As shown by FIG. 7, the transmitter 705 may include an ability to switch between processing a multi-band signal as described with regard to FIG. 6 and a wideband signal as described with regard to FIG. 5. To illustrate, the transmitter 705 may include a first switch 715 that may change the routing of an output of the CFR component 525. For instance, based at least in part on operating in a wideband DPD processing mode, the transmitter 705 may configure the first switch 715 in a first position and/or a first state (shown by FIG. 7) that decouples the output of the CFR component 525 from an input of the split rotator component 610 and/or causes a signal to bypass the split rotator component 610. Accordingly, the transmitter 705 may include, by way of the single IC described with regard to reference number 710, a routing mechanism that causes the output of the CFR component 525 to bypass the split rotator component 610. In some aspects, the first position and/or first state of the first switch 715 may couple the output of the CFR component 525 to a first input of the multi-dimensional DPD component 615. Alternatively, or additionally, and based at least in part on operating in a multi-band DPD processing mode, the transmitter 705 may configure the first switch 715 in a second position and/or a second state that couples the output of the CFR component 525 to an input of the split rotator component 610 and/or decouples the output of the CFR component 525 from a first input of the multi-dimensional DPD component. In some aspects, the first switch 715 and/or routing to couple the output of the CFR component 525 to the first signal input of the multi-dimensional DPD component 615 may be included in the single IC described with regard to reference number 710.

As shown by FIG. 7, the multi-dimensional DPD component 615 may include multiple inputs (shown by FIG. 7 as two inputs) to receive respective sample sets and/or streams. In some aspects, the transmitter 705 may include (e.g., by way of the single IC described with regard to reference number 710) a second switch 720 that, when configured in a first position and/or first state that is shown by FIG. 7, decouples a first output of the split rotator component 610 from a first input of the multi-dimensional DPD component 615 and/or couples the first input of the multi-dimensional DPD component 615 to the output of the CFR component 525. Accordingly, based at least in part on operating in a wideband DPD processing mode, the transmitter 705 may configure the second switch 720 in the first position and/or the first state signal input that causes a signal to bypass the split rotator component 610. Based at least in part on operating in a multi-band DPD processing mode, the transmitter 705 may configure second switch 720 in a second position and/or second state that couples the first input of the multi-dimensional DPD component 615 to an output of the split rotator component.

As show by FIG. 7, the transmitter 705 and/or the single IC described with regard to reference number 710 may include a third switch 725 that, when configured in a first position and/or first state that is shown by FIG. 7, decouples a second output of the split rotator component 610 from a second input of the multi-dimensional DPD component 615. Alternatively, or additionally, the third switch 725, when configured in a second position and/or second state, couples the second output of the split rotator component 610 to the second input of the multi-dimensional DPD component 615.

Accordingly, the transmitter 705 may dynamically switch an operating position and/or state of the third switch 725 based at least in part on switching between a wideband DPD processing mode and a multi-band DPD processing mode.

The multi-dimensional DPD component 615 may include multiple outputs (shown by FIG. 7 as two outputs), and the transmitter 705 may include (e.g., by way of the single IC described with regard to reference number 710) a fourth switch 730 that, when configured in a first position and/or first state that is shown by FIG. 7, decouples a first output of the multi-dimensional DPD component 615 from a first input to the combine rotator component 620 and/or to couple the first output of the multi-dimensional DPD component 615 to an input of the PA 520. Accordingly, the transmitter 705 may include, by way of the single IC described with regard to reference number 710, a routing mechanism that causes the output of the multi-dimensional DPD component 615 to bypass the combine rotator component 620. Accordingly, based at least in part on operating in a wideband DPD processing mode, the transmitter 705 may configure the fourth switch 730 in a first position and/or a first state. Based at least in part on operating in a multi-band DPD processing mode, the transmitter 705 may configure the fourth switch 730 in a second position and/or a second state that couples the first output input of the multi-dimensional DPD component 615 to the first input of the combine rotator component 620.

Alternatively, or additionally, and as show by FIG. 7, the transmitter 705 and/or the single IC described with regard to reference number 710 may include a fifth switch 735 that, when configured in a first position and/or first state that is shown by FIG. 7, decouples a second output of multi-dimensional DPD component 615 from a second input of the combine rotator component 620. Alternatively, or additionally, the fifth switch 735, when configured in a second position and/or second state, couples the second output of the multi-dimensional DPD component 615 to the second input of the combine rotator component 620. Accordingly, the transmitter 705 may dynamically switch an operating position and/or state of the fifth switch 735 based at least in part on switching between a wideband DPD processing mode and a multi-band DPD processing mode.

As shown by FIG. 7, the transmitter 705 may include (e.g., by way of the single IC described with regard to reference number 710) a sixth switch 740 that when configured in a first position and/or first state that is shown by FIG. 7, decouples an output of the combine rotator component 620 to an input of the PA 520. Alternatively, or additionally, the first position and/or first state of the sixth switch 740 may couple the input of the PA 520 to a first output of the multi-dimensional DPD component 615. Alternatively, or additionally, the sixth switch 740, when configured in a second position and/or second state, couples the output of the combine rotator component 620 to the PA 520 and/or decouples the output of the multi-dimensional DPD component 615 from the input of the PA 520. Accordingly, the transmitter 705 may dynamically switch an operating position and/or state of the sixth switch 740 based at least in part on switching between a wideband DPD processing mode and a multi-band DPD processing mode.

The example 700 shown by FIG. 7 illustrates various positions and/or states of the switches described above (e.g., the first switch 715, the second switch 720, the third switch 725, the fourth switch 730, the fifth switch 735, and the sixth switch 740) in positions and/or states that configure the transmitter 705 to process a wideband signal 745 (shown in solid white) to generate a DPD-processed wideband signal 750 (shown with a diagonal stripe pattern) using the multi-dimensional DPD component 615 to. As one example, the wideband signal 745 may be a single component carrier that spans a bandwidth greater than 100 MHz. In some aspects, the multi-dimensional DPD component 615 may switch between using a multi-band DPD kernel as described below to process a multi-band signal (e.g., the multi-band signal described with regard to reference number 625) and using a wideband DPD kernel to processing a wideband signal (e.g., the wideband signal 745).

The example 700 shown by FIG. 7 includes individual switches (e.g., the first switch 715, the second switch 720, the third switch 725, the fourth switch 730, the fifth switch 735, and the sixth switch 740) that are used to configure the different operational modes (e.g., a multi-band signal processing mode or a wideband signal processing mode) of the transmitter 705, such as by routing inputs and/or outputs to different components. However, the operation modes may be configured using alternate or additional mechanisms in other examples. For instance, some examples may include software control and/or logic circuitry to control and/or configure the operation modes, such as by using the software control and/or logic circuitry to configure and/or route particular inputs to the multi-dimensional DPD component 615, (e.g., an input originating from a splitter component and/or an input that bypasses the splitter component), to configure and/or route the outputs from the multi-dimensional DPD component 615 (e.g., an output that route to a combiner component or bypasses the combiner component), to determine whether multi-dimensional DPD component 615 receives a wideband signal input (e.g., a signal that is not partitioned into sub-bands) or a split signal input, and/or to configure a processing mode of multi-dimensional DPD component 615 (e.g., with a wideband DPD kernel and/or a multi-band DPD kernel).

The ability to switch between DPD kernels and/or change switch states that couple and/or decouple inputs and outputs between various components enables the multi-dimensional DPD component 615 to dynamically adapt operating modes (e.g., a multi-band signal processing mode or a wideband signal processing mode) and, consequently, a type of signal processed by the multi-dimensional DPD component 615. That is, the ability to switch enables reuse of a same multi-dimensional DPD component 615 for different applications and/or signals.

As indicated above, FIG. 7 is provided as an example. Other examples may differ from what is described with regard to FIG. 7.

Figure 8:
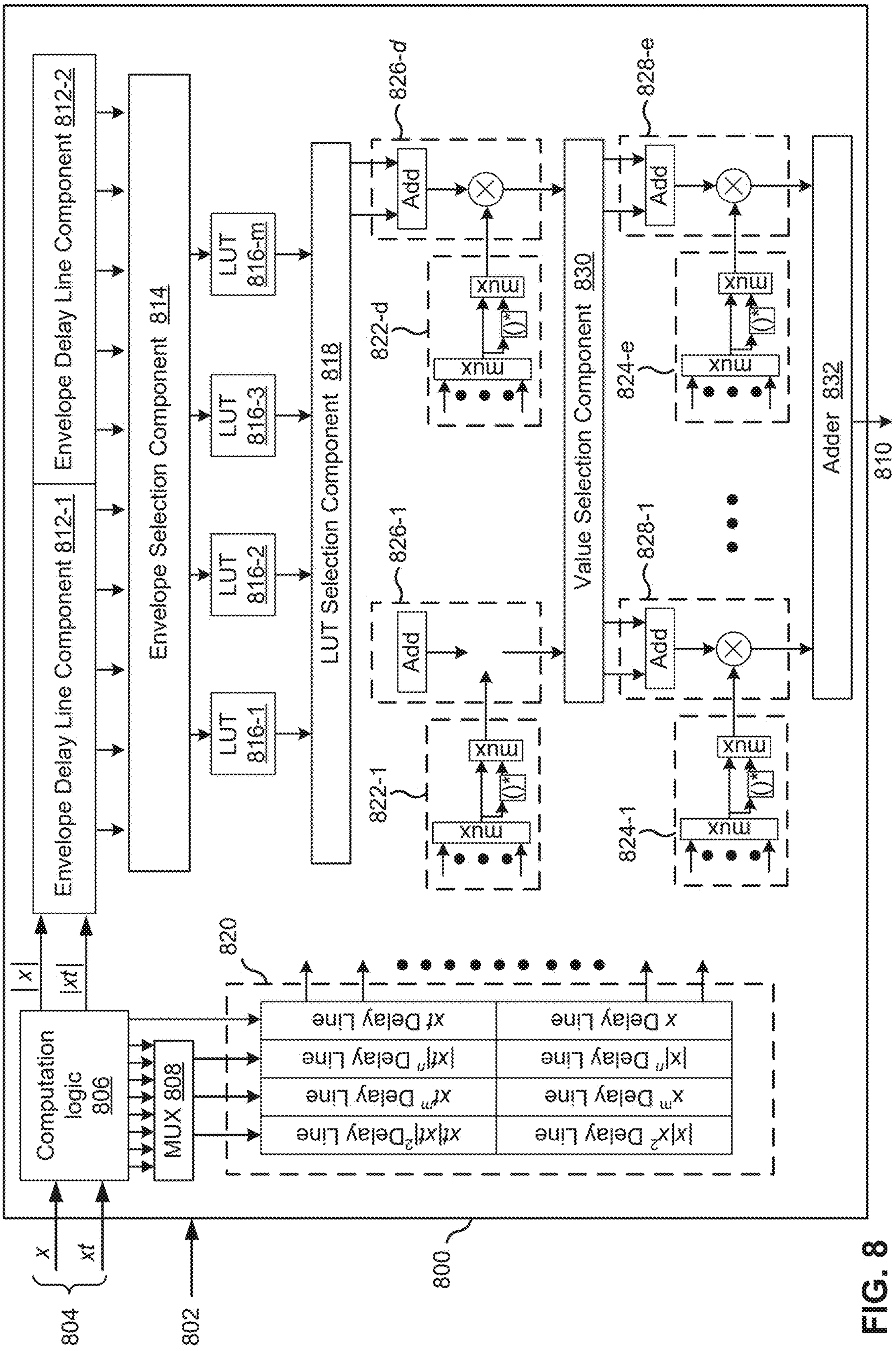
FIG. 8 is a diagram illustrating an example of a multi-dimensional DPD apparatus, in accordance with the present disclosure.

FIG. 8 is a diagram illustrating an example of a multi-dimensional DPD apparatus 800, in accordance with the present disclosure. In some aspects, the multi-dimensional DPD apparatus 800 may be implemented using one or more integrated circuits (ICs) and/or one or more System-on-Chips (SoCs) as further described below. The multi-dimensional DPD apparatus 800 may be included in (and/or coupled to) a wireless transceiver of a network node (e.g., the network node 110 described with regard to FIG. 1 and/or any network node described with regard to the disaggregated base station architecture 400) and/or a UE (e.g., the UE 120 as described with regard to FIG. 1).

As shown by FIG. 8, the multi-dimensional DPD apparatus 800 includes a first input mechanism 802 configured to receive an indication of a selected DPD kernel. As one example, the first input mechanism 802 may include one or more input lines connected to an input of an IC and/or SoC, such as a pin. In some aspects, the first input mechanism 802 may include a receive logic circuit (e.g., digital logic) and/or a clock to receive one or more bits serially and/or in parallel via the one or more input lines. Alternatively or additionally, the multi-dimensional DPD apparatus may include a mapping logic circuit that maps the one or more bits to an index value and/or an identifier (ID) associated with one of multiple DPD kernels supported and/or implemented by the multi-dimensional DPD apparatus 800. The first input mechanism 802 is coupled to one or more communication circuits included in the multi-dimensional DPD apparatus 800, where a communication circuit communicates and/or forwards an indication of the selected DPD kernel to one or more configurable components as further described below.

The multi-dimensional DPD apparatus 800 includes one or more second input mechanisms 804 that are shown in FIG. 8 as including two input mechanisms. Each input mechanism of the second input mechanism(s) 804 may be configured to receive one or more input samples (e.g., a digital sample) of a respective input signal and/or a respective input stream. For example, a first input mechanism of the second input mechanism(s) 804 may include one or more input lines that are used to receive a complex sample that is associated with a first I/Q signal (shown in FIG. 8 as "x"), and a second input mechanism of the second input mechanisms 804 may include one or more input lines that are used to receive a complex sample (shown in FIG. 8 as "xt") that is associated with a second I/Q signal. In some aspects, the second input mechanism(s) 804 may be coupled to computational logic 806 that may be implemented, at least in part, using digital logic, such as an adder circuit, a subtraction circuit, a multiplier circuit, and/or a division circuit. As one example, the second input mechanism(s) 804 may be coupled to first computation logic that generates an envelope value (e.g., an absolute value) based at least in part on a respective received sample (shown in FIG. 8 as "$|x|$" and "$|xt|$"), second computation logic that generates a cubed value based at least in part on a respective received sample (e.g. "$x^3$" and/or "$xt^3$"), third computation logic that generates a squared value based at least in part on a respective received sample (e.g., "$x^2$" and/or "$xt^2$"), and/or fourth computation logic that generates an absolute value squared value based at least in part on a respective received sample (e.g., "$|x|^2$" and/or "$|xt|^2$"). Some computation logic may be replicated and/or duplicated to enable parallel processing of a computation of a first input (e.g., "x") and a second input (e.g., "xt"). Other examples of computational circuits may include logic that generates a complex conjugate computation value, a complex conjugate squared computation value, an absolute value squared computation value, a complex conjugate cubed computation value, an absolute value squared multiplied by the sample computation value, and/or an absolute value squared multiplied by a complex conjugate value. In some aspects, the computational logic 806 may store values without performing a computation, such as a "1" value or a sample value. Alternative, or additional computations are described with regard to FIG. 9, FIG. 10A, and FIG. 10B. For example, the computation logic 806 may perform one or more computations that are part of a DPD kernel.

In some aspects, the multi-dimensional DPD apparatus 800 is configured to receive, by way of the first input mechanism 802, a computation indication that specifies one or more computational circuits to enable and/or disable, such as an indication to enable a complex conjugate computation circuit, an indication to disable an absolute value squared computation circuit, and/or an indication to enable a constant value (e.g., 1). Alternatively, or additionally, the multi-dimensional DPD apparatus 800 may include a computational multiplexer (MUX) 808 that selects one or more computational outputs from the computation logic 806, such as by selecting one or more computational outputs based at least in part on a selected DPD kernel indicated via the first input mechanism 802. For instance, the computation circuits in the computation logic 806 may output a plurality of different computational values, and, based at least in part on a selected DPD kernel, the MUX 808 may select a subset of the computational values to output. Accordingly, the computational values generated and/or stored by the multi-dimensional DPD apparatus 800 may be configurable by way of the first input mechanism 802, the computation logic 806, and/or the MUX 808. The MUX 808 may be coupled to the outputs of the computation logic 806 and/or the input mechanism 802.

As shown by FIG. 8, the multi-dimensional DPD apparatus 800 may include one or more output mechanisms 810 configured to output one or more modified samples (e.g., a DPD-processed sample, such as an input sample x modified with DPD and/or an input sample xt modified with DPD). As one example, the output mechanism 810 may include one or more output lines coupled to a clock and/or one or more output logic circuits to output the modified sample(s). To illustrate, the output mechanism 810 may output the modified sample(s) (e.g., a DPD-process sample that is represented by one or more bits) serially and/or in parallel via the one or more output lines. In some aspects, such as in a scenario that includes a single output mechanism 810 for outputting a modified sample, the multi-dimensional DPD apparatus 800 may output a single modified sample per clock cycle, and the multi-dimensional DPD apparatus 800 may alternate between outputting a modified x sample and a modified xt sample each clock cycle. In other aspects, such as in a scenario that includes multiple output mechanisms 810, the multi-dimensional DPD apparatus 800 may output a modified x sample and a modified xt sample (e.g., a DPD-processed x sample and a DPD-processed xt sample) in parallel each clock cycle and using a respective output mechanism.

In some aspects, the multi-dimensional DPD apparatus 800 includes one or more envelope delay line components, shown as envelope delay line component 812-1 and envelope delay line component 812-2, that are configured to store one or more envelope value, which may be referred to collectively as an envelope delay line component 812. The envelope delay line component 812-1 and envelope delay line component 812-2 may alternatively or additionally be referred to as an envelope delay line segmentation to indicate that the envelope delay line component 812-1 and envelope delay line component 812-2 may be included in a same envelope storage component as partitions of the envelope storage components or may be implemented in separate envelope storage components. While FIG. 8 illustrates two envelope delay line components, other examples may include more than two envelope delay line components and/or envelope delay line segmentation. Each envelope delay line component (e.g., the envelope delay line component 812-1 and the envelope delay line component 812-2) may include a respective envelope storage component that has a storage capacity associated with storing an input envelope value (e.g., $|x|$ and/or $|xt|$) as one of multiple envelope values that span a time duration. For instance, each envelope storage component may include memory or a shift register. In some aspects, each respective envelope storage component may be configured to store multiple envelope values associated with multiple samples of a same I/Q signal, where each envelope value may be associated with a respective sample of the I/Q signal at a respective point in time of the time duration. To illustrate, as each respective envelope delay line component receives a new input envelope value (e.g., |x| and/or |xt|), the respective envelope storage component may include one or more logic circuits (e.g., an AND gate, an OR gate, a NAND gate, a NOR gate, an exclusive OR gate, an exclusive NOR gate, a buffer gate, and/or an inverter) to remove an envelope value associated with an oldest point in time and replace the removed envelope value with the new input envelope value (e.g., a circular buffer). Alternatively, or additionally, each respective envelope storage component may include shifting logic that shifts the multiple envelope values one position such that a second oldest envelope value is shifted from a current position in memory into a new position in memory associated with the (removed) oldest envelope value.

The envelope delay line component 812-1 and the envelope delay line component 812-2 are coupled to one or more envelope selection components 814 that include selection logic configured to select a subset of envelope values from the multiple envelope values stored by the envelope delay line component 812-1 and/or the envelope delay line component 812-1. As one example, the envelope selection component(s) 814 may include one or more multiplexers that select a subset of envelope values based at least in part on the selected DPD kernel. In some aspects, the envelope selection component(s) 814 may be configured to select the subset of envelope values based at least in part on a timing advance and/or a timing delay relative to a computation time reference (e.g., a current sample being processed with DPD). Thus, the envelope selection component(s) 814 may be configured to select any envelope value from the envelope delay line component 812-1 and/or the envelope delay line component 812-1 and, subsequently, an envelope value with any timing advance and/or a timing delay (e.g., relative to the $n^{th}$ sample) stored within the envelope delay line component 812-1 and/or the envelope delay line component 812-1 at discrete times within the time duration.

In FIG. 8, the envelope selection component(s) 814 are coupled to one or more look up table (LUT) components, shown as LUT component 816-1, LUT component 816-2, LUT component 816-3, up to LUT component **816-*m*, where m represents an integer. Accordingly, while the multi-dimensional DPD apparatus 800 illustrates four LUT components, other examples may include more or fewer LUT components. Collectively, the LUT components may be referred to as the LUT components 816 (e.g., without a sub-designator). An LUT component may include one or more input mechanisms (e.g., one or more input lines), one or more storage components (e.g., memory), and one or more output mechanisms (e.g., one or more output lines). In some aspects, the LUT component may store, in the one or more storage components, multiple envelope computational values associated with a calculation result that is based at least in part on one or more envelope values, such as summation computations as described with regard to FIG. 9. FIG. 10A, and FIG. 10B. To illustrate, an LUT component may store a computation of a value associated with an approximation of a piece-wise linear envelope function as described with regard to FIG. 9, FIG. 10A, and FIG. 10**B. Alternatively, or additionally, the LUT component may store, in the one or more storage components, cross-reference information associated with each envelope computation value such that the LUT component may receive a subset of envelope values (e.g., via the input mechanism(s)) and identify an envelope computation value associated with the subset of envelope values. Alternatively or additionally, the cross-reference information may include an indication of a DPD kernel associated with the envelope computation value.

In the example of the multi-dimensional DPD apparatus 800, the LUT components 816 are coupled to an LUT selection component 818. The LUT selection component 818 receives m envelope computational values as input and outputs one or more envelope computational values based at least in part on a selected DPD kernel. As one example, the LUT selection component includes one or more crossbar (XBAR) multiplexers that select one or more envelope computational values based at least in part on the selected DPD kernel. Alternatively or additionally the XBAR multiplexer(s) route the selected envelope computational values to one or more inputs to a combiner component as further described below. The ability to select and route envelope computational values (e.g., by the LUT selection component 818) based at least in part on a selected DPD enables the multi-dimensional DPD apparatus 800 to dynamically change which envelope computation value(s) are input to a combiner component and, subsequently, a type of DPD kernel implemented by the multi-dimensional DPD apparatus.

In some aspects, the multi-dimensional DPD apparatus 800 includes one or more computation delay line components 820 that store multiple computational values. To illustrate, and in a similar manner as described with regard to the envelope delay line component 812-1 and the envelope delay line component 812-2, the computation delay line component(s) 820 may include one or more input mechanisms to receive one or more computational values (e.g., generated by a computational circuit), one or more computation storage components with storage capacity for storing multiple computational values, and one or more output mechanisms to output the one or more stored computational values.

As shown by FIG. 8, the computation delay line component(s) 820 may include multiple computation delay lines, such as a first computation delay line (shown as an $x|x|^2$ delay line) with storage to store multiple computational values associated with a first computation (e.g., $x^3$) applied to each sample of the multiple samples of a first input (e.g., x) and a second computation delay line (shown as an $xt|xt|^2$ delay line) with storage to store multiple values associated with a second computation (e.g., $x^2$) applied to each sample of the multiple samples of a second input (e.g., xt). The computation delay line component(s) 820 may alternatively or additionally include a third computation delay line (shown as an $x^m$ delay line) with storage to store multiple values associated with a third computation (e.g., $x^m$, m being an integer) applied to each sample of the multiple samples of the first input, a fourth computation delay line (shown as an $xt^m$ delay line) with storage to store multiple values associated with a fourth computation (e.g., $xt^m$) applied to each sample of the multiple samples of the second input, a fifth computation delay line (shown as an $|x|^n$ delay line) with storage to store multiple values associated with a fifth computation (e.g., $|x|^n$, n being an integer) applied to each sample of the multiple samples of the first input, a sixth computation delay line (shown as an $|xt|^n$ delay line) with storage to store multiple values associated with a fifth computation (e.g., $|xt|^n$) applied to each sample of the multiple samples of the second input, a seventh delay line (a samples delay line, which may be implemented as an IQ delay line) with storage to store the multiple samples of the first input, and/or an eighth delay line (a samples delay line, which may be implemented as an IQ delay line) with storage to store the multiple samples of the second input. While the multi-dimensional DPD apparatus 800 includes eight computation delay lines, other examples may include more or fewer computation delay lines. The computational values stored by the computation delay line component(s) 820 may be configurable based at least in part on the first input mechanism 802, the MUX 808, and/or selection of one or more computational circuits as further described above. Alternatively, the type of computational values (e.g., based at least in part on a computation type applied to a sample) stored by the computation delay line component(s) 820 may be fixed.

The computation delay line component(s) 820 are coupled to one or more computation selection components. To illustrate, and as shown by FIG. 8, the computation delay line component(s) 820 are coupled to a first set and/or layer of computation selection components, shown as a first computation selection component 822-1 up to a $d^{th}$ computation selection component **822-*d*, where d is an integer. The first set of computation selection components may be collectively referred to as the computation selection components 822 (e.g., without a sub-designator). The computation delay line components 820 are also coupled to a second set and/or layer of computation delay line components, shown as computation selection component 824-1 up to computation selection component 824-*e*, where e is an integer. The second set of computation selection components may be collectively referred to as the computation selection components 824 (e.g., without a sub-designator). The first set of computation selection component(s) 822 and/or the second set of computation selection component(s) 824 may be configured to select any computation value from any computation delay line component 820 and, subsequently, a computation value with any timing advance and/or a timing delay (e.g., relative to the $n^{th}$ sample) stored within the computation delay line component 820 at discrete times within the time duration. In some aspects, an additional MUX may couple the output of the computation delay line component(s) 820 to the inputs of the computation selection component(s) 822 and/or the computation selection components 824. The additional MUX may be configured to output a select set of outputs from the computation delay line component(s) 820** based at least in part on a selected DPD kernel.

In some aspects, each computation selection component may include one or more selection logic circuits configured to select one or more subsets of computational values stored by the computation storage component(s) of the computation delay line component(s) 820. To illustrate, each computation selection component may include one or more multiplexers that select the subset(s) of computational values based at least in part on the selected DPD kernel. As one example, each computation selection component may be coupled to the mapping logic circuit that receives the indication of the selected DPD kernel, where the computation selection component may configure one or more multiplexers to select subset(s) of computational values based at least in part on the selected DPD kernel.

For clarity, the computation selection component 822-1, the computation selection component **822-*d*, the computation selection component 824-1, and the computation selection component 824-*e* are shown as separate components in the multi-dimensional DPD apparatus 800. However, in alternate or additional examples, the computation selection component 822-1, the computation selection component 822-*d*, the computation selection component 824-1, and the computation selection component 824-*e* may be included in a same (single) component, such as a single multiplexer component and/or a delay line-multiplexer selection component as further described below, that is coupled to one or more of the computation delay line component(s) 820**.

As shown by FIG. 8, the multi-dimensional DPD apparatus 800 includes one or more combiner components that are coupled to one or more computation components. As one example, a first combiner component 826-1 is coupled to the first computation selection component 822-1 up to a $d^{th}$ combiner component **826-*d* that is coupled to the $d^{th}$ computation selection component 822-*d* (which are collectively referred to as the combiner components 826). The combiner components 826 are also coupled to the LUT selection component 818 such that each combiner component of the combiner components 826 receives at least a first input from the LUT selection component 818** and at least a second input from a respective computation selection component.

As also shown by FIG. 8, a first combiner component 828-1 up to an e-th combiner component **828-*e* are coupled to a respective computation selection (shown as the computation selection component 824-1 and the computation selection component 824-*e*, respectively) and a value selection component 830 (further described below) such that each combiner component 828 (e.g., the first combiner component 828-1 the e-th combiner component 828-*e*) receives at least a first input from the respective computation selection component and at least a second input from the value selection component 830. The first combiner component 828-1 up to the e-th combiner component 828-*e* may be collectively referred to as the combiner components 828**.

Each combiner component includes one or more logic circuits that are configured to generate an output based at least in part on combining one or more envelope computational values with the subset(s) of computational values. As an example, a combiner component may include a multiplier circuit that combines the values using at least a multiplication operation and/or an adder circuit that combines the values using at least a summation operation. To illustrate, an adder circuit of a combiner component (e.g., the combiner component 826-1) couples to an LUT selection component (e.g., the LUT selection component 818), and combines the (approximate) envelope computational values selected and routed by the LUT selection component. As another example, a multiplier circuit of the combiner component couples to one or more computation selection components (e.g., the computation selection component 822-1), and combines the subset(s) of computational values with the (added) envelope computational values.

The value selection component 830 includes logic circuitry that selects, based at least in part on the selected DPD kernel, one or more combined values generated by one or more combiner components (e.g., the combiner component(s) 826) and outputs the selected combined value(s). To illustrate, the value selection component 830 may include one or more multiplexers and/or one or more XBAR multiplexers that select (and/or route) the combined values based at least in part on the selected DPD kernel. The ability to select and route different combined values generated by a combiner component based at least in part on a selected DPD enables the multi-dimensional DPD apparatus 800 to dynamically change which combined value is input to a combiner component (e.g. the combiner component 828) and, subsequently, a type of DPD kernel implemented by the multi-dimensional DPD apparatus 800.

The multi-dimensional DPD apparatus 800 includes an adder component 832 that combines two or more outputs that are generated based at least in part on the combiner components 828. In some aspects, a selected DPD kernel may be based at least in part on a DPD kernel set, such as the DPD kernel sets described with regard to FIG. 9, FIG. 10A, and FIG. 10B, and each DPD kernel in a DPD kernel set may be implemented based at least in part on a respective computation path, such as a first computation path that is implemented based at least in part on the computation selection component 822-1, the computation selection component 824-1, the combiner component 826-1, and the combiner component 828-1 and/or a second computation path that is implemented based at least in part the computation selection component 822-*d*, the computation selection component 824-*d*, the combiner component 826-*d*, and the combiner component 828-*e*. The adder component 832 may combine the respective outputs of the respective DPD kernels in a DPD kernel set to generate a combined DPD-processed output sample that is based at least in part on the selected DPD kernel. For example, the combined DPD-processed output sample may be based at least in part on the adder component 832 combining the respective outputs of each output generated by a respective DPD kernel in a DPD kernel set. In some aspects, the selected DPD kernel may be a multi-band DPD kernel, while in other aspects, the selected DPD kernel may be a wideband DPD kernel.

In some aspects, the multi-dimensional DPD apparatus 800 may be implemented, at least in part, as an IC device and/or an SoC device. An IC device may include electronic circuits formed on a semiconductor substrate, such as silicon. Example types of IC devices include memory IC devices (e.g., dynamic random access memory devices or flash memory devices, among other examples), processing IC devices (e.g., microprocessors, digital signal processors, or microcontrollers, computation circuits, among other examples), transceiver IC devices (e.g., RF or mixed-signal transceivers, among other examples), or power amplifier IC devices (e.g., operation amplifier devices, among other examples). An SoC device (e.g., an SoC IC device) may include a combination of one or more types of IC devices.

Structures of an IC device (e.g., transistors, memory cells, logic gates, or interconnects, among other example) may be fabricated using semiconductor fabrication processes that include using deposition, photolithography, and etching techniques. Deposition techniques may form layers of dielectric or conductive materials on or over a semiconductor substrate, after which photolithography and etching techniques may form patterns of structures from the layers of dielectric or conductive materials (e.g., form the transistors, memory cells, logic gates, or interconnects).

As indicated above, FIG. 8 is provided as an example. Other examples may differ from what is described above.

Figure 9:
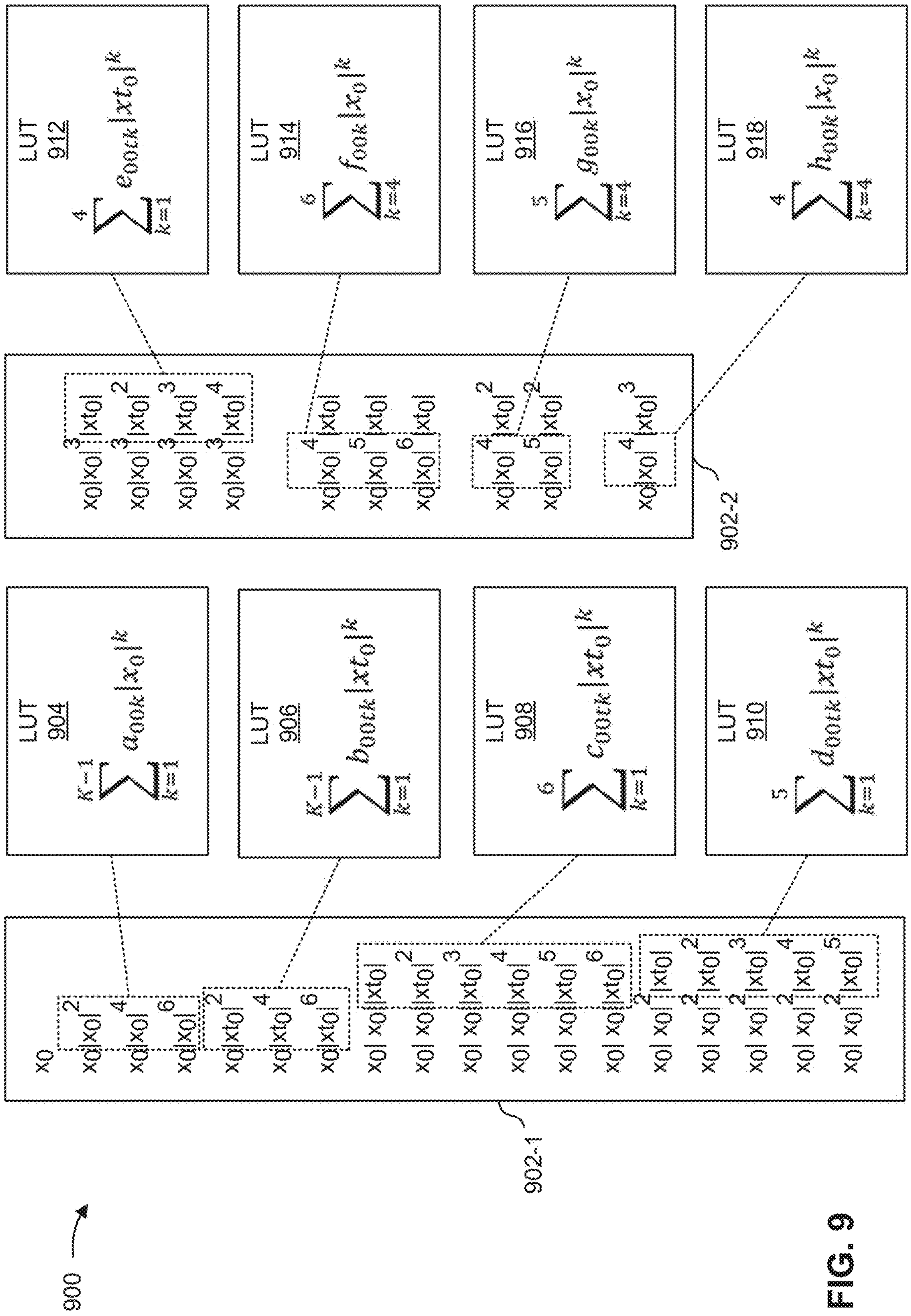
FIG. 9 is a diagram illustrating an example a DPD kernel set that may be used to implement a multi-band DPD kernel, in accordance with the present disclosure.
Figure 10A:
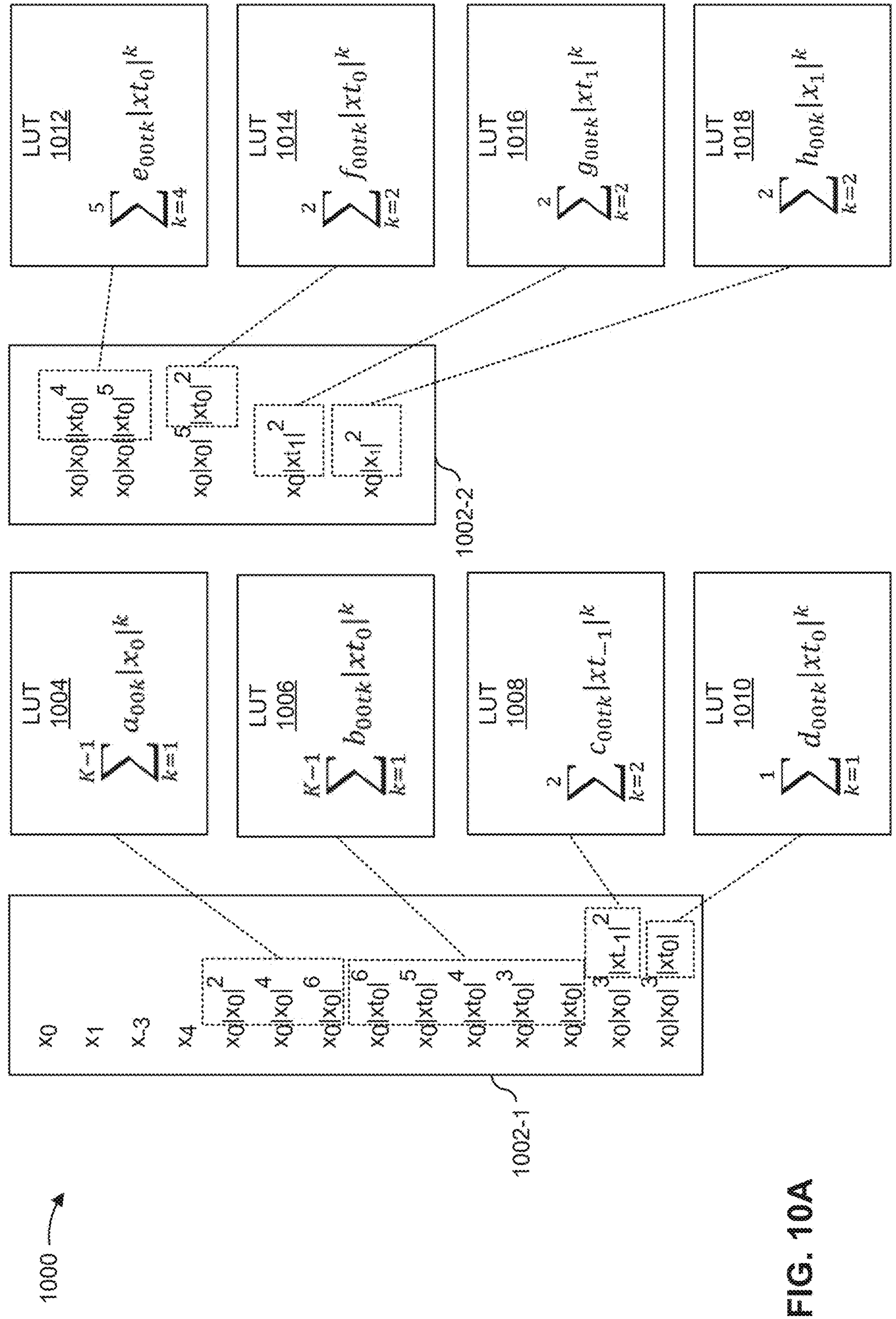
FIGS. 10A and 10B, collectively, illustrate a diagram of an example of a DPD kernel set that may be used to implement a multi-band DPD kernel, in accordance with the present disclosure.
Figure 10B:
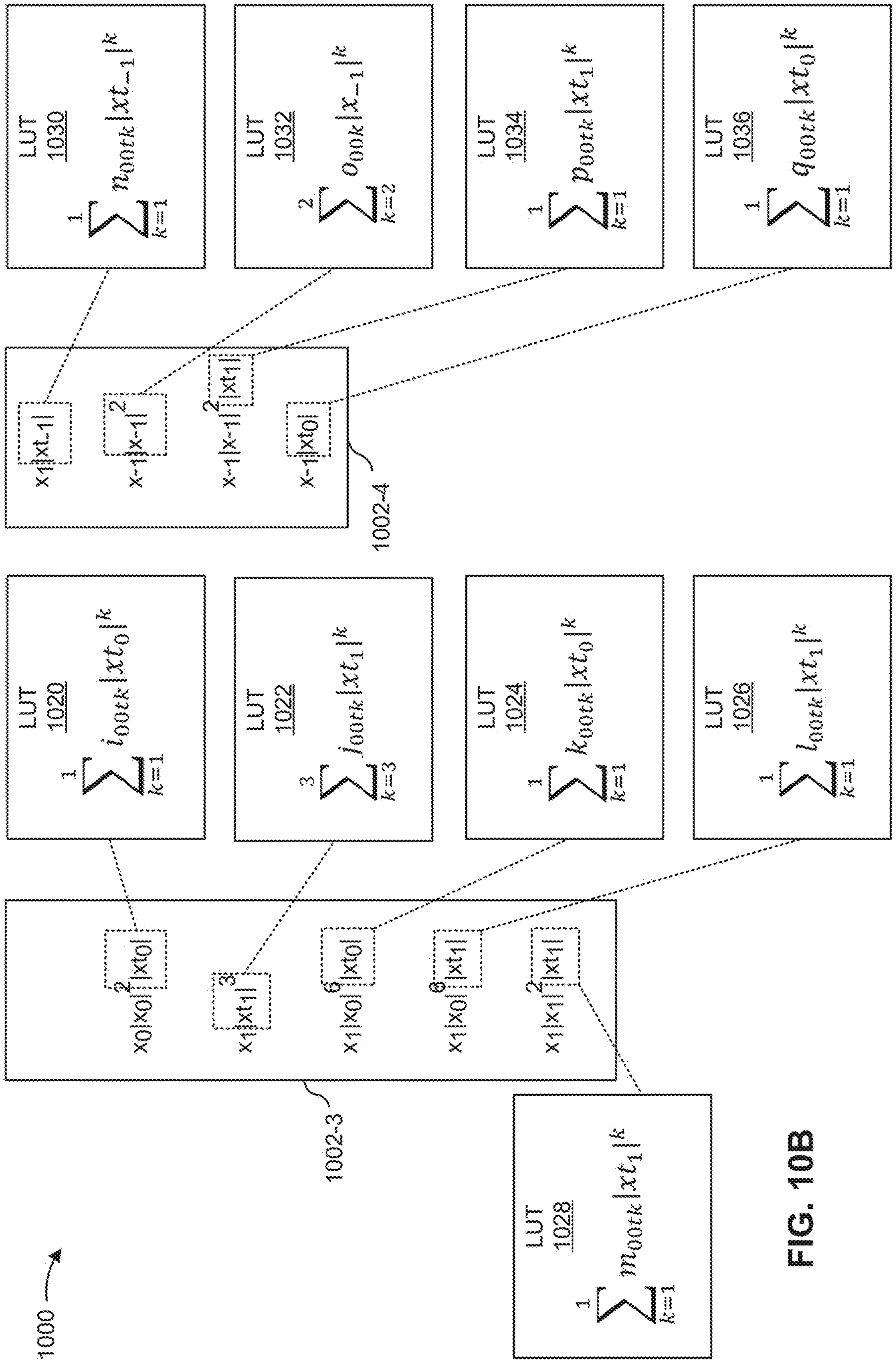

FIG. 9 is a diagram illustrating an example 900*a* DPD kernel set that may be used to implement a multi-band DPD kernel, in accordance with the present disclosure. In some aspects, the DPD kernel set may be implemented based at least in part on the multi-dimensional DPD apparatus 800 described with regard to FIG. 8.

In the example 900, a first table 902-1 and the second table 902-2 include a DPD kernel set that implements a multi-band DPD kernel that applies DPD to a wideband signal (e.g., a sparse wideband signal) based at least in part on processing multiple bands of the wideband signal as described with regard to reference number 625 of FIG. 6. Each computation in the first table 902-1 and the second table 902-2 may be referred to as a DPD kernel such that the group of computations in entirety make up the multi-band DPD kernel. To illustrate, the computation $x_0|x_0|^4$ in the first table 902-1 may be referred to as a first DPD kernel in the DPD kernel set that implements the multi-band DPD kernel and the computation $x_0|x_0|^4|xt_0|^2$ in the second table 902-2 may referred to as a second DPD kernel in the DPD kernel set that implements the multi-band DPD kernel. The multi-band DPD kernel that is implemented based at least in part on the DPD kernels included in the first table 902-1 and the second table 902-2 may be referred to as a memoryless DPD kernel (e.g. a memoryless multi-band DPD kernel) based at least in part on the DPD kernels processing a current sample at time index 0 (e.g., $x_0$ as a first sub-band of the wideband signal at time index 0 and $xt_0$ as a second sub-band of the wideband signal at time index 0).

In some aspects, a first portion of the DPD kernel may be implemented based at least in part on one or more LUTs and/or one or more LUT components (e.g., LUT 816-1 to LUT 816-*m* in the multi-dimensional DPD apparatus 800 described with regard to FIG. 8). To illustrate, LUT 904 may include an approximate summation computation of $$\sum_{k=1}^{K-1} a_{00k}|x_0|^k$$

that may approximate a portion (e.g., $|x_0|^k$) of computations performed by a first group of DPD kernels in the DPD kernel set, LUT 906 may include an approximate summation computation of $$\sum_{k=1}^{K-1} b_{00k}|xt_0|^k$$

that may approximate a portion (e.g., $|xt_0|^k$) of computations performed by a second group of DPD kernels in the DPD kernel set, and LUT 908 may include an approximate summation computation of $$\sum_{k=1}^{6} c_{00k}|xt_0|^k$$

that may approximate a portion (e.g., $|xt_0|^k$) of computations performed by of a third group of DPD kernels in the DPD kernel set, where $a_{00k}$, $b_{00k}$, and $c_{00k}$ represent one or more DPD weights (e.g., complex coefficients). Alternatively, or additionally, LUT 910 may include an approximate summation computation of $$\sum_{k=1}^{5} d_{00k}|xt_0|^k$$

that may approximate a portion (e.g., $|xt_0|^k$) of computations performed by a fourth group of DPD kernels in the DPD kernel set, LUT 912 may include an approximate summation computation of $$\sum_{k=1}^{4} e_{00k}|xt_0|^k$$

that may approximate a portion (e.g., $|xt_0|^k$) of computations performed by a fifth group of DPD kernels in the DPD kernel set, LUT 914 may include an approximate summation computation of $$\sum_{k=4}^{6} f_{00k}|x_0|^k$$

that may approximate a portion (e.g., $|x_0|^k$) of computations performed by of a sixth group of DPD kernels in the DPD kernel set, and/or LUT 916 may include an approximate summation computation of $$\sum_{k=4}^{5} g_{00k}|x_0|^k$$

that may approximate a portion (e.g., $|x_0|^k$) of computations performed by of a seventh group of DPD kernels in the DPD kernel set, where $d_{00k}$, $e_{00k}$, $f_{00k}$, and gook represent one or more DPD weights (e.g., complex coefficients). As shown by FIG. 9, LUT 918 may include an approximate summation computation of $$\sum_{k=4}^{4} h_{00k}|x_0|^k$$

that may approximate a portion (e.g., $|x_0|^k$) of computations performed by of an eighth group of DPD kernels in the DPD kernel set, where $h_{00k}$ represents one or more DPD weights (e.g., complex coefficients). Accordingly, in some aspects, the multi-dimensional DPD apparatus 800 may include at least eight (8) LUT components 816 that store the LUTs shown by FIG. 9 to implement a multi-band DPD kernel that is based at least in part on a DPD kernel set.

As indicated above, FIG. 9 is provided as an example. Other examples may differ from what is described with regard to FIG. 9.

FIGS. 10A and 10B are collectively a diagram illustrating an example 1000 of a DPD kernel set that may be used to implement a multi-band DPD kernel, in accordance with the present disclosure. In some aspects, the DPD kernel set may be implemented based at least in part on the multi-dimensional DPD apparatus 800 described with regard to FIG. 8.

The example 1000 includes a first table 1002-1 and a second table 1002-2 that are shown by FIG. 10A and a third table 1002-3 and a fourth table 1002-4 that are shown by FIG. 10B. The first table 1002-1, the second table 1002-2, the third table 1002-3, and the fourth table 1002-4 include a DPD kernel set that may be used to implement a multi-band DPD kernel that applies DPD to a wideband signal (e.g., a sparse wideband signal) based at least in part on processing multiple bands of the wideband signal as described with regard to reference number 625 of FIG. 6. Each computation in the first table 1002-1, the second table 1002-2, the third table 1002-3, and the fourth table 1002-4 may be referred to as a DPD kernel such that the group of computations in entirety make up the multi-band DPD kernel. The multi-band DPD kernel that is implemented based at least in part on the DPD kernels described with regard to FIG. 10A and FIG. 10B may be referred to as a memory-based DPD kernel (e.g. a memory-based multi-band DPD kernel) based at least in part on the DPD kernels that perform computations that use at least one sample that occurs at a different time index than a current time index 0, such as a sample with a timing advance that is relative to the current time index 0 (e.g., $x_{-1}$ as a first sub-band of the wideband signal at a timing delay of 1 and $xt_{-1}$ as a second sub-band of the wideband signal at a timing delay of 1) and/or a sample with a timing advance that is relative to the current time index 0 (e.g., $x_1$ as a first sub-band of the wideband signal at a timing advance of 1 and $xt_1$ as a second sub-band of the wideband signal at a timing advance of 1).

In a similar manner as described with regard to FIG. 9, a first portion of a DPD kernel may be implemented based at least in part on one or more LUTs and/or one or more LUT components (e.g., LUT 816-1 to LUT 816-*m* in the multi-dimensional DPD apparatus 800 described with regard to FIG. 8). To illustrate, LUT 1004 may include an approximate summation computation of $$\sum_{k=1}^{K-1} a_{00k}|x_0|^k$$

that may approximate a portion (e.g., $|x_0|^k$) of computations performed by a first group of DPD kernels in the DPD kernel set, and LUT 1006 may include an approximate summation computation of $$\sum_{k=1}^{K-1} b_{00tk}|xt_0|^k$$

that may approximate a portion (e.g., $|xt_0|^k$) of computations performed by a second group of DPD kernels in the DPD kernel set. As shown by FIG. 10A and FIG. 10B, the example 1000 includes 17 LUTs that may be used for different approximation summation computations, such as LUT 1008 for an approximate summation computation of $$\sum_{k=2}^{2} c_{00tk}|xt_{-1}|^k,$$

LUT 1010 for an approximate summation computation of $$\sum_{k=1}^{1} d_{00tk}|xt_0|^k,$$

LUT 1012 for an approximate summation computation of $$\sum_{k=4}^{5} e_{00tk}|xt_0|^k,$$

LUT 1014 for an approximate summation computation of $$\sum_{k=2}^{2} f_{00tk}|xt_0|^k,$$

LUI 1016 for an approximate summation computation of $$\sum_{k=2}^{2} g_{00tk}|xt_1|^k,$$

LUT 1018 an approximate summation computation of $$\sum_{k=2}^{2} h_{00k}|x_1|^k,$$

LUT 1020 an approximate summation computation of $$\sum_{k=1}^{1} i_{00tk}|xt_0|^k,$$

LUT 1022 for an approximate summation computation of $$\sum_{k=3}^{3} j_{00tk}|xt_1|^k,$$

LUT 1024 for an approximate summation computation of $$\sum_{k=1}^{1} k_{00tk}|xt_0|^k,$$

LUT 1026 for an approximate summation computation of $$\sum_{k=1}^{1} l_{00tk}|xt_1|^k,$$

LUT 1028 for an approximate summation computation of $$\sum_{k=1}^{1} m_{00tk}|xt_1|^k,$$

LUT 1030 for an approximate summation computation of $$\sum_{k=1}^{1} n_{00tk}|xt_{-1}|^k,$$

LUT 1032 for an approximate summation computation of $$\sum_{k=2}^{2} o_{00k}|x_{-1}|^k,$$

LUT 1034 for an approximate summation computation of $$\sum_{k=1}^{1} p_{00tk}|xt_1|^k,$$

and LUT 1036 for an approximate summation computation of $$\sum_{k=1}^{1} q_{00tk}|xt_0|^k.$$

Each approximate summation computation may be used as at least part of a DPD kernel. In a similar manner as described with regard to FIG. 9, $a_{00tk}$, $b_{00tk}$, up to $q_{00tk}$. represent one or more DPD weights (e.g., complex coefficients).

As indicated above, FIGS. 10A and 10B are provided as an example. Other examples may differ from what is described with regard to FIGS. 10A and 10B.

FIG. 11 is a diagram illustrating an example 1100 of a table 1102 that specifies computations and/or values (e.g., associated with a sample x) that may be used to implement a wideband DPD kernel, in accordance with the present disclosure.

In some aspects, a wideband DPD kernel may be based at least in part on a Volterra-based DPD kernel, and the Volterra-based DPD kernel may be based at least in part on a generalized memory polynomial (GMP) series and/or a dynamic deviation reduction (DDR) series that models the behavior of the non-linear distortion associated with a PA and/or the non-linear pre-distortion that mitigates the non-linear distortion of the PA. Collectively, a GMP series and/or a DDR series may be referred to as a generalized DDR (GDDR) series. Based at least in part on one or more mathematical substitutions associated with assumptions about the non-linear system modeled by the series, a first generalized DDR (GDDR1) series may be represented as at least one of:

$$GDDR1\text{ Type }1: y_n = \sum_{m\in M_1}\sum_{l\in L_1}\sum_{k\in K_1} c_{mlk}x_{n-m}|x_{n-l}|^{k-1}\text{ or} \quad (1)$$

$$GDDR1\text{ Type }2: y_n = \sum_{m\in M_2}\sum_{l\in L_2}\sum_{k\in K_2} c_{mlk}x^*_{n-m}x_n^2|x_{n-l}|^{k-3} \quad (2)$$

where $x_n$ represents an $n^{th}$ input sample (e.g., of a signal without pre-distortion applied), $y_n$ represents an $n^{th}$ output sample (e.g., of a signal with pre-distortion applied), $M_1$ and $M_2$ each represent a respective memory depth or length (e.g., a time duration) of the respective series and/or model, $L_1$ and $L_2$ each represents a respective lagging (e.g., a time lag) cross term index of the respective series and/or model, $K_1$ and $K_2$ each represent a respective nonlinearity order associated with the respective series and/or model, and $c_{mlk}$ represents a coefficient value, where k, l, m, and n are integers.

In a similar manner, and based at least in part on one or more mathematical substitutions associated with assumptions about the non-linear system modeled by the series, a second generalized DDR (GDDR2) series may be represented as at least one of:

$$GDDR2\text{ Type }1: y_n = \sum_{m\in M_3}\sum_{l\in L_3}\sum_{k\in K_3} c_{mlk}x^2_{n-m}x^*_n|x_{n-l}|^{k-3}\text{ or} \quad (3)$$

$$GDDR2\text{ Type }2: y_n = \sum_{m\in M_4}\sum_{l\in L_4}\sum_{k\in K_4} c_{mlk}|x_{n-m}|^2x_n|x_{n-l}|^{k-3}\text{ or} \quad (4)$$

$$GDDR2\text{ Type }3: y_n = \sum_{m\in M_5}\sum_{l\in L_5}\sum_{k\in K_5} c_{mlk}x^{*2}_{n-m}x_n^3|x_{n-l}|^{k-5} \quad (5)$$

where $x_n$ represents an $n^{th}$ input sample, $y_n$ represents an $n^{th}$ output sample, $M_3$, $M_4$, and $M_5$ each represent a respective memory depth or length of the respective series and/or model, $L_3$, $L_4$, and $L_5$ each represent a respective lagging (e.g., a time lag) cross term index, $K_3$, $K_4$, and $K_5$, each represent a nonlinearity order of the respective series and/or model, and $c_{mlk}$ represents a coefficient value, where k, l, m, and n are integers.

Based at least in part on one or more mathematical substitutions associated with assumptions about the non-linear system modeled by the series, a third generalized DDR (GDDR3) series may be represented as at least one of:

$$GDDR3\text{ Type }1: y_n = \sum_{m\in M_6}\sum_{l\in L_6}\sum_{k\in K_6} c_{mlk}|x_{n-m}|^2x_{n-m}|x_{n-l}|^{k-3}\text{ or} \quad (6)$$

$$GDDR3\text{ Type }2: y_n = \sum_{m\in M_7}\sum_{l\in L_7}\sum_{k\in K_7} c_{mlk}x^3_{n-m}x^{*2}_n|x_{n-l}|^{k-5}\text{ or} \quad (7)$$

-continued $$GDDR3\ \text{Type 3}: y_n = \sum_{m \in M_8} \sum_{l \in L_8} \sum_{k \in K_8} c_{mlk} |x_{n-m}|^2 x_{n-m}^* x_n^2 |x_{n-l}|^{k-5} \quad (8)$$

where $x_n$ represents an $n^{th}$ input sample, $y_n$ represents an $n^{th}$ output, $M_6$, $M_7$, and $M_8$ each represent a respective memory depth or length of the respective series and/or model, $L_6$, $L_7$, and $L_8$ each represent a respective lagging (e.g., a time lag) cross term index, $K_6$, $K_7$, and $K_8$, each represent a nonlinearity order of the respective series and/or model, and $c_{mlk}$ represents a coefficient value, where k, l, m, and n are integers.

The series and/or models shown by the equations (1)-(8) may be simplified and, collectively, represented as:

$$y_n = q_{n-j} \sum_{m \in M} p_{n-m} \sum_{l \in L} \sum_{k \in K} c_{jmlk} |x_{n-l}|^k \quad (9)$$

where $x_n$ represents an $n^{th}$ input sample, $y_n$ represents an $n^{th}$ output, k represents the power of the envelope, j, l, and m represent a lead or lag (e.g., a timing advance or a timing delay) relative to n, and $\underline{c}$ is a coefficient. In some aspects, j may be equal to "0". Each of equations (1)-(8) may be derived from the equation (9) based at least in part on using, as q and p, respectively, a computation and/or value associated with a sample (e.g., 1, a sample value, a complex conjugate computation, an absolute value computation, a squared computation, a complex conjugate squared computation, an absolute value squared computation, a complex conjugate cubed computation, an absolute value squared multiplied by the sample computation, and/or an absolute value squared multiplied by a complex conjugate) from a set of computations defined as:

$$\{1, x_m, x_m^*, |x_m|, x_m^2, x_m^{*2}, |x_m|^2, x_m^3, x_m^{*3}, |x_m|^2 x_m, |x_m|^2 x_m^*\} \quad (10)$$

In some aspects, an LUT may store an envelope computation value associated with the equation (9), such as an envelope power summation value. For example, the LUT may store an envelope power summation value and/or an approximation of the envelope power summation value that approximates the calculation $\Sigma_{k \in k} c_{jmlk} |x_{n-l}|^k$ of equation (9).

As shown by equation (11) below, an output sample (e.g., $y_n$) generated by a DPD kernel may be represented as a sum of different kernels (e.g., a DPD kernel set):

$$y_n = \sum_{q_j \in Q} q_{n-j} \sum_{p_m \in M_q} p_{n-m} \sum_{l \in L_q} \sum_{k \in K_q} c_{jmlk} |x_{n-l}|^k \quad (11)$$

where $y_n$ represents the output sample at index n, Q represents a set of different types of computations that may be used as q (e.g., and associated delays or advances), M represents a set of different types of computations that may be used as p (e.g., and associated delays or advances), c represents a coefficient, $x_n$ represents an input sample at index n, L represents a set of computations (e.g., associated delays or advances) utilized based at least in part on an implemented q, and K represents a set of computations that may be utilized based at least in part on the implemented q. To illustrate, the different computation(s) and/or value(s) used may be based at least in part on which equation of the equations (1)-(8) is mapped to the equation (11). Based at least in part on using an LUT, equation (11) may be represented as:

$$\sum_{q_j \in Q} q_{n-j} \sum_{p_m \in M_q} p_{n-m} \sum_{l \in L_q} LUT_{jml}(|x_l|) \quad (12)$$

As shown by the example 1100, the table 1102 maps each equation of the equations (1)-(8) to the equation (11) by mapping one or more computations to $q_j$ and $p_m$. The table 1102 includes a first column 1104 that indicates any one of the equations (1)-(8), a second column 1106 that indicates a first computation associated with $q_j$, and a third column 1108 that indicates a second computation associated with $p_m$. The computations specified by the second column 1106 and the third column 1108 may include a constant value and/or a sample value (e.g., computations that may be realized without performing a computation).

As one example, row 1110 of table 1102 may be associated with the equation (1) as described above. In some aspects, the equation (1) may be represented by the equation (12) by using a constant value (e.g., 1) for $q_j$ as indicated by the second column 1106 and a sample multiplied by 1 computation (e.g., $x_m$) for $p_m$ as indicated by the third column 1108. As another example, row 1112 of table 1102 may be associated with the equation (8). The equation (8) may be represented by the equation (11) by squaring $x_0$ (e.g., $x_0^2$) for q; as indicated by the second column 1106 and using an absolute value squared multiplied by a complex conjugate computation (e.g., $|x_m|^2 x_m^*$) for $p_m$ as indicated by the third column 1108.

In some aspects, alternate or additional Volterra-based DPD kernels series different from the GMP and GDDR categories described above may be mapped to the equation (11) as generally shown by reference number 1114. As non-limiting examples, the equation (11) may be mapped to a memory polynomial (MP) series and/or a DDR series. However, other DPD kernels not described herein may also be represented by equation (11) based at least in part on using a first computation (or constant) for $p_m$, a second computation (or constant) for $q_j$, and/or an approximate value stored in an LUT component based at least in part on a series associated with the DPD kernel.

In some aspects, a DPD kernel may be based at least in part on a decomposed vector rotation (DVR) series that models the behavior of non-linear distortion associated with a PA (and/or the non-linear pre-distortion that mitigates the non-linear distortion of the PA) based at least in part on a piece-wise linear function that is based at least in part on an envelope of a signal (e.g., a piece-wise linear envelope function). To illustrate, a first order basis DVR series may be represented as:

$$y_n = \sum_{m \in M} e^{j < x_{n-m}} \sum_{k \in K} c_{mk} \left| |x_{n-m}| - \beta_k \right| \quad (13)$$

where $x_n$ represents an $n^{th}$ input sample, $y_n$ represents an $n^{th}$ output sample, M represents a memory depth or length of the respective series, K represents a resolution of the piece-wise linear function, $\beta_k$ represents a boundary of the piece-wise linear envelope function, and $c_{mk}$ represents a coefficient value, where k and m are integers. By making a substitution of:

$$e^{j\angle x_{n-m}} = \frac{x_{n-m}}{|x_{n-m}|} \tag{14}$$

The first order basis DVR series may be represented as:

$$y_n = \sum_{m\in M} x_{n-m} \sum_{k\in K} c_{mk} \frac{||x_{n-m}| - \beta_k|}{|x_{n-m}|} \tag{15}$$

In some aspects, an LUT may store an envelope computation value associated with the equation (15). For example, the LUT may store an envelope computation value and/or an approximation of the envelope computation value that approximates the calculation $$\sum_{k\in K} c_{mk} \frac{||x_{n-m}| - \beta_k|}{|x_{n-m}|}$$

As another example, a first order basis DVR series may represented as:

$$y_n = \sum_{m\in M} x_{n-m} \sum_{k\in K} c_{mk} \frac{||x_{n-m}| - \beta_k| + |x_{n-m}| - \beta_k}{2|x_{n-m}|} \tag{16}$$

As further described with regard to FIG. 7, an LUT may store an envelope computation value associated with the equation (16). For example, an LUT may store an envelope computation value and/or an approximation of the envelope computation value that approximates the calculation $$\sum_{k\in K} c_{mk} \frac{||x_{n-m}| - \beta_k| + |x_{n-m}| - \beta_k}{2|x_{n-m}|}$$

of the equation (16).

As another example, a second order basis DVR series may be represented as at least one of:

$$y_n = |x_n| \sum_{m\in M} x_{n-m} \sum_{k\in K} c_{mk} \frac{||x_{n-m}| - \beta_k|}{|x_{n-m}|} \text{ or} \tag{17}$$

$$y_n = |x_n| \sum_{m\in M} x_{n-m} \sum_{k\in K} c_{mk} \frac{||x_{n-m}| - \beta_k| + |x_{n-m}| - \beta_k}{|x_{n-m}|} \tag{18}$$

In some aspects, an LUT may store an envelope computation value associated with the equation (17) and/or the equation (18). For example, the LUT may store an envelope power summation value and/or an approximation of the envelope power summation value that approximates the calculation $$\sum_{k\in K} c_{mk} \frac{||x_{n-m}| - \beta_k|}{|x_{n-m}|}$$

of the equation (17) and/or $$\Sigma_{k\in K} c_{mk} \frac{||x_{n-m}| - \beta_k| + |x_{n-m}| - \beta_k}{|x_{n-m}|}$$

of the equation (18).

In some aspects, a DVR series may be represented as:

$$y_n = \sum_{m\in M} x_{n-m} \sum_{l\in L} \sum_{k\in K} c_{mlk} ||x_{n-l}| - \beta_k| \tag{19}$$

As further described with regard to FIG. 8, an LUT may store an envelope computation value associated with the equation (19). For example, the LUT may store an envelope computation value and/or an approximation of the envelope computation value that approximates the calculation $\Sigma_{k\in k} c_{mlk}||x_{n-l}|-\beta_k|$ of the equation (19).

The DVR series described with regard to equations (13), (15), (16), (17), (18), and (19), as well as other DVR series not described above, may be represented as:

$$y_n = \sum_{q_j\in Q} q_{n-j} \sum_{p_m\in M_q} p_{n-m} \sum_{l\in L_q} \sum_{k\in K_q} c_{jmlk} ||x_{n-l}| - \beta_k| \text{ or} \tag{20}$$

$$y_n = \sum_{q_j\in Q} q_{n-j} \sum_{p_m\in M_q} p_{n-m} \sum_{l\in L_q} \sum_{k\in K_q} c_{jmlk} \frac{||x_{n-l}| - \beta_k|}{|x_{n-l}|} \tag{21}$$

where an LUT may store an envelope computation value and/or an approximation of the envelope computation value associated with the computation $\tau_{k\in k} c_{jmlk}||x_{n-l}|-|\beta_k|$ associated with equation (20) or $$\sum_{k\in K} c_{jmlk} \frac{||x_{n-l}| - \beta_k|}{|x_{n-l}|}$$

associated with the equation (21), which may be used to represent a computation performed by a particular DVR series as described above (e.g., a first LUT may store a first set of envelope computational values based at least in part on equation (13), a second LUT may store a second set of envelope computational values based at least in part on the equation (17), and/or a third LUT may store a third set of envelope computational values based at least in part on the equation (19)). Accordingly, a q value for a DVR series may be based at least in part on the computation $x^2$ and a p value for the DVR series may be based at least in part on the computation $x^*_{x-m}$ such that equation (20) may be further represented as:

$$\sum_{q_j\in Q} q_{n-j} \sum_{p_m\in M_q} p_{n-m} \sum_{l\in L_q} LUT_{jml}(|x_l|) \tag{22}$$

The ability to model a non-linear system (e.g., distortion and/or pre-distortion) using a series, such as any combination of a Volterra series, a DVR series, a GMP series, an MP series, and/or a DDR series, may enable a transmitting device to mitigate distortion by applying pre-distortion to an input signal and mitigate recovery errors at a receiving device. To illustrate, and as further described above, a Volterra series, a DVR series, a GMP series, a MP series, and/or a DDR series may be computed based at least in part on equation (21) by using a q and p computation associated with the respective series as described above and an LUT that stores an envelope computation value associated with the respective series. In some aspects, the kernel types described with regard to the table 1102 may be implement by a multi-dimensional DPD apparatus (e.g., the multi-dimensional DPD apparatus 800) as a wideband DPD kernel.

As indicated above, FIG. 11 is provided as an example. Other examples may differ from what is described above.

Figure 12A:
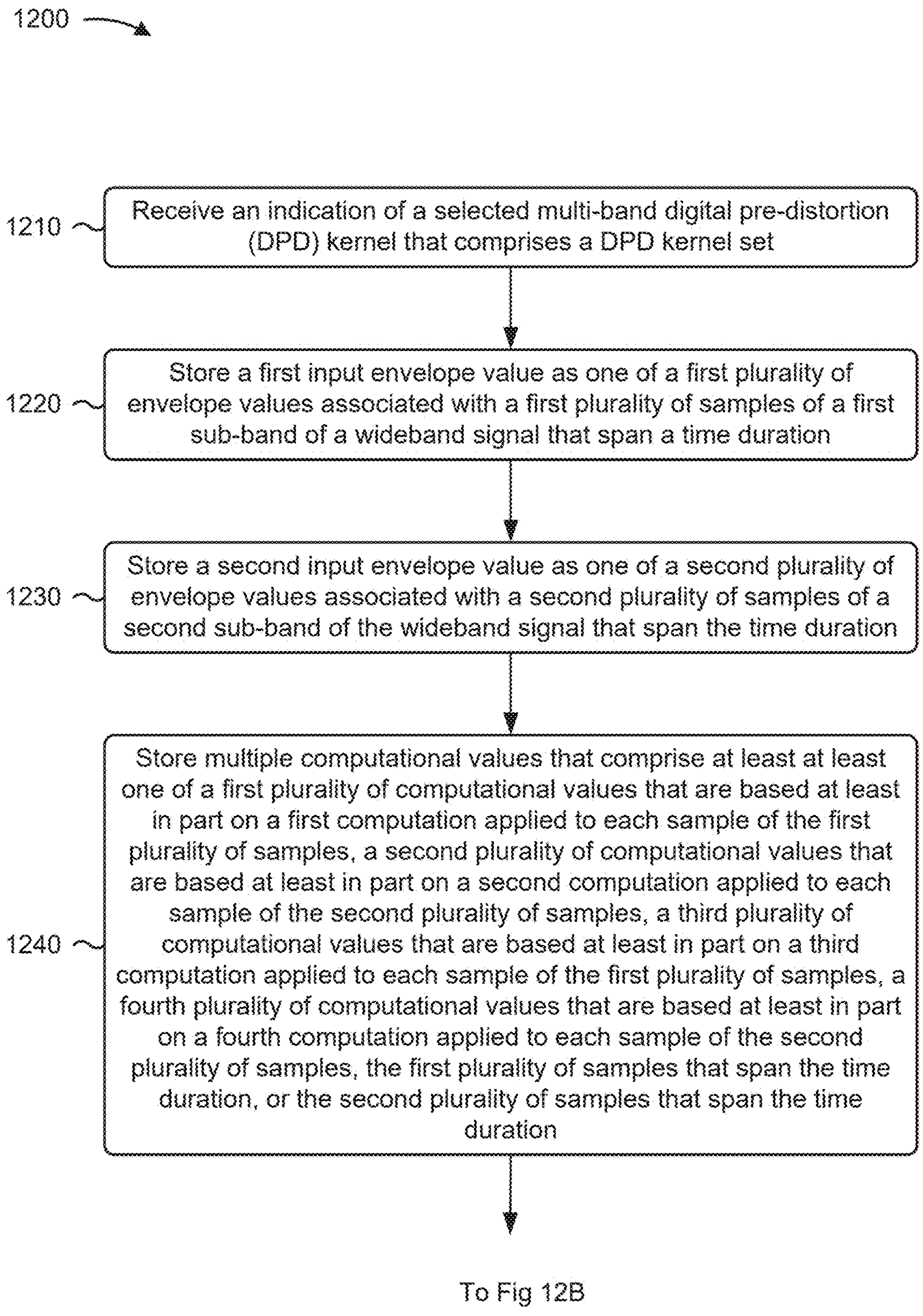
FIGS. 12A and 12 B, collectively, illustrate a diagram of an example process performed, for example, at an apparatus or an apparatus of a transceiver, in accordance with the present disclosure.

FIGS. 12A and 12 B, collectively, illustrate a diagram of an example process 1200 performed, for example, at an apparatus or an apparatus of a transceiver, in accordance with the present disclosure. Example process 1200 is an example where the (e.g., the multi-dimensional DPD apparatus 800) performs operations associated with multi-band DPD.

As shown in FIG. 12A, in some aspects, process 1200 may include receiving an indication of a selected multi-band DPD kernel that comprises a DPD kernel set (block 1210). For example, the apparatus (e.g., using input mechanism 802 depicted in FIG. 8) may receive an indication of a selected multi-band DPD kernel that comprises a DPD kernel set, as described above.

As further shown in FIG. 12A, in some aspects, process 1200 may include storing a first input envelope value as one of a first plurality of envelope values associated with a first plurality of samples of a first sub-band of a wideband signal that span a time duration (block 1220). For example, the apparatus (e.g., using envelope delay line component 812-1 depicted in FIG. 8) may store a first input envelope value as one of a first plurality of envelope values associated with a first plurality of samples of a first sub-band of a wideband signal that span a time duration, as described above.

As further shown in FIG. 12A, in some aspects, process 1200 may include storing a second input envelope value as one of a second plurality of envelope values associated with a second plurality of samples of a second sub-band of the wideband signal that span the time duration (block 1230). For example, the apparatus (e.g., using and/or envelope delay line component 812-2 depicted in FIG. 8) may store a second input envelope value as one of a second plurality of envelope values associated with a second plurality of samples of a second sub-band of the wideband signal that span the time duration, as described above.

As further shown in FIG. 12A, in some aspects, process 1200 may include storing multiple computational values that include at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration (block 1240). For example, the apparatus (e.g., using one or more computation delay line components 820) may store multiple computational values that include at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration, as described above.

Figure 12B:
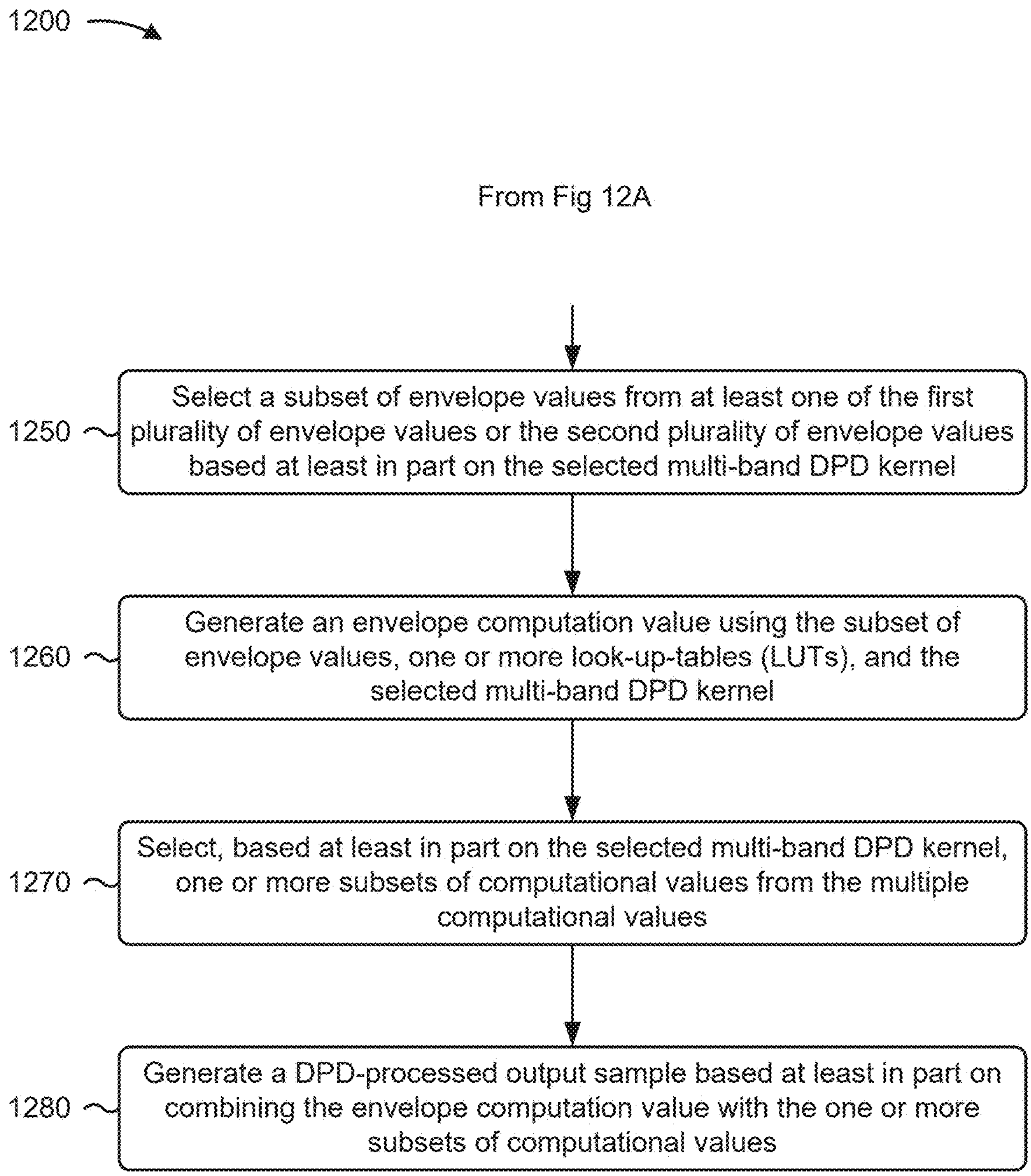

Process 1200 continues to FIG. 12B. As further shown in FIG. 12B, in some aspects, process 1200 may include selecting a subset of envelope values from at least one of the first plurality of envelope values or the second plurality of envelope values based at least in part on the selected multi-band DPD kernel (block 1250). For example, the apparatus (e.g., using envelope selection component 814, depicted in FIG. 8) may select a subset of envelope values from at least one of the first plurality of envelope values or the second plurality of envelope values based at least in part on the selected multi-band DPD kernel, as described above.

As further shown in FIG. 12B, in some aspects, process 1200 may include generating an envelope computation value using the subset of envelope values, one or more LUTs, and the selected multi-band DPD kernel (block 1260). For example, the apparatus (e.g., using input mechanism 802, envelope selection component 814, one or more LUT components 816, one or more computation selection components 822, and/or one or more combiner components 826, depicted in FIG. 8) may generate an envelope computation value using the subset of envelope values, one or more LUTs, and the selected multi-band DPD kernel, as described above.

As further shown in FIG. 12B, in some aspects, process 1200 may include selecting, based at least in part on the selected multi-band DPD kernel, one or more subsets of computational values from the multiple computational values (block 1270). For example, the apparatus (e.g., using one or more computation selection components 822 and/or one or more computation selection components 824, depicted in FIG. 8) may select, based at least in part on the selected multi-band DPD kernel, one or more subsets of computational values from the multiple computational values, as described above.

As further shown in FIG. 12B, in some aspects, process 1200 may include generating a DPD-processed output sample based at least in part on combining the envelope computation value with the one or more subsets of computational values (block 1280). For example, the apparatus (e.g., using one or more combiner components 826, one or more combiner components 828, value selection component 830, and/or adder component 832, depicted in FIG. 8) may generate a DPD-processed output sample based at least in part on combining the envelope computation value with the one or more subsets of computational values, as described above.

Process 1200 may include additional aspects, such as any single aspect or any combination of aspects described below and/or in connection with one or more other processes described elsewhere herein.

In a first aspect, process 1200 includes generating, using the wideband signal, a first set of sub-band samples that represent the first sub-band of the wideband signal, generating, using the wideband signal, a second set of sub-band samples that represent the second sub-band of the wideband signal, generating the first plurality of samples based at least in part on applying decimation to the first set of sub-band samples, and generating the second plurality of samples based at least in part on applying decimation to the second set of sub-band samples.

In a second aspect, generating the first set of sub-band samples and generating the second set of sub-band samples includes generating the first set of sub-band samples and generating the second set of sub-band samples based at least in part on using one or more split rotator components to process the wideband signal.

In a third aspect, generating the first plurality of samples and generating the second plurality of samples includes generating the first plurality of samples and generating the second plurality of samples based at least in part on using one or more decimator components to process the first set of sub-band samples and the second set of sub-band samples.

In a fourth aspect, the selected multi-band DPD kernel is implemented based at least in part on one or more of an envelope delay line component that stores the first input envelope value in a first envelope storage segmentation and the second input envelope value in a second envelope storage segmentation, an envelope selection component that selects the subset of envelope values based at least in part on the selected multi-band DPD kernel, one or more LUT components that store the one or more LUTs, a computation delay line component that stores the multiple computational values, one or more computation selection components that select the one or more subsets of computational values based at least in part on the selected multi-band DPD kernel, one or more combiner components that generate a respective output by combining the envelope computation value with the one or more subsets of computational values, or an adder component that generates the DPD-processed output sample based at least in part on combining the respective output from at least a subset of the one or more combiner components.

In a fifth aspect, the selected multi-band DPD kernel applies the DPD to the wideband signal based at least in part on processing the first sub-band of the wideband signal as the first plurality of samples and the second sub-band of the wideband signal as the second plurality of samples.

In a sixth aspect, the DPD kernel set includes a multi-band DPD kernel that is based at least in part on one or more one or more memoryless DPD kernels, or one or more memory-based DPD kernels.

In a seventh aspect, process 1200 includes receiving the DPD-processed output sample as one of a plurality of DPD-processed output samples, the plurality of DPD-processed output samples being based at least in part on a first sampling frequency, and generating, using the plurality of DPD-processed output samples, a first set of interpolated DPD-processed output samples and a second set of interpolated DPD-processed output samples that are based at least in part on a second sampling frequency that is higher than the first sampling frequency.

In an eighth aspect, generating the first set of DPD-processed output samples and the second set of interpolated DPD-processed output samples includes generating the first set of interpolated DPD-processed output samples and the second set of interpolated DPD-processed output samples using one or more interpolator components.

In a ninth aspect, process 1200 includes receiving the first set of interpolated DPD-processed output samples and the second set of interpolated DPD-processed output samples, and combining the first set of interpolated DPD-processed output samples with the second set of interpolated DPD-processed output samples to generate a plurality of composite samples, and the plurality of composite samples includes a DPD-processed wideband signal.

In a tenth aspect, combining the first set of DPD-processed output samples and the second set of interpolated DPD-processed output samples includes combining the first set of interpolated DPD-processed output samples and the second set of interpolated DPD-processed output samples using one or more combiner rotator components that are coupled to combining logic.

In an eleventh aspect, process 1200 includes calculating the multiple computational values, the multiple computational including: the first plurality of computational values, the second plurality of computational values, the third plurality of computational values, the fourth plurality of computational values, and additional computational values, and storing at least one of the first plurality of computational values, the second plurality of computational values, the third plurality of computational values, or the fourth plurality of computational values based at least in part on the selected multi-band DPD kernel.

In a twelfth aspect, calculating the multiple computational values includes calculating the multiple computational values using computation logic, and selecting to store the first plurality of computational values, the second plurality of computational values, the third plurality of computational values, and the fourth plurality of computational values includes selecting the first plurality of computational values, the second plurality of computational values, the third plurality of computational values, and the fourth plurality of computational values using a computational multiplexer component.

In a thirteenth aspect, the one or more LUTs include at least a first LUT that stores one or more first approximate envelope power summation values that are based at least in part on a first approximation of a first envelope summation function for the first sub-band of the wideband signal, and a second LUT that stores one or more second approximate envelope power summation values that are based at least in part on a second approximation of a second envelope summation function of the second sub-band of the wideband signal.

Although FIGS. 12A and 12B show example blocks of process 1200, in some aspects, process 1200 may include additional blocks, fewer blocks, different blocks, or differently arranged blocks than those depicted in FIGS. 12A and 12B. Additionally, or alternatively, two or more of the blocks of process 1200 may be performed in parallel.

The following provides an overview of some Aspects of the present disclosure:

Aspect 1: A method performed by an apparatus, the method comprising: receiving an indication of a selected multi-band digital pre-distortion (DPD) kernel that comprises a DPD kernel set; storing a first input envelope value as one of a first plurality of envelope values associated with a first plurality of samples of a first sub-band of a wideband signal that span a time duration; storing a second input envelope value as one of a second plurality of envelope values associated with a second plurality of samples of a second sub-band of the wideband signal that span the time duration; storing multiple computational values that comprise at least at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration; selecting a subset of envelope values from at least one of the first plurality of envelope values or the second plurality of envelope values based at least in part on the selected multi-band DPD kernel; generating an envelope computation value using the subset of envelope values, one or more look-up-tables (LUTs), and the selected multi-band DPD kernel; selecting, based at least in part on the selected multi-band DPD kernel, one or more subsets of computational values from the multiple computational values; and generating a DPD-processed output sample based at least in part on combining the envelope computation value with the one or more subsets of computational values.

Aspect 2: The method of Aspect 1, further comprising: generating, using the wideband signal, a first set of sub-band samples that represent the first sub-band of the wideband signal; generating, using the wideband signal, a second set of sub-band samples that represent the second sub-band of the wideband signal; generating the first plurality of samples based at least in part on applying decimation to the first set of sub-band samples; and generating the second plurality of samples based at least in part on applying decimation to the second set of sub-band samples.

Aspect 3: The method of Aspect 2, wherein generating the first set of sub-band samples and generating the second set of sub-band samples comprises: generating the first set of sub-band samples and generating the second set of sub-band samples based at least in part on using one or more split rotator components to process the wideband signal.

Aspect 4: The method of Aspect 2, wherein generating the first plurality of samples and generating the second plurality of samples comprises: generating the first plurality of samples and generating the second plurality of samples based at least in part on using one or more decimator components to process the first set of sub-band samples and the second set of sub-band samples.

Aspect 5: The method of any of Aspects 1-4, wherein the selected multi-band DPD kernel is implemented based at least in part on one or more of: an envelope delay line component that stores the first input envelope value in a first envelope storage segmentation and the second input envelope value in a second envelope storage segmentation, an envelope selection component that selects the subset of envelope values based at least in part on the selected multi-band DPD kernel, one or more LUT components that store the one or more LUTs, a computation delay line component that stores the multiple computational values, one or more computation selection components that select the one or more subsets of computational values based at least in part on the selected multi-band DPD kernel, one or more combiner components that generate a respective output by combining the envelope computation value with the one or more subsets of computational values, or an adder component that generates the DPD-processed output sample based at least in part on combining the respective output from at least a subset of the one or more combiner components.

Aspect 6: The method of any of Aspects 1-5, wherein the selected multi-band DPD kernel applies the DPD to the wideband signal based at least in part on processing the first sub-band of the wideband signal as the first plurality of samples and the second sub-band of the wideband signal as the second plurality of samples.

Aspect 7: The method of Aspect 6, wherein the DPD kernel set comprises a multi-band DPD kernel that is based at least in part on one or more: one or more memoryless DPD kernels, or one or more memory-based DPD kernels.

Aspect 8: The method of any of Aspects 1-7, further comprising: receiving the DPD-processed output sample as one of a plurality of DPD-processed output samples, the plurality of DPD-processed output samples being based at least in part on a first sampling frequency; and generating, using the plurality of DPD-processed output samples, a first set of interpolated DPD-processed output samples and a second set of interpolated DPD-processed output samples that are based at least in part on a second sampling frequency that is higher than the first sampling frequency.

Aspect 9: The method of Aspect 8, wherein generating the first set of DPD-processed output samples and the second set of interpolated DPD-processed output samples comprises: generating the first set of interpolated DPD-processed output samples and the second set of interpolated DPD-processed output samples using one or more interpolator components.

Aspect 10: The method of Aspect 8, further comprising: receiving the first set of interpolated DPD-processed output samples and the second set of interpolated DPD-processed output samples; and combining the first set of interpolated DPD-processed output samples with the second set of interpolated DPD-processed output samples to generate a plurality of composite samples, wherein the plurality of composite samples comprises a DPD-processed wideband signal.

Aspect 11: The method of Aspect 10, wherein combining the first set of DPD-processed output samples and the second set of interpolated DPD-processed output samples comprises: combining the first set of interpolated DPD-processed output samples and the second set of interpolated DPD-processed output samples using one or more combiner rotator components that are coupled to combining logic.

Aspect 12: The method of any of Aspects 1-11, further comprising: calculating the multiple computational values, wherein the multiple computational include the first plurality of computational values, the second plurality of computational values, the third plurality of computational values, the fourth plurality of computational values, and additional computational values; and storing at least one of the first plurality of computational values, the second plurality of computational values, the third plurality of computational values, or the fourth plurality of computational values based at least in part on the selected multi-band DPD kernel.

Aspect 13: The method of Aspect 12, wherein calculating the multiple computational values comprises: calculating the multiple computational values using computation logic, and wherein selecting to store the first plurality of computational values, the second plurality of computational values, the third plurality of computational values, and the fourth plurality of computational values comprises: selecting the first plurality of computational values, the second plurality of computational values, the third plurality of computational values, and the fourth plurality of computational values using a computational multiplexer component.

Aspect 14: The method of any of Aspects 1-13, wherein the one or more LUTs include at least: a first LUT that stores one or more first approximate envelope power summation values that are based at least in part on a first approximation of a first envelope summation function for the first sub-band of the wideband signal, and a second LUT that stores one or more second approximate envelope power summation values that are based at least in part on a second approximation of a second envelope summation function of the second sub-band of the wideband signal.

Aspect 15: An apparatus for wireless communication at a device, the apparatus comprising one or more processors; one or more memories coupled with the one or more processors; and instructions stored in the one or more memories and executable by the one or more processors to cause the apparatus to perform the method of one or more of Aspects 1-14.

Aspect 16: An apparatus for wireless communication at a device, the apparatus comprising one or more memories and one or more processors coupled to the one or more memories, the one or more processors configured to cause the device to perform the method of one or more of Aspects 1-14.

Aspect 17: An apparatus for wireless communication, the apparatus comprising at least one means for performing the method of one or more of Aspects 1-14.

Aspect 18: A non-transitory computer-readable medium storing code for wireless communication, the code comprising instructions executable by one or more processors to perform the method of one or more of Aspects 1-14.

Aspect 19: A non-transitory computer-readable medium storing a set of instructions for wireless communication, the set of instructions comprising one or more instructions that, when executed by one or more processors of a device, cause the device to perform the method of one or more of Aspects 1-14.

Aspect 20: A device for wireless communication, the device comprising a processing system that includes one or more processors and one or more memories coupled with the one or more processors, the processing system configured to cause the device to perform the method of one or more of Aspects 1-14.

Aspect 21: An apparatus for wireless communication at a device, the apparatus comprising one or more memories and one or more processors coupled to the one or more memories, the one or more processors individually or collectively configured to cause the device to perform the method of one or more of Aspects 1-14.

Aspect 22: An apparatus comprising: a first input mechanism configured to receive an indication of a selected multi-band digital pre-distortion (DPD) kernel that comprises a DPD kernel set; an envelope delay line component comprising: a first envelope storage segmentation configured to store a first input envelope value as one of a first plurality of envelope values associated with a first plurality of samples that span a time duration; a second envelope storage segmentation configured to store a second input envelope value as one of a second plurality of envelope values associated with a second plurality of samples that span the time duration; an envelope selection component configured to select a subset of envelope values from at least one of the first plurality of envelope values or the second plurality of envelope values based at least in part on the selected multi-band DPD kernel; one or more look-up-table (LUT) components coupled to the envelope selection component configured to: receive the subset of envelope values, and output an envelope computation value that is based at least in part on the subset of envelope values and the selected multi-band DPD kernel; a computation delay line component comprising one or more computation storage components configured to store, as multiple computational values, at least one of: a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration; one or more computation selection components coupled to the computation delay line component and configured to select, based at least in part on the selected multi-band DPD kernel, one or more subsets of computational values from the multiple computational values stored by the computation storage component; one or more combiner components coupled to the one or more computation selection components and the one or more LUT components, the one or more combiner components configured to generate a respective output that is based at least in part on combining the envelope computation value with the one or more subsets of computational values; and an adder component coupled the one or more combiner components and configured to generate a DPD-processed output sample based at least in part on combining the respective output from at least a subset of the one or more combiner components.

Aspect 23: The apparatus of Aspect 22, wherein the DPD kernel set is implemented based at least in part on one or more of: the envelope delay line component, the envelope selection component, the one or more LUT components, the computation delay line component, the one or more computation selection components, the one or more combiner components, or the adder component.

Aspect 24: The apparatus of Aspect 22 or Aspect 23, wherein the DPD kernel set comprises a multi-band DPD kernel that applies DPD to a wideband signal based at least in part on processing: the first plurality of samples as a first sub-band of the wideband signal, and the second plurality of samples as a second sub-band of the wideband signal.

Aspect 25: The apparatus of any one of Aspects 22-24, further comprising: one or more split rotator components configured to: receive, as the wideband signal, a set of digital samples; and generate, using the wideband signal, at least: a first set of sub-band samples that represent the first sub-band of the wideband signal, and a second set of sub-band samples that represent the second sub-band of the wideband signal.

Aspect 26: The apparatus of Aspects 25, further comprising: one or more decimator components that are coupled to the one or more split rotator components and configured to: generate the first plurality of samples based at least in part on applying decimation to the first set of sub-band samples; and generate the second plurality of samples based at least in part on applying decimation to the second set of sub-band samples.

Aspect 27: The apparatus any one of Aspects 22-26, wherein the selected multi-band DPD kernel is based at least in part on one or more: one or more memoryless DPD kernels, or one or more memory-based DPD kernels.

Aspect 28: The apparatus of any one of Aspects 22-27, further comprising one or more interpolator components configured to: receive the DPD-processed output sample as one of a plurality of DPD-processed output sample generated by the one or signal combiner logic, the plurality of DPD-processed output samples being based at least in part on a first sampling frequency; and generate, using the plurality of DPD-processed output samples, a first set of interpolated DPD-processed output samples and a second set of interpolated DPD-processed output samples that are based at least in part on a second sampling frequency that is higher than the first sampling frequency.

Aspect 29: The apparatus of Aspect 28, further comprising: one or more combiner rotator components that are coupled to the one or more interpolator components; and signal combiner logic coupled to the one or more combiner rotator components, wherein the one or more combiner rotator components and the signal combining logic are configured to: receive the first set of interpolated DPD-processed output samples and the second set of interpolated DPD-processed output samples; and combine the first set of interpolated DPD-processed output samples with the second set of interpolated DPD-processed output samples to generate a plurality of composite samples.

Aspect 30: The apparatus of any one of Aspects 22-29, further comprising: computation logic configured to generate the multiple computational values, the multiple computational values comprising: the first plurality of computational values, the second plurality of computational values, the third plurality of computational values, and the fourth plurality of computational values; a computational multiplexer component comprising: a plurality of value input mechanisms that are coupled to the multiple computational values; a selection input mechanism configured to select one or more output computational values from the multiple computational values; and one or more output mechanisms that are coupled to the computation delay line component and configured to generate the one or more output computational values.

Aspect 31: The apparatus of any one of Aspects 22-30, wherein the one or more LUT components include at least: a first LUT component that stores one or more first approximate envelope power summation values that are based at least in part on a first approximation of a first envelope summation function for a first sub-band signal, the first sub-band signal comprising a first sub-band of a wideband signal, and a second LUT component that stores one or more second approximate envelope power summation values that are based at least in part on a second approximation of a second envelope summation function of a second sub-band signal, the second sub-band signal comprising a second sub-band of the wideband signal.

Aspect 32: An apparatus comprising: a pre-digital predistortion (DPD) signal conditioning circuit that generates a pre-DPD conditioned output signal; a post-DPD signal conditioning circuit; a splitter component that is configured to split the pre-DPD conditioned output signal received from the pre-DPD signal conditioning circuit into at least two splitter output signals, each splitter output signal of the at least two splitter output signals being a respective distinct sub-band of the pre-DPD conditioned output signal, the respective distinct sub-band being separated from other sub-bands in the pre-DPD conditioned output signal by a frequency gap; a DPD component configured to: operate in a first mode that causes the DPD component to: receive the at least two splitter output signals as at least a first input signal and a second input signal; and apply DPD to at least the first input signal and the second input signal to generate at least a first DPD-processed output signal and a second DPD-processed output signal; operate in a second mode that causes the DPD component to: receive the pre-DPD conditioned output signal as a third input signal in a manner that bypasses the split rotator component; and apply DPD to the third input signal to generate a third DPD-processed output signal; and switch between the first mode and the second mode; a combiner component configured to: receive at least the first DPD-processed output signal and the second DPD-processed output signal; and output a combined DPD-processed output signal to the post-DPD conditioning circuit; and a routing mechanism configured to: receive the third DPD-processed output signal; route the third DPD-processed output signal to the post-DPD conditioning circuit in a manner that bypasses the combiner component.

Aspect 33: The apparatus of Aspect 32, wherein to apply the DPD to at least the first input signal and the second input signal, the DPD component is configured to: apply the DPD using a multi-band DPD kernel that is based at least in part on a DPD kernel set.

Aspect 34: The apparatus of Aspect 32 or Aspect 33, wherein the split rotator component is configured to split, as the pre-DPD conditioned output signal, a wideband signal that includes at least two component carriers, the frequency gap between the at least two component carriers being at least 100 megahertz (MHz), and wherein each respective distinct sub-band is a respective component carrier of the at least two component carriers.

Aspect 35: The apparatus of any one of Aspects 32-34, wherein the first input signal has a first bandwidth, wherein the second input signal has a second bandwidth, wherein the third input signal has a third bandwidth, and wherein the third bandwidth is greater than both the first bandwidth and the second bandwidth.

Aspect 36: The apparatus of any one of Aspects 32-36, wherein the third input signal comprises a single component carrier.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware or a combination of hardware and at least one of software or firmware. "Software" shall be construed broadly to mean instructions, instruction sets, code, code segments, program code, programs, subprograms, software modules, applications, software applications, software packages, routines, subroutines, objects, executables, threads of execution, procedures, or functions, among other examples, whether referred to as software, firmware, middleware, microcode, hardware description language, or otherwise. As used herein, a "processor" is implemented in hardware or a combination of hardware and software. It will be apparent that systems or methods described herein may be implemented in different forms of hardware or a combination of hardware and software. The actual specialized control hardware or software code used to implement these systems or methods is not limiting of the aspects. Thus, the operation and behavior of the systems or methods are described herein without reference to specific software code, because those skilled in the art will understand that software and hardware can be designed to implement the systems or methods based, at least in part, on the description herein. A component being configured to perform a function means that the component has a capability to perform the function, and does not require the function to be actually performed by the component, unless noted otherwise.

As used herein, "satisfying a threshold" may, depending on the context, refer to a value being greater than the threshold, greater than or equal to the threshold, less than the threshold, less than or equal to the threshold, equal to the threshold, or not equal to the threshold, among other examples.

As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (for example, a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," and similar terms are intended to be open-ended terms that do not limit an element that they modify (for example, an element "having" A may also have B). Further, the phrase "based on" is intended to mean "based on or otherwise in association with" unless explicitly stated otherwise. Also, as used herein, the term "or" is intended to be inclusive when used in a series and may be used interchangeably with "and/or," unless explicitly stated otherwise (for example, if used in combination with "either" or "only one of"). It should be understood that "one or more" is equivalent to "at least one."

Even though particular combinations of features are recited in the claims or disclosed in the specification, these combinations are not intended to limit the disclosure of various aspects. Many of these features may be combined in ways not specifically recited in the claims or disclosed in the specification. The disclosure of various aspects includes each dependent claim in combination with every other claim in the claim set.

What is claimed is:

1. An apparatus comprising:

a first input mechanism configured to receive an indication of a selected multi-band digital pre-distortion (DPD) kernel that comprises a DPD kernel set;

an envelope delay line component comprising:

a first envelope storage segmentation configured to store a first input envelope value as one of a first plurality of envelope values associated with a first plurality of samples that span a time duration;

a second envelope storage segmentation configured to store a second input envelope value as one of a second plurality of envelope values associated with a second plurality of samples that span the time duration;

an envelope selection component configured to select a subset of envelope values from at least one of the first plurality of envelope values or the second plurality of envelope values based at least in part on the selected multi-band DPD kernel;

one or more look-up-table (LUT) components coupled to the envelope selection component configured to:

receive the subset of envelope values, and output an envelope computation value that is based at least in part on the subset of envelope values and the selected multi-band DPD kernel;

a computation delay line component comprising one or more computation storage components configured to store, as multiple computational values, at least one of:

a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration;

one or more computation selection components coupled to the computation delay line component and configured to select, based at least in part on the selected multi-band DPD kernel, one or more subsets of computational values from the multiple computational values stored by the computation storage component;

one or more combiner components coupled to the one or more computation selection components and the one or more LUT components, the one or more combiner components configured to generate a respective output that is based at least in part on combining the envelope computation value with the one or more subsets of computational values; and an adder component coupled the one or more combiner components and configured to generate a DPD-processed output sample based at least in part on combining the respective output from at least a subset of the one or more combiner components.

2. The apparatus of claim 1, wherein the DPD kernel set is implemented based at least in part on one or more of:

the envelope delay line component, the envelope selection component, the one or more LUT components, the computation delay line component, the one or more computation selection components, the one or more combiner components, or the adder component.

3. The apparatus of claim 1, wherein the DPD kernel set comprises a multi-band DPD kernel that applies DPD to a wideband signal based at least in part on processing:

the first plurality of samples as a first sub-band of the wideband signal, and the second plurality of samples as a second sub-band of the wideband signal.

4. The apparatus of claim 3, further comprising:

one or more split rotator components configured to:

receive, as the wideband signal, a set of digital samples; and generate, using the wideband signal, at least:

a first set of sub-band samples that represent the first sub-band of the wideband signal, and a second set of sub-band samples that represent the second sub-band of the wideband signal.

5. The apparatus of claim 4, further comprising:

one or more decimator components that are coupled to the one or more split rotator components and configured to:

generate the first plurality of samples based at least in part on applying decimation to the first set of sub-band samples; and generate the second plurality of samples based at least in part on applying decimation to the second set of sub-band samples.

6. The apparatus of claim 1, further comprising one or more interpolator components configured to:

receive the DPD-processed output sample as one of a plurality of DPD-processed output samples generated by the adder component, the plurality of DPD-processed output samples being based at least in part on a first sampling frequency; and generate, using the plurality of DPD-processed output samples, a first set of interpolated DPD-processed output samples and a second set of interpolated DPD-processed output samples that are based at least in part on a second sampling frequency that is higher than the first sampling frequency.

7. The apparatus of claim 6, further comprising:

one or more combiner rotator components that are coupled to the one or more interpolator components; and signal combiner logic coupled to the one or more combiner rotator components, wherein the one or more combiner rotator components and the signal combiner logic are configured to:

receive the first set of interpolated DPD-processed output samples and the second set of interpolated output samples; and combine the first set of interpolated DPD-processed output samples with the second set of interpolated DPD-processed output samples to generate a plurality of composite samples.

8. The apparatus of claim 1, further comprising:

computation logic configured to generate the multiple computational values, the multiple computational values comprising:

the first plurality of computational values, the second plurality of computational values, the third plurality of computational values, and the fourth plurality of computational values;

a computational multiplexer component comprising:

a plurality of value input mechanisms that are coupled to the multiple computational values;

a selection input mechanism configured to select one or more output computational values from the multiple computational values; and one or more output mechanisms that are coupled to the computation delay line component and configured to generate the one or more output computational values.

9. The apparatus of claim 1, wherein the one or more LUT components include at least:

a first LUT component that stores one or more first approximate envelope power summation values that are based at least in part on a first approximation of a first envelope summation function for a first sub-band signal, the first sub-band signal comprising a first sub-band of a wideband signal, and a second LUT component that stores one or more second approximate envelope power summation values that are based at least in part on a second approximation of a second envelope summation function of a second sub-band signal, the second sub-band signal comprising a second sub-band of the wideband signal.

10. A method performed by an apparatus, the method comprising:

receiving an indication of a selected multi-band digital pre-distortion (DPD) kernel that comprises a DPD kernel set;

storing a first input envelope value as one of a first plurality of envelope values associated with a first plurality of samples of a first sub-band of a wideband signal that span a time duration;

storing a second input envelope value as one of a second plurality of envelope values associated with a second plurality of samples of a second sub-band of the wideband signal that span the time duration;

storing multiple computational values that comprise at least at least one of:

a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration;

selecting a subset of envelope values from at least one of the first plurality of envelope values or the second plurality of envelope values based at least in part on the selected multi-band DPD kernel;

generating an envelope computation value using the subset of envelope values, one or more look-up-tables (LUTs), and the selected multi-band DPD kernel;

selecting, based at least in part on the selected multi-band DPD kernel, one or more subsets of computational values from the multiple computational values; and generating a DPD-processed output sample based at least in part on combining the envelope computation value with the one or more subsets of computational values.

11. The method of claim 10, further comprising:

generating, using the wideband signal, a first set of sub-band samples that represent the first sub-band of the wideband signal;

generating, using the wideband signal, a second set of sub-band samples that represent the second sub-band of the wideband signal;

generating the first plurality of samples based at least in part on applying decimation to the first set of sub-band samples; and generating the second plurality of samples based at least in part on applying decimation to the second set of sub-band samples.

12. The method of claim 11, wherein generating the first set of sub-band samples and generating the second set of sub-band samples comprises:

generating the first set of sub-band samples and generating the second set of sub-band samples based at least in part on using one or more split rotator components to process the wideband signal.

13. The method of claim 12, wherein generating the first plurality of samples and generating the second plurality of samples comprises:

generating the first plurality of samples and generating the second plurality of samples based at least in part on using one or more decimator components to process the first set of sub-band samples and the second set of sub-band samples.

14. The method of claim 10, wherein the selected multi-band DPD kernel is implemented based at least in part on one or more of:

an envelope delay line component that stores the first input envelope value in a first envelope storage segmentation and the second input envelope value in a second envelope storage segmentation, an envelope selection component that selects the subset of envelope values based at least in part on the selected multi-band DPD kernel, one or more LUT components that store the one or more LUTs, a computation delay line component that stores the multiple computational values, one or more computation selection components that select the one or more subsets of computational values based at least in part on the selected multi-band DPD kernel, one or more combiner components that generate a respective output by combining the envelope computation value with the one or more subsets of computational values, or an adder component that generates the DPD-processed output sample based at least in part on combining the respective output from at least a subset of the one or more combiner components.

15. The method of claim 10, wherein the selected multi-band DPD kernel applies the DPD to the wideband signal based at least in part on processing the first sub-band of the wideband signal as the first plurality of samples and the second sub-band of the wideband signal as the second plurality of samples.

16. The method of claim 10, further comprising:

receiving the DPD-processed output sample as one of a plurality of DPD-processed output samples, the plurality of DPD-processed output samples being based at least in part on a first sampling frequency; and generating, using the plurality of DPD-processed output samples, a first set of interpolated DPD-processed output samples and a second set of interpolated DPD-processed output samples that are based at least in part on a second sampling frequency that is higher than the first sampling frequency.

17. The method of claim 10, further comprising:

calculating the multiple computational values, wherein the multiple computational values include the first plurality of computational values, the second plurality of computational values, the third plurality of computational values, the fourth plurality of computational values, and additional computational values; and storing at least one of the first plurality of computational values, the second plurality of computational values, the third plurality of computational values, or the fourth plurality of computational values based at least in part on the selected multi-band DPD kernel.

18. The method of claim 10, wherein the one or more LUTs include at least:

a first LUT that stores one or more first approximate envelope power summation values that are based at least in part on a first approximation of a first envelope summation function for the first sub-band of the wideband signal, and a second LUT that stores one or more second approximate envelope power summation values that are based at least in part on a second approximation of a second envelope summation function of the second sub-band of the wideband signal.

19. A non-transitory computer-readable medium that stores a set of instructions for wireless communication that, when executed by one or more processors of an apparatus, cause the apparatus to:

receive an indication of a selected multi-band digital pre-distortion (DPD) kernel that comprises a DPD kernel set;

store a first input envelope value as one of a first plurality of envelope values associated with a first plurality of samples of a first sub-band of a wideband signal that span a time duration;

store a second input envelope value as one of a second plurality of envelope values associated with a second plurality of samples of a second sub-band of the wideband signal that span the time duration;

store multiple computational values that comprise at least one of:

a first plurality of computational values that are based at least in part on a first computation applied to each sample of the first plurality of samples, a second plurality of computational values that are based at least in part on a second computation applied to each sample of the second plurality of samples, a third plurality of computational values that are based at least in part on a third computation applied to each sample of the first plurality of samples, a fourth plurality of computational values that are based at least in part on a fourth computation applied to each sample of the second plurality of samples, the first plurality of samples that span the time duration, or the second plurality of samples that span the time duration;

select a subset of envelope values from at least one of the first plurality of envelope values or the second plurality of envelope values based at least in part on the selected multi-band DPD kernel;

generate an envelope computation value using the subset of envelope values, one or more look-up-tables (LUTs), and the selected multi-band DPD kernel;

select, based at least in part on the selected multi-band DPD kernel, one or more subsets of computational values from the multiple computational values; and generate a DPD-processed output sample based at least in part on combining the envelope computation value with the one or more subsets of computational values.

20. The non-transitory computer-readable medium of claim 19, where the set of instructions further cause the apparatus to:

generate, using the wideband signal, a first set of sub-band samples that represent the first sub-band of the wideband signal;

generate, using the wideband signal, a second set of sub-band samples that represent the second sub-band of the wideband signal;

generate the first plurality of samples based at least in part on applying decimation to the first set of sub-band samples; and generate the second plurality of samples based at least in part on applying decimation to the second set of sub-band samples.

* * * * *